(12) United States Patent
Fukumura et al.

(10) Patent No.: US 8,466,507 B2
(45) Date of Patent: Jun. 18, 2013

(54) SEMICONDUCTOR DEVICE AND A METHOD OF MANUFACTURING THE SAME

(75) Inventors: Tatsuya Fukumura, Kawanishi (JP); Yoshihiro Ikeda, Takaraduka (JP); Shunichi Narumi, Itami (JP); Izumi Takesue, Sagamihara (JP)

(73) Assignee: Renesas Electronics Corporation, Kanagawa (JP)

( * ) Notice: Subject to any disclaimer, the term of this patent is extended or adjusted under 35 U.S.C. 154(b) by 141 days.

(21) Appl. No.: 13/195,068

(22) Filed: Aug. 1, 2011

(65) Prior Publication Data

US 2011/0284945 A1    Nov. 24, 2011

Related U.S. Application Data

(60) Continuation of application No. 12/633,815, filed on Dec. 9, 2009, now Pat. No. 8,212,305, which is a continuation of application No. 11/936,339, filed on Nov. 7, 2007, now Pat. No. 7,662,686, which is a division of application No. 11/240,375, filed on Oct. 3, 2005, now Pat. No. 7,312,123, which is a continuation of application No. 10/902,141, filed on Jul. 30, 2004, now Pat. No. 7,064,380.

(30) Foreign Application Priority Data

Sep. 5, 2003    (JP) ................... 2003-314648

(51) Int. Cl.
*H01L 29/788* (2006.01)
(52) U.S. Cl.
USPC .............. 257/315; 257/316; 257/E21.179

(58) Field of Classification Search
USPC ................... 257/315, 316, E21.179
See application file for complete search history.

(56) References Cited

U.S. PATENT DOCUMENTS

| 5,946,230 | A  | 8/1999  | Shimizu et al. |
| 6,489,650 | B2 | 12/2002 | Kumazaki       |

(Continued)

FOREIGN PATENT DOCUMENTS

| JP | 2000-188346 | 7/2000 |
| JP | 2001-085541 | 3/2001 |

(Continued)

OTHER PUBLICATIONS

English language translation of Korean Office Action in KR 10-2004-0058575, dated Dec. 27, 2010 (7 pages).

*Primary Examiner* — Phat X Cao
(74) *Attorney, Agent, or Firm* — Antonelli, Terry, Stout & Kraus, LLP.

(57) ABSTRACT

A semiconductor device having a nonvolatile memory is reduced in size. In an AND type flash memory having a plurality of nonvolatile memory cells having a plurality of first electrodes, a plurality of word lines crossing therewith, and a plurality of floating gate electrodes disposed at positions which respectively lie between the plurality of adjacent first electrodes and overlap the plurality of word lines, as seen in plan view, the plurality of floating gate electrodes are formed in a convex shape, as seen in cross section, so as to be higher than the first electrodes. As a result, even when nonvolatile memory cells are reduced in size, it is possible to process the floating gate electrodes with ease. In addition, it is possible to improve the coupling ratio between floating gate electrodes and control gate electrodes of the word lines without increasing the area occupied by the nonvolatile memory cells.

6 Claims, 54 Drawing Sheets

U.S. PATENT DOCUMENTS

| | | |
|---|---|---|
| 6,531,735 B1 | 3/2003 | Kamigaki et al. |
| 6,710,395 B2 | 3/2004 | Kobayashi et al. |
| 6,767,790 B2 | 7/2004 | Kobayashi |
| 7,049,653 B2 | 5/2006 | Matsui et al. |
| 7,151,295 B2 | 12/2006 | Yaegashi et al. |
| 7,196,370 B2 | 3/2007 | Kai et al. |
| 2002/0036317 A1 * | 3/2002 | Matsui et al. ............ 257/315 |
| 2004/0061165 A1 | 4/2004 | Ding |

FOREIGN PATENT DOCUMENTS

| | | |
|---|---|---|
| JP | 2001-156275 | 6/2001 |
| JP | 2002-176114 | 6/2002 |
| JP | 2003-86717 | 3/2003 |
| JP | 2003-168748 | 6/2003 |
| JP | 2003-188290 | 7/2003 |
| JP | 2003-289114 | 10/2003 |
| JP | 2004-022819 | 1/2004 |
| JP | 2005-79165 | 3/2005 |
| JP | 2005-332885 | 12/2005 |
| KR | 2003-23469 | 3/2003 |

* cited by examiner

PERIPHERAL CIRCUIT REGION

PERIPHERAL CIRCUIT REGION

PERIPHERAL CIRCUIT REGION

PERIPHERAL CIRCUIT REGION

PERIPHERAL CIRCUIT REGION

PERIPHERAL CIRCUIT REGION

PERIPHERAL CIRCUIT REGION

PERIPHERAL CIRCUIT REGION

PERIPHERAL CIRCUIT REGION

PERIPHERAL CIRCUIT REGION

PERIPHERAL CIRCUIT REGION

PERIPHERAL CIRCUIT REGION

SEMICONDUCTOR DEVICE AND A METHOD OF MANUFACTURING THE SAME

CROSS-REFERENCE TO RELATED APPLICATION

This application is a continuation of U.S. application Ser. No. 12/633,815, filed Dec. 9, 2009 now U.S. Pat. No. 8,212,305, which, in turn, is a continuation of U.S. application Ser. No. 11/936,339, filed Nov. 7, 2007 (now U.S. Pat. No. 7,662,686), which, in turn, is a Divisional Application Ser. No. 11/240,375, filed Oct. 3, 2005 (now U.S. Pat. No. 7,312,123), which, in turn is a continuation application of Ser. No. 10/902,141, filed Jul. 30, 2004 (now U.S. Pat. No. 7,064,380), and which application claims priority from Japanese Patent application JP 2003-314648, filed on Sep. 5, 2003, the contents of which are hereby incorporated by reference into this application.

BACKGROUND OF THE INVENTION

The present invention relates to a semiconductor device and to a technique for the manufacture thereof. More particularly, it relates to a technique that is applicable to a semiconductor device having a nonvolatile memory, such as an EEPROM (Electrically Erasable Programmable Read Only Memory) or a flash memory, or a method of manufacturing the same.

A nonvolatile memory cell that was studied by the present inventors has, other than a floating gate electrode and a control gate electrode, a third gate electrode, which is referred to as an assist gate electrode. Over the principal surface of a semiconductor substrate, a plurality of assist gate electrodes, each in the form of a band, as seen in plan configuration, are arranged in such a manner as to abut one another. In an insulating film covering the plurality of assist gate electrodes, trenches are formed between each of the adjacent assist gate electrodes, and a floating gate electrode, which is convex as seen in cross section, is provided on the side and bottom of each trench. Over the floating gate electrode, a control gate electrode is provided via an interlayer film.

Incidentally, for example, Japanese Unexamined Patent Publication No. 2000-188346, discloses an NAND type flash memory cell configured such that, between adjacent STI regions for isolation formed over the principal surface of a semiconductor substrate, a floating gate electrode, which is convex as seen in cross section, is provided, and a control gate electrode is provided via an interlayer film in such a manner as to cover the surface. (Patent Document 1).

[Patent Document 1] Japanese Unexamined Patent Publication No. 2000-188346

SUMMARY OF THE INVENTION

However, for a semiconductor device having a nonvolatile memory, the trend toward miniaturization has increasingly advanced. Under such circumstances, how the device is reduced in size without causing various deficiencies is an important consideration.

It is an object of the present invention to provide a technology that is capable of reducing the size of a semiconductor device having a nonvolatile memory.

The foregoing and other object, and novel features of the present invention will be apparent from the following description in this specification and the appended drawings.

Out of the various aspects and features of the invention disclosed in this application, an outline of typical ones will be briefly described as follows.

In accordance with one aspect of the present invention, a semiconductor device comprises: a semiconductor substrate; and a plurality of nonvolatile memory cells having a plurality of first electrodes, a plurality of second electrodes provided so as to cross therewith, and a plurality of third electrodes for electric charge accumulation provided at points of intersection of the portions between the plurality of the adjacent first electrodes and the plurality of the second electrodes in a state insulated from the first and second electrodes, over the semiconductor substrate, wherein the third electrodes are each formed in a convex shape as seen in cross section in such a manner as to be larger in height than the first electrodes.

Further, in accordance with another aspect of the present invention, a semiconductor device comprises: a semiconductor substrate; and a plurality of nonvolatile memory cells having a plurality of first electrodes, a plurality of second electrodes provided so as to cross therewith, and a plurality of third electrodes for electric charge accumulation provided at points of intersection of the portions between the plurality of adjacent first electrodes and the plurality of second electrodes in a state insulated from the first and second electrodes, over the semiconductor substrate, wherein the plurality of the first electrodes have a function of forming an inversion layer in the semiconductor substrate.

The effects obtainable by typical features of the invention disclosed in this application will be briefly described as follows.

It is possible to promote the trend for increased miniaturization of a nonvolatile memory.

Further, it is possible to reduce the size of a semiconductor device.

BRIEF DESCRIPTION OF THE DRAWINGS

FIG. 19 is a cross sectional view showing one example of the portion corresponding to line Y1-Y1 of FIG. 14 of the semiconductor substrate in a step of manufacturing the semiconductor device subsequent to the manufacturing steps of FIG. 10 and the like;

FIG. 27 is a plan view of the semiconductor device in a manufacturing step subsequent to the manufacturing step of FIG. 23 and the like;

FIG. 39 is a cross sectional view of the portion corresponding to line Y1-Y1 of FIG. 28 in a step of manufacturing the semiconductor device subsequent to the manufacturing step of FIG. 37 and the like;

FIG. 53 is a cross sectional view of the portion corresponding to line Y1-Y1 of FIG. 49 in a step of manufacturing the semiconductor device subsequent to the manufacturing step of FIG. 49 and the like;

DESCRIPTION OF THE PREFERRED EMBODIMENTS

In the following description, individual embodiments may be divided into a plurality of sections or embodiments for the sake of convenience, if necessary. Except when otherwise specified, they are not mutually irrelevant, but one may be in the relation of a varied example, a detail, a supplemental statement, or the like of a part or the whole of the other. Further, in the following description, when reference is made to numbers of elements and the like (including the number, numerical value, amount, range, and the like), except when otherwise specified, and except when such numbers are apparently limited to specific numbers in principle, they are not limited to the specific numbers, and may be either equal to or larger than, or equal to or smaller than the specific numbers. Still further, in the following description, it is understood that, the constituent elements (including elemental steps and the like) are not necessarily essential, except when otherwise specified, and except when they are presumed to be apparently essential in principle. Likewise, in the following embodiments, when reference is made to the shape and positional relationship of constituent elements, and the like, they are to be construed as including ones that are substantially analogous or similar to the specified shape, and the like, except when otherwise specified, and except when they are presumed to be apparently not so in principle. This is also true for the foregoing numerical values and ranges. Furthermore, in the case of the drawings, even a plan view may be hatched in order to make features of the plan view easily visible. Further, throughout the drawings, the same elements are identified with the same numerals and signs, and a repetitive description thereof will be omitted. Further, in the following description, a MIS•FET (Metal Insulator Semiconductor•Field Effect Transistor), which is a field effect transistor, is abbreviated as an MIS, an n-channel type MIS is abbreviated as an nMIS, and a p-channel type MIS is abbreviated as a pMIS. Below, the embodiments of the present invention will be described in detail by reference to the accompanying drawings.

Embodiment 1

In Embodiment 1, a description will be given of one example of the case where the present invention is applied to, for example, a 4-Gbit AND type flash memory unit.

Figure 1:
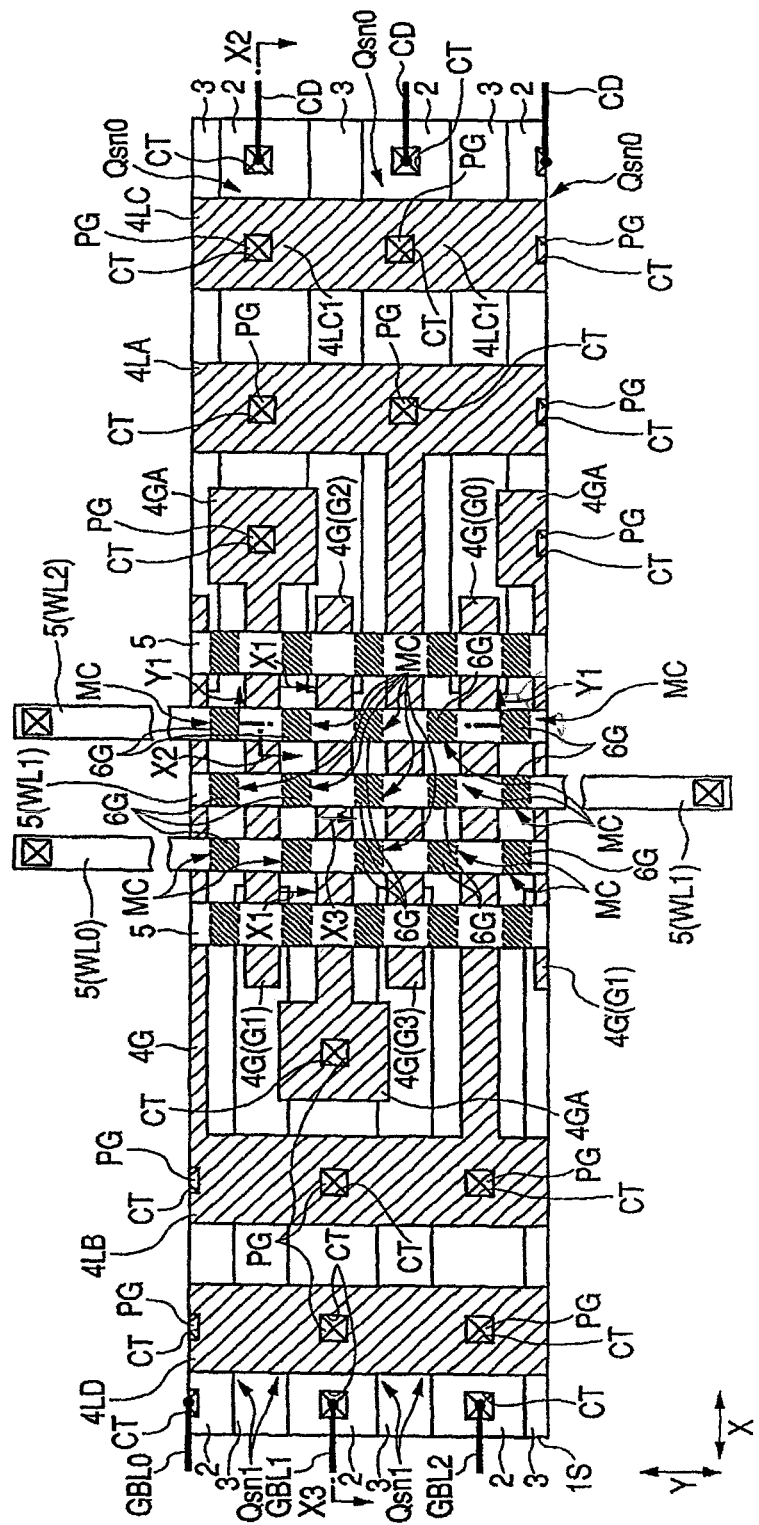
FIG. 1 is a plan view of a characteristic part of a semiconductor device representing one embodiment of the present invention.
Figure 2:
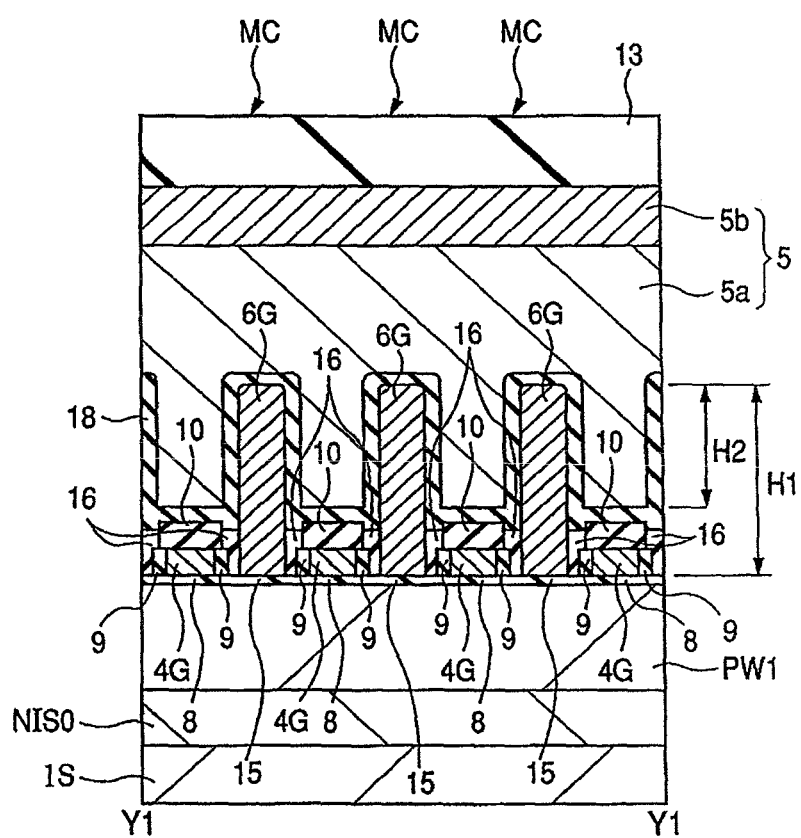
FIG. 2 is a cross sectional view taken along line Y1-Y1 of FIG. 1.
Figure 3:
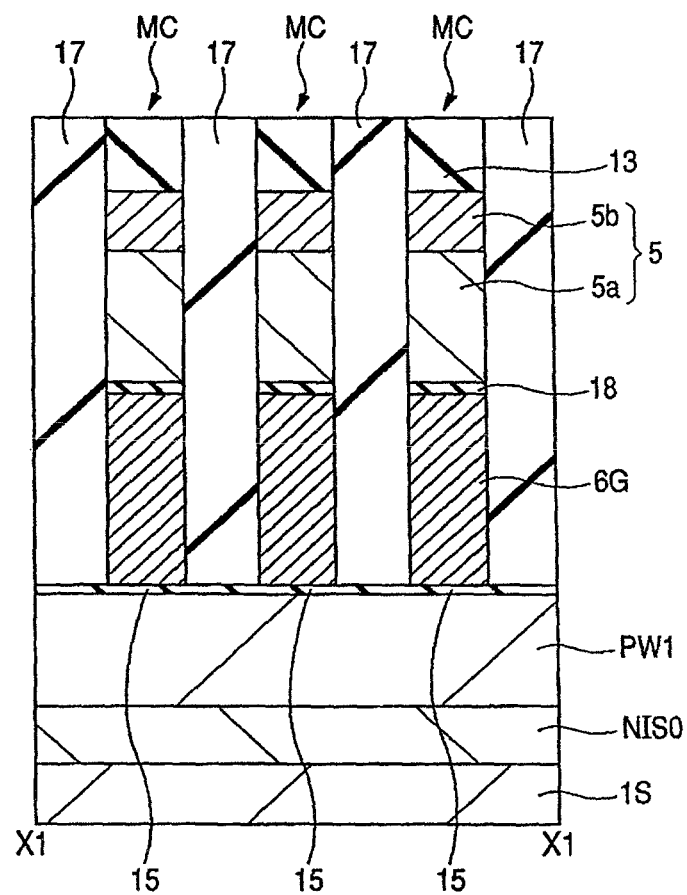
FIG. 3 is a cross sectional view taken along line X1-X1 of FIG. 1.
Figure 4:
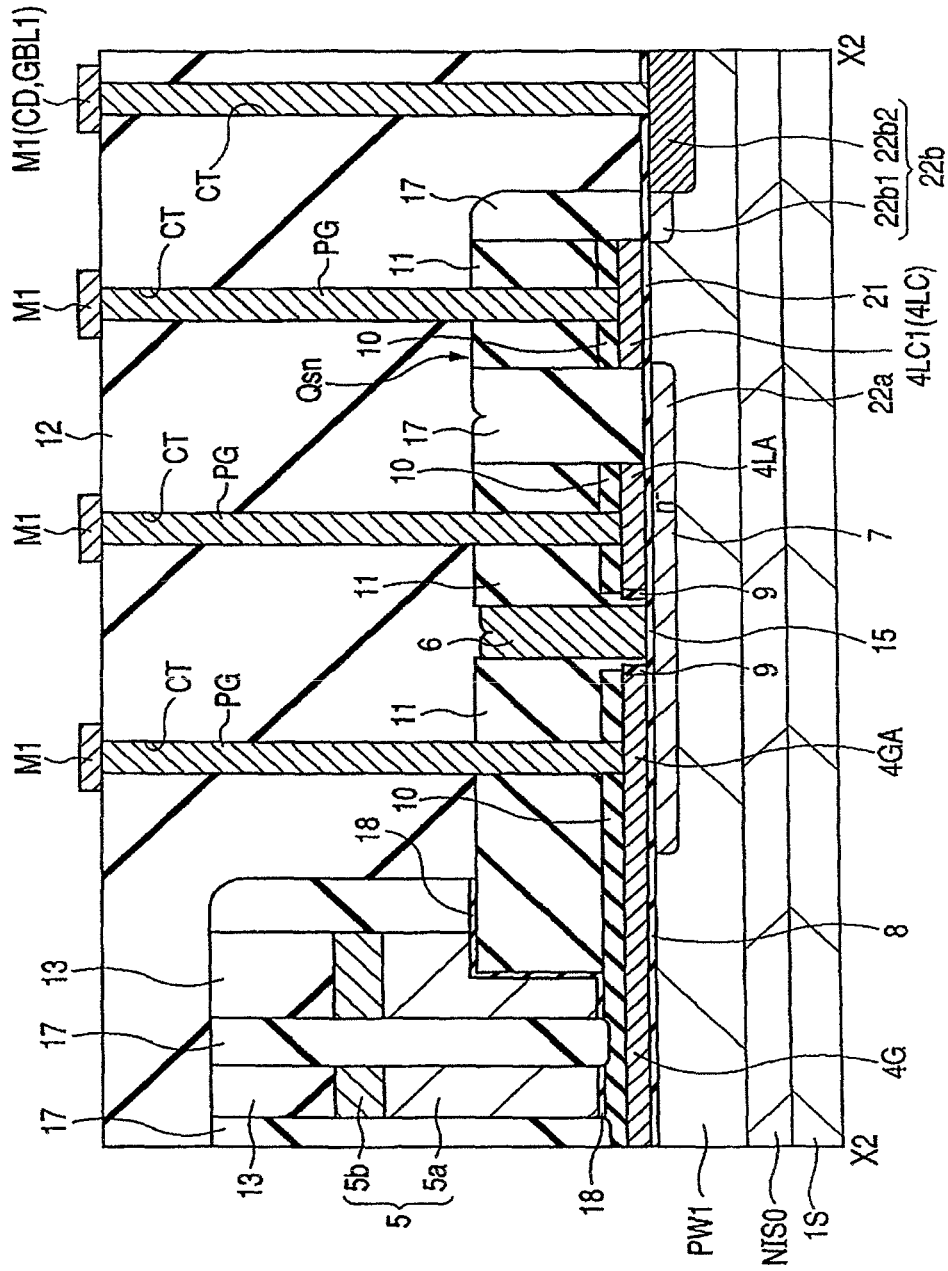
FIG. 4 is a cross sectional view taken along line X2-X2 of FIG. 1.

FIG. 1 is a plan view of the flash memory of this embodiment 1; FIG. 2 is a cross sectional view taken along line Y1-Y1 of FIG. 1; FIG. 3 is a cross sectional view taken along line X1-X1 of FIG. 1; and FIG. 4 is a cross sectional view taken along X2-X2 of FIG. 1. Incidentally, a sign X in FIG. 1 denotes a first direction, and a sign Y in the same figure denotes a second direction that is orthogonal to the first direction X.

A semiconductor substrate (hereinafter simply referred to as a substrate) 1S of a semiconductor chip, in which the flash memory of this embodiment 1 is formed, is made of, for example, a p type silicon (Si) single crystal. Over the principal surface (device-formed surface) thereof, there are arranged an active region 2, an isolation region 3, a plurality of first electrodes 4G, a plurality of word lines (second electrodes) 5, a plurality of floating gate electrodes (third electrodes) 6G, a plurality of nonvolatile memory cells (hereinafter simply referred to as memory cells) MC, and a plurality of selecting nMIS Qsn0 and selecting nMIS Qsn1. Referring to the cross section of the substrate 1S, a p type well PW1 and an n type buried region NISO are formed in the memory region and the selecting transistor region of the substrate 1S. The p type well PW1 is formed by introducing, for example, boron (B) therein, and the outer periphery (side and bottom) thereof is surrounded by the n type buried region NISO. In the n type buried region NISO, for example, phosphorus (P) has been introduced.

The active region 2 is a region where a device is formed. As will be described later, in the active region 2 in the memory region, a semiconductive region for a bit line is not formed, so that the memory region has been scaled down. The outline in plan configuration of the active region 2 is defined by the isolation region 3. The isolation region 3 is formed as a trench type isolation region referred to as, for example, a STI (Shallow Trench Isolation) or a SGI (Shallow Groove Isolation). Namely, the isolation region 3 is formed by burying an insulating film such as a film of silicon oxide ($SiO_2$, or the like) in a trench dug in the substrate 1S.

The plurality of first electrodes 4G are each formed in the shape of a rectangle extending along the first direction X as seen in plan configuration. The respective first electrodes 4G are arranged roughly in parallel to one another along the second direction Y at a desired distance away from one another. The dimension (width) along the second direction Y of the narrow portion of the first electrode 4G is, for example, about 65 nm. Whereas, the spacing between the adjacent first electrodes 4G is, for example, about 115 nm. The first electrode 4G is disposed mostly in overlapping relation with the active region 2 as seen in plan view. When a desired voltage is applied to the first electrode 4G, an n type inversion layer is formed in the principal surface portion of the substrate 1S in the active region 2 along the first electrode 4G. The n type inversion layer is a portion for forming a bit line (source and drain of a memory cell MC).

The mechanism whereby the source and the drain of the memory cell MC are electrically connected to a global bit line and a common drain line, respectively, will be described below by reference to FIG. 4, which is a cross sectional view taken along line X2-X2 line and line X3-X3 of FIG. 1. Herein, FIG. 4 shows a cross section taken along line X2-X2. The configurations of the cross sections taken along line X2-X2 and X3-X3 are symmetrically equal, except that an electrical connection is established to the global bit line or the common drain line. Therefore, a detailed description of the structure on line X3-X3 is omitted.

When a desired voltage is applied to a desired first electrode 4G, a bit line for a drain (an n type inversion layer) is formed in the active region 2 under the first electrode 4G shown in FIG. 1. As shown in FIG. 4, an electrical connection is established to a desired selecting nMIS Qsn0 via an n$^-$ type semiconductive region 7 formed in the principal surface of the substrate 1S, which further establishes an electrical connection to the common drain line via the selecting nMIS Qsn0. The n$^-$ type semiconductive region 7 is formed by introducing, for example, arsenic (As) between the first electrode 4G and a selecting nMIS Qsn0 on its extension line along the first direction X. Whereas, as described above, the same also holds for the connection between the source of the memory cell MC and the global bit line. Namely, each first electrode 4G is provided in order to form the source region and the drain region of the memory cell MC.

Thus, in this embodiment 1, in the region where each memory cell MC is formed, an inversion layer for a bit line is formed by the first electrode 4G in the principal surface portion of the substrate 1S in the active region 2. Therefore, a semiconductive region for forming a bit line is not formed in the active region 2. When the semiconductive region for forming a bit line is formed in the active region 2, the ensuring of various dimensions becomes necessary, such as the ensuring of dimensions allowing for the impurity diffusion in a semiconductive region for forming a bit line, the ensuring of dimensions for implanting impurity ions, and the ensuring of dimensions allowing for misalignment. This forces the size of the memory cell MC to be increased. In contrast, in this embodiment 1, a semiconductive region for a bit line is not formed in the region for forming each memory cell MC therein. For this reason, it is possible to largely reduce the size of the memory cell MC, which enables a large reduction of the dimensions of the whole memory region. Further, the first electrode 4G has not only the function of forming a bit line, but also the function of providing isolation between the adjacent memory cells MC. This eliminates the necessity of providing a trench type isolation region 3 in the memory region, which enables a reduction of the pitch of the bit lines to be formed. Further, problems of the stress imposed from the trench-type isolation region 3 due to miniaturization and the like do not arise. Still further, in forming the configuration in which the sources and the drains (bit lines) of the adjacent memory cells MC are shared, it is not necessary to form a diffusion layer by implantation of an impurity. Accordingly, a configuration is adopted in which the source and drain regions (bit lines) are formed by utilizing an inversion layer. For this reason, the problems of thermal diffusion of impurities due to miniaturization and the like do not arise. This enables a reduction of the area occupied by the memory region.

In the unit region of the memory region, for example, four first electrodes 4G (G0 to G3) are disposed. Namely, the four first electrodes 4G (G0 to G3) are taken as one set. FIG. 1 shows the following situation. At the right-hand side edge of one first electrode 4G (G1) in the unit region, a broad region 4GA for connection with an upper layer wire is formed; at the left-hand side edge of the underlying adjacent first electrode 4G (G2), a broad region 4GA for connection with the upper layer wire is formed; the right-hand side edge of the underlying adjacent first electrode 4G (G3) is connected to a wire 4LA; and the left-hand side edge of the underlying adjacent first electrode 4G (G0) is connected to a wire 4LB. The wires 4LA and 4LB are each formed in a band-shaped pattern extending along the second direction Y of FIG. 1. To each of them, the first electrode 4G (G3 or G0), which is one of every four, is integrally connected. Namely, the wires 4LA and 4LB are each configured as a common wire for a plurality of the first electrodes 4G to which the same electric potential is supplied. Such first electrodes 4G (G0 to G3), and 4GA, and wires 4LA and 4LB are formed by, for example, patterning a low resistive polysilicon film during the same step. Herein, from the viewpoint of ease in formation and the like, a plurality of the first electrodes 4G to which the same electric potential is supplied, the broad regions 4GA, and the wires 4LA and 4LB are integrally formed to be in the same layer, and they are electrically connected to one another. The thickness of each of the first electrodes 4G and the wires 4LA and 4LB is, for example, about 50 nm. Thus, by reducing the thickness of each first electrode 4G, it is possible to reduce the coupling ratio between the first electrode 4G and the floating gate electrode 6G. This can reduce the height of the floating gate electrode 6G. An insulating film 8 between the first electrodes 4G and the wires 4LA and 4LB and the principal surface of the substrate 1S is formed of, for example, silicon oxide, and it has a thickness of, for example, about 8.5 nm in terms of the silicon dioxide equivalent film thickness. Over all sides of the first electrodes and one side of each of the wires 4LA and 4LB, an insulating film 9 is formed of, for example, silicon oxide. Whereas, over the top surfaces of the first electrodes 4G and the wires 4LA and 4LB, a cap film 10 is formed of, for example, silicon nitride ($Si_3N_4$, or the like). Further, over the cap film 10 of the first electrodes 4G in the outer periphery of the memory region, the broad regions 4GA, and the wires 4LA and 4LB, an insulating film 11 formed of, for example, silicon oxide is deposited. Further, as its overlying layer, an insulating film 12 formed of, for example, silicon oxide is deposited. Each first electrode 4G is electrically connected to its corresponding upper first layer wire M1 via a plug PG in a contact hole CT. The contact holes CT are opened in the cap film 10 and the insulating films 11 and 12, and they are disposed in a part of the broad regions 4GA and the wires 4LA and 4LB.

The number of the plurality of the word lines 5 (WL) formed per block of memory cells (memory mat) is 256. In this embodiment, for easy understanding of the description, WL0 to WL2 are shown. The respective word lines 5 (WL0 to WL2) are each formed in a rectangle extending along the second direction Y in plan configuration. Namely, the respective word lines 5 (WL0 to WL2) are disposed in a state orthogonal to the first electrodes 4G (G0 to G3) and in roughly parallel alignment with one another at a desired distance away from one another along the first direction X of FIG. 1. Each portion of the word lines 5 situated between the adjacent first electrodes 4G serves as a control gate electrode of the memory cell MC. The dimension along the first direction X of the word line 5 on design is equal to the spacing between the adjacent word lines 5 on design, and it is, for example, about 90 nm. Thus, by making the dimension along the first direction X of the word line 5 on design equal to the spacing between the adjacent word lines 5 on design, it is possible to facilitate the calculation of the coupling ratio between the control gate electrode 5a and the floating gate electrode 6G. Accordingly, it becomes possible to set the coupling ratio at a better value. Namely, it is possible to maximize the coupling ratio between the control gate electrode 5a and the floating gate electrode 6G. Each word line 5 is formed of, for example, a multilayered film consisting of a conductor film 5a made of a low resistive polysilicon and a refractory metal silicide film 5b, such as a film of tungsten silicide ($WSi_x$) formed on the top surface thereof. Over the top surfaces of the word lines 5, an insulating film 13 formed of, for example, silicon oxide is deposited. Incidentally, both of the outermost word lines 5 along the first direction X are each configured in a pattern not contributing to the memory operation, and they are formed to be broader than the other word lines 5 in consideration of thinning upon exposure. Whereas, as shown in the cross sectional view of FIG. 2, the conductor film 5a, which is the lower layer of the word line 5, is formed in such a manner as to be buried between the respective floating gate electrodes 6G via the insulating film 18 in the direction Y of the respective memory cells MC.

The plurality of floating gate electrodes 6G are disposed at the points of intersection of the portions between the adjacent first electrodes 4G (G0 to G3) and the word lines 5 (WL0 to WL2) in an electrically insulated state. The floating gate electrode 6G is an electric charge accumulation layer for data of the memory cells MC, and it is formed of, for example, a low resistive polysilicon. Each floating gate electrode 6G has the form of a rectangle as seen in plan view. The dimension along the first direction X of the floating gate electrode 6G is roughly equal to the dimension along the first direction X of the word line 5. It is set at, for example, about 90 nm. The dimension along the second direction Y of the floating gate electrode 6G is slightly shorter than the spacing between the adjacent first electrodes 4G, and it is set at, for example, about 65 nm.

Whereas, the floating gate electrodes 6G are, as seen in a cross section, provided over the principal surface of the substrate 1S via an insulating film 15. The insulating film 15 functions as a tunnel insulating film of the memory cells MC, and it is formed of, for example, silicon oxynitride (SiON), or the like. The silicon oxynitride film has a configuration in which nitrogen (N) has been segregated at the interface between silicon oxide and the substrate 1S. The insulating film 15 may be formed of, for example, silicon oxide. However, by forming the insulating film 15 with silicon oxynitride, it is possible to improve the reliability of the insulating film 15. Namely, by linking nitrogen to an unstable bond, trap level, or the like, formed in the principal surface of the substrate 1S due to damage or the like imposed on the substrate 1S before the formation of the insulating film 15, it is possible to improve the reliability of the insulating film 15. The thickness of the insulating film 15 is set at, for example, about 9 nm in terms of the silicon dioxide equivalent film thickness.

Between the floating gate electrodes 6G and the first electrodes 4G, the insulating films 9 and 16 are formed, which insulates the first electrodes 4G from the floating gate electrodes 6G. Whereas, between the adjacent floating electrodes 6G and the adjacent word lines 5 along the first direction X, an insulating film 17 is formed. This insulates between the adjacent floating electrodes 6G and the adjacent word lines 5 along the first direction X. The insulating films 16 and 17 are made of, for example, silicon oxide. Further, between the floating gate electrodes 6G and the control gate electrodes of the word lines 5, an insulating film 18 is formed. The insulating film 18 is a film for forming capacitors between the floating gate electrodes 6G and the control gate electrodes. It is formed of, for example, a so-called ONO film prepared by laminating silicon oxide, silicon nitride, and silicon oxide, sequentially from the bottom layer. The thickness of the insulating film 18 is set at, for example, about 16 nm in terms of the silicon dioxide equivalent film thickness.

As shown in FIG. 2 or 3, in this embodiment 1, the floating gate electrodes 6G are each formed in a convex shape (herein, in the shape of a rectangle) as seen in cross section along the direction crossing with the principal surface of the substrate 1S. They are each formed in a shape protruding from the surface of the semiconductor substrate 1S. Namely, the floating gate electrodes 6G are formed each in the shape of a pole (herein, in the shape of a square pole) in the regions interposed between the first electrodes 4G over the semiconductor substrate 1S via the insulating film 15. The floating gate electrodes 6G are each formed in such a manner that it's the height thereof (the height from the principal surface of the substrate 1S) becomes larger than the height (the height from the principal surface of the substrate 1S) of each first electrode 4G. When each floating gate electrode is formed in a concave shape, the floating gate electrode must be reduced in thickness with the reduction in size of a memory cell. As in this and other cases, it becomes difficult to process the floating gate electrode. In contrast, in this embodiment 1, each floating gate electrode 6G is formed in a convex shape in cross section. As a result, even when the memory cell MC is reduced in size, it is possible to process the floating gate electrode 6G with ease. For this reason, it is possible to promote the reduction in size of the memory cells MC. Whereas, the capacitors between the floating gate electrodes 6G and the control gate electrodes are formed over the convex sidewalls and the convex top surfaces of the floating gate electrodes 6G. Namely, the capacitance is formed between the word lines 5 (5a) and the floating gate electrodes 6G in the direction (Y-Y direction) in which the word lines 5 extend via an insulating film 18. The capacitance is calculated as the sum of the values of the capacitances formed over the top surfaces and the sidewalls of the convex floating gate electrodes 6G. Therefore, even when the minimum processing dimensions are further reduced, the floating gate electrode 6G can be increased in height to increase the area of opposing portions of the floating gate electrode 6G and the control gate electrode, resulting in an increase in capacitance of the capacitor without increasing the area occupied by the memory cell MC. Therefore, it is possible to improve the coupling ratio between the floating gate electrode 6G and the control gate electrode. For this reason, it is possible to improve the controllability of voltage control of the floating gate electrode 6G by the control gate electrode. This enables an improvement in the writing and erasing speed of a flash memory even at a low voltage, which allows the flash memory to be capable of low-voltage operation. Namely, it is possible to implement both the miniaturization and the reduction in voltage of the flash memory. The height H1 of the floating gate electrode 6G (the height from the top surface of the insulating film 12) is, for example, about 270 to 300 nm. The protrusion height H2 of the floating gate electrode 6G (the height from the top surface of the insulating film 18 over the first electrodes 4) is, for example, about 190 nm.

Herein, when the reduction in size of each memory cell MC proceeds, the length of each floating gate electrode 6G along the direction (Y-Y direction) in which the word line 5 extends is also reduced. In this case, the capacitance at the top surface portion of the floating gate electrode 6G decreases with the reduction in size. However, in this embodiment, an increase in height of the floating gate electrode 6G enables an increase in capacitance at the sidewall portion of the floating gate electrode 6G. For this reason, it is possible to prevent the reduction in capacitance between the word lines 5 and the floating gate electrodes 6G. Therefore, in order to prevent a reduction in capacitance due to a reduction in size, the device is preferably designed such that the height (H1) of each floating gate electrode 6G is invariably larger than the length of the floating gate electrode 6G along the direction (Y-Y direction) in which the word line 5 extends. The device is more preferably designed such that the protrusion height (H2) of the floating gate electrode 6G is invariably larger than the length of the floating gate electrode 6G. The above description was directed to a case involving a reduction in size. However, needless to say, it is also possible to further improve the capacitance in the semiconductor device of this embodiment by designing the device such that the height (H1) and the protrusion height (H2) of the floating gate electrode 6G are invariably larger than the length of the floating gate electrode 6G.

Further, when the width of the first electrode 4G in the direction (Y-Y direction) in which the word line 5 extends also has been reduced, the space between the respective floating gate electrodes 6G adjacent to one another via the first electrodes 4G is also reduced. In this case, it may become difficult to bury the insulating film 18 and the word lines 5 (5a) in the space between the respective floating gate electrodes 6G. In such a case, it is conceivable that the thickness of the insulating film 18 is controlled, thereby to be reduced in thickness and to be buried. However, the capacitance between the word lines 5 and the floating gate electrodes 6G is unfavorably reduced. Therefore, the capacitance is required to be increased by the amount of the capacitance reduced due to the reduction in thickness of the insulating film 18 through an increase in the height of the floating gate electrode 6G. Namely, in order to prevent a reduction in the capacitance due to a reduction in size, for example, the device is preferably designed such that the height (H1) of each floating gate electrode 6G is invariably larger than the spacing between the respective floating gate electrodes 6G in the direction (Y-Y direction) in which the word lines 5 extend. The device is more preferably designed such that the protrusion height (H2) of the floating gate electrode 6G is invariably larger than the spacing between the respective floating gate electrodes 6G. Whereas, the above description was directed to a case involving a reduction in size, needless to say, it is also possible to further improve the capacitance in the semiconductor device of this embodiment by designing the device such that the height (H1) and the protrusion height (H2) of the floating gate electrode 6G are invariably larger than the spacing between the respective floating gate electrodes 6G.

Whereas, in this embodiment, the length along the direction (Y-Y direction) in which the word line extends of each floating gate electrode 6G is roughly about the same as the length along the direction (X-X direction) in which the first electrode 4G extends. However, by designing the device such that the length along the direction (X-X direction) of extension of the first electrode 4G is larger than the length of the floating gate electrode 6G along the direction (Y-Y direction) of extension of the word lines, it is possible to increase the value of the capacitance formed at the top surface portion and the sidewall portion of each floating gate electrode 6G. Particularly, it is possible to increase the capacitance value of the sidewall portion.

The plurality of selecting nMIS Qsn are disposed on the side of a bit line serving as a drain of the memory cell MC and on the side of a bit line serving as a source thereof. On the bit line side serving as a drain in FIG. 1, each selecting nMIS Qsn0 is disposed for every bit line along the second direction Y on the right-hand side of FIG. 1. Whereas, on the bit line side serving as a source, each selecting nMIS Qsn1 is disposed for every bit line along the second direction Y on the left-hand side of FIG. 1. Herein, a description will be given of the bit line side serving as a drain. However, the bit line side serving as a source is similar in configuration, and hence a description thereon is omitted.

As shown in FIG. 1, each gate electrode 4LC1 of the selecting nMIS Qsn0 on the bit line side serving as a drain is formed at a part of a band-shaped wire 4LC extending along the second direction Y in such a manner as to be positioned along the wire 4LA (the portion crossing with the band-shaped region of the active region 2). As for the selecting nMIS Qsn1 on the bit line side serving as a source, a wire 4LD1 serving as a gate electrode is formed at a part of a band-shaped wire 4LD extending along the second direction Y in such a manner as to be positioned along the wire 4LB (the portion crossing with the band-shaped region of the active region 2). The gate electrode 4LC1 and the wires 4LC, 4LD1, and 4LD are formed of, for example, a low resistive polysilicon film. These are formed by patterning simultaneously with the patterning for the first electrodes 4G, the broad regions 4GA, and the wires 4LA and 4LB.

As shown in FIG. 4, on the gate electrode 4LC1 and the wire 4LC, a cap film 10 is deposited. The gate electrode 4LC1 and the wire 4LC are electrically connected to an upper first layer wire M1 through a plug PG in a contact hole CT. A gate insulating film 21 of respective selecting nMIS Qsn is formed of, for example, silicon oxide, and it is formed between the gate electrodes 4LC1 and the substrate 1S. Whereas, one semiconductive region 22a for the source and drain of each selecting nMIS Qsn is formed of the aforesaid $n^-$ type semiconductive region 7 for bit line connection. The other semiconductive region 22b for the source and drain of each selecting MIS Qsn has: an $n^-$ type semiconductive region 22b1 formed in the vicinity of the edge of the gate electrode 4LC1, and an $n^+$ type semiconductive region 22b2 formed away from the edge of the gate electrode 4LC1 by the length of the $n^-$ type semiconductive region 22b1, and having a higher concentration than that of the $n^-$ type semiconductive region 22b1. The semiconductive regions 22a and 22b have been doped with, for example, arsenic (As).

Figure 94:
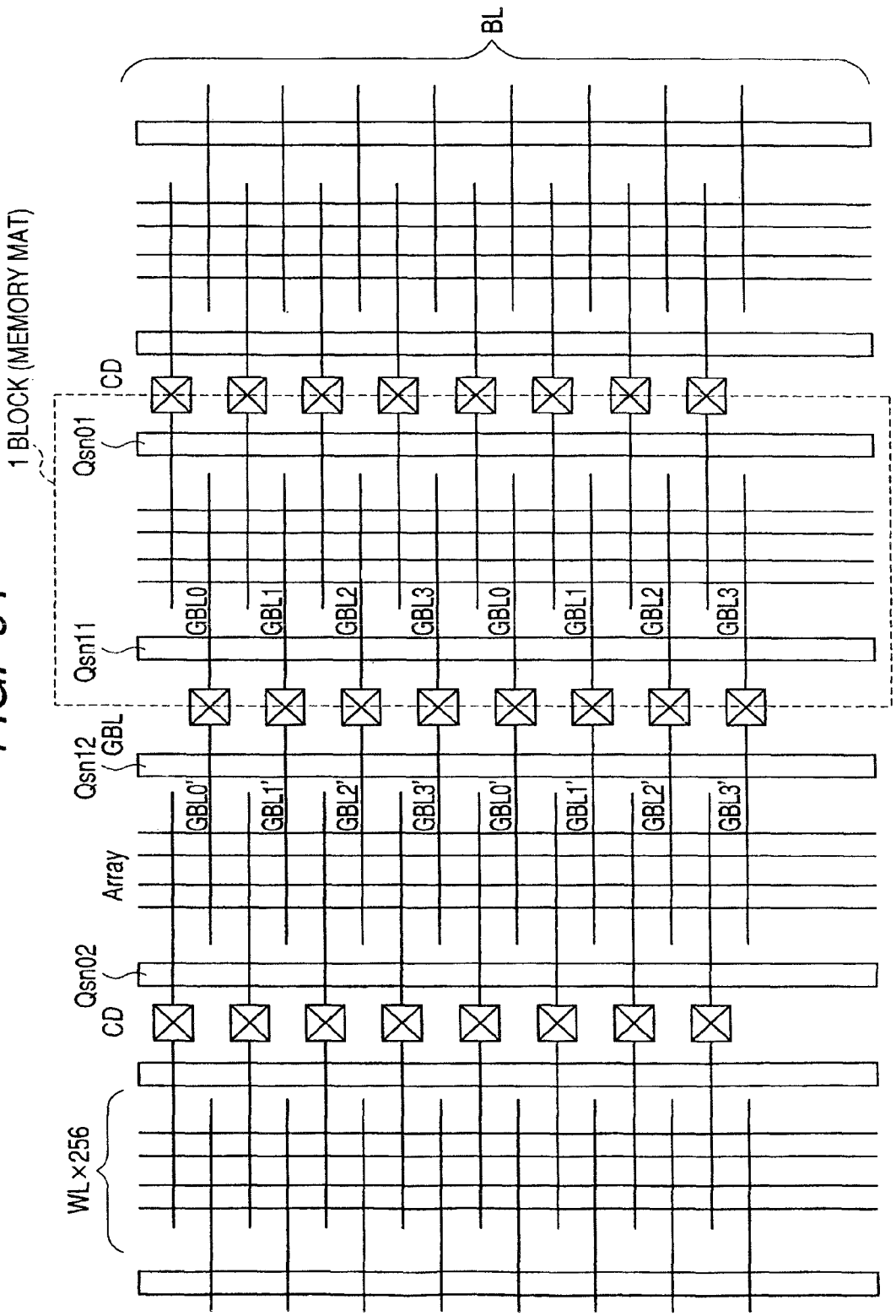
FIG. 94 is a plan view showing one example of the layout of a memory mat of a semiconductor device which represents one embodiment of the present invention.

As shown in FIG. 94, in each block (memory mat), one selecting nMIS Qsn0 is provided per a plurality of memory cells MC on the side of a bit line for a drain. It is configured such that the bit line BL (common drain line CD), serving as a drain of each block, is supplied with power through a contact hole CT, and it is shared through a second wiring layer M2 (not shown). Whereas, one selecting nMIS Qsn1 is provided per a plurality of memory cells MC on the side of a bit line for a source. This is, as described later, for the purpose of preventing respective global bit lines GBL of the adjacent blocks (memory mats) from being shared.

Namely, these respective memory mats are formed in such a manner as to include, at least, a plurality of memory cells, drain bit line selecting nMIS Qsn0, and source bit line selecting nMIS Qsn1. Respective memory mats are arranged symmetrically with respect to the contact holes for supply of power to a bit line for a drain or the contact holes for supply of power to a bit line for a source. By arranging respective memory mats in this manner, it is possible to share the contact holes for supply of power to a bit line for a drain or for a source. Therefore, it is possible to more greatly reduce the area occupied by the flash memory as compared with the case where memory mats having the same configuration are arranged.

Now, an example of the write, read, and erasing operations of the flash memory of this embodiment 1 will be described.

Figure 5:
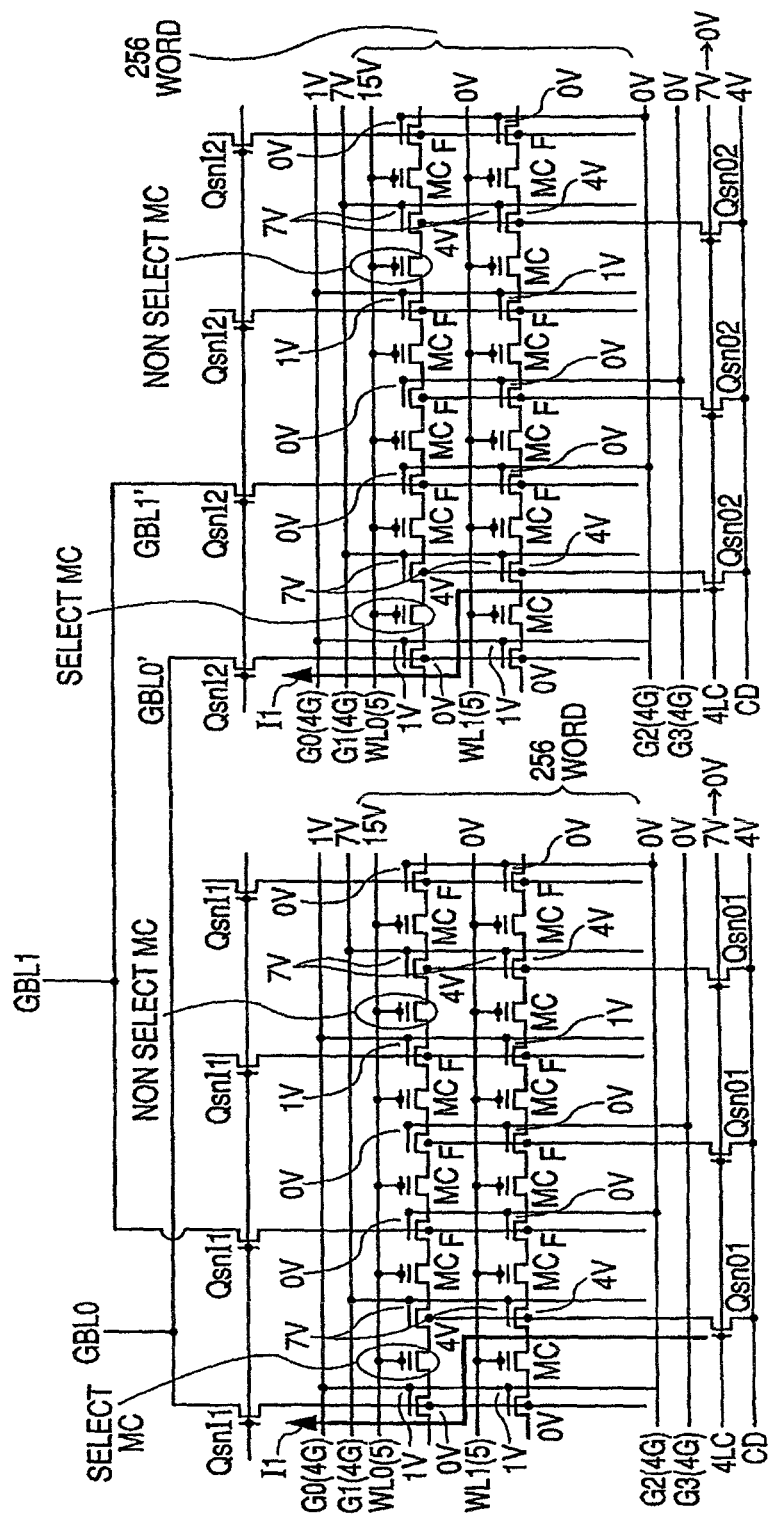
FIG. 5 is a circuit diagram, during the data write operation, of the semiconductor device of FIG. 1.
Figure 6:
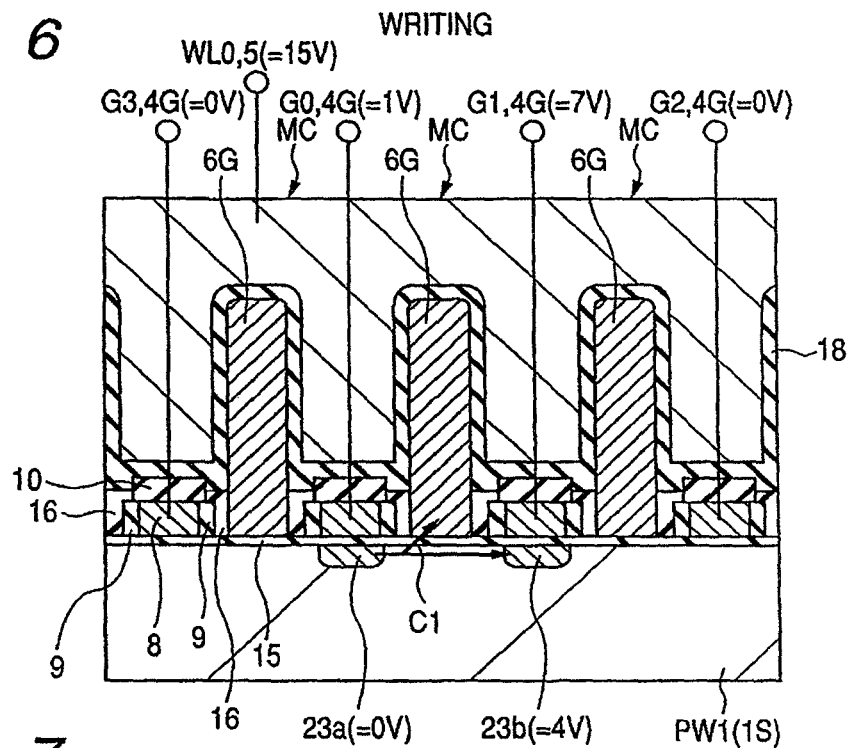
FIG. 6 is a cross sectional view of the semiconductor device during the data write operation of FIG. 5.

FIG. 5 shows a circuit diagram of the semiconductor device during a data write operation by constant charge injection. FIG. 6 shows a cross sectional view of the substrate 1S during a data write operation by constant charge injection. As described above, the unit region is configured as follows: only one stage of the selecting nMIS Qsn01 (4LC) or the selecting nMIS Qsn02 is disposed on the common drain side; and the first electrodes 4G are composed of 4 systems (G0 to G3). To the aforesaid global bit lines GBL0 to GBL3, selecting nMIS Qsn11 are provided, respectively. Selecting nMIS Qsn12 are disposed at global bit lines GBL0' to GBL3' of the adjacent block. These selecting nMIS Qsn11 or selecting nMIS Qsn12 are selected to be turned ON. As a result, the global bit lines GBL0 to GBL3 or GBL0' to GBL3' are supplied with a source electric potential. Then, a desired first electrode 4G out of the first electrodes 4G (G0 to G3) is supplied with a voltage, thereby to select a desired memory cell MC.

Data writing is carried out according to a source side hot electron injection method by source side selection and constant charge injection, with non-selected memory cells MC put in the through state. This enables efficient data writing at a high speed and with a low current. Whereas, individual memory cells MC are capable of storing multilevel data. The multilevel storage is carried out in the following manner. The write voltage of the word line WL is set constant, and the write time is changed. As a result, the amount of hot electrons to be injected to the floating gate electrode 6G is changed. Therefore, it is possible to form a memory cell MC having several kinds of threshold value levels. Namely, the memory cell MC can store four or more values such as "00"/"01"/"10"/"11". For this reason, one memory cell MC is capable of implementing an operation equivalent to those of two memory cells MC. Accordingly, it is possible to implement a reduction in the size of a flash memory.

In the data write operation, the word line WL0 (5) to which the selected memory cell MC is connected is supplied with a voltage of, for example, about 15 V, and other word lines WL1(5), and the like are supplied with a voltage of, for example, 0V. Whereas, the first electrode G0 (4G) for forming the source of the selected memory cell MC is supplied with a voltage of, for example, about 1 V. The first electrode G1 (4G) for forming the drain of the selected memory cell MC is applied with a voltage of, for example, about 7 V. As a result, an n type inversion layer 23a for forming the source is formed in the principal surface portion of the substrate 1S facing the first electrode G0 (4G), and an n type inversion layer 23b for forming the drain is formed in the principal surface portion of the substrate 1S facing the first electrode G1 (4G). By supplying the other first electrodes G2 (4G) and G3 (4G) with a voltage of, for example, 0V, an inversion layer is prevented from being formed in the principal surface portion of the substrate 1S facing the first electrodes G2 (4G) and G3 (4G). This causes an isolation between the selected and non-selected memory cells MC. In this state, the wire 4LC is supplied with a voltage of, for example, 7V, thereby to turn ON the selecting nMIS Qsn0. Thus, a voltage of about 4V that is applied to the common drain line CD is supplied to the drain of the selected memory cell MC through the $n^-$ type semiconductive region 7 and the n type inversion layer 23b. However, still under this situation, the non-selected memory cells MC connected to the word line WL0 (5) are also brought into the same state as that of the selected memory cell MC, so that data is also written in the non-selected memory cells MC. Such being the situation, the global bit line GBL0 to which the inversion layer 23a for forming the source of the selected memory cell MC is connected is supplied with a voltage of, for example, 0V. On the other hand, the global bit line GBL2 to which the n type inversion layer 23a for forming the source of the non-selected memory cell MC is connected is supplied with a voltage of, for example, about 1.2 V. Whereas, the other global bit lines GBL1 and GBL2 are supplied with a voltage of, for example, 0V. This causes a write current I1 to flow from the drain toward the source through the selected memory cell MC. At this step, the electric charges accumulated in the n type inversion layer 23a on the source side are allowed to flow as a given constant channel current, and they are injected into the floating gate electrode 6G with efficiency via the insulating film 15 (constant charge injection method). As a result, data is written into the selected memory cell MC at a high speed. On the other hand, a drain current is prevented from flowing from the drain toward the source through the non-selected memory cells MC, so that data writing is inhibited. Incidentally, a symbol F in FIG. 5 denotes the floating state, and an arrow C1 of FIG. 6 schematically shows the manner in which the electric charges for data are injected.

Figure 7:
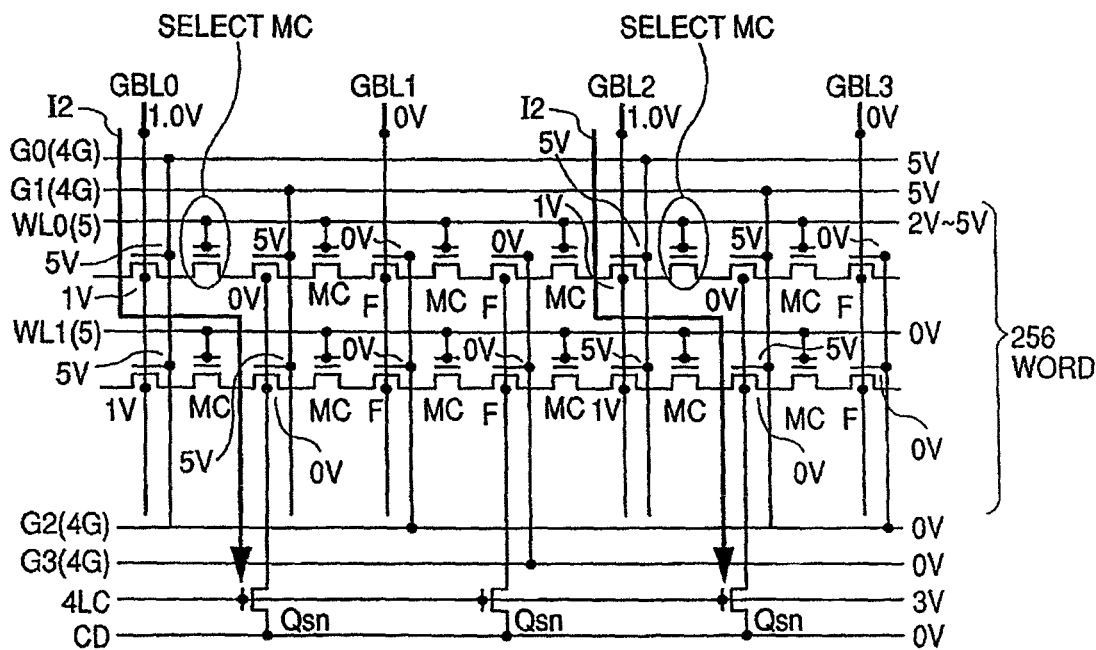
FIG. 7 is a circuit diagram of the semiconductor device during the data write operation of FIG. 1.
Figure 8:
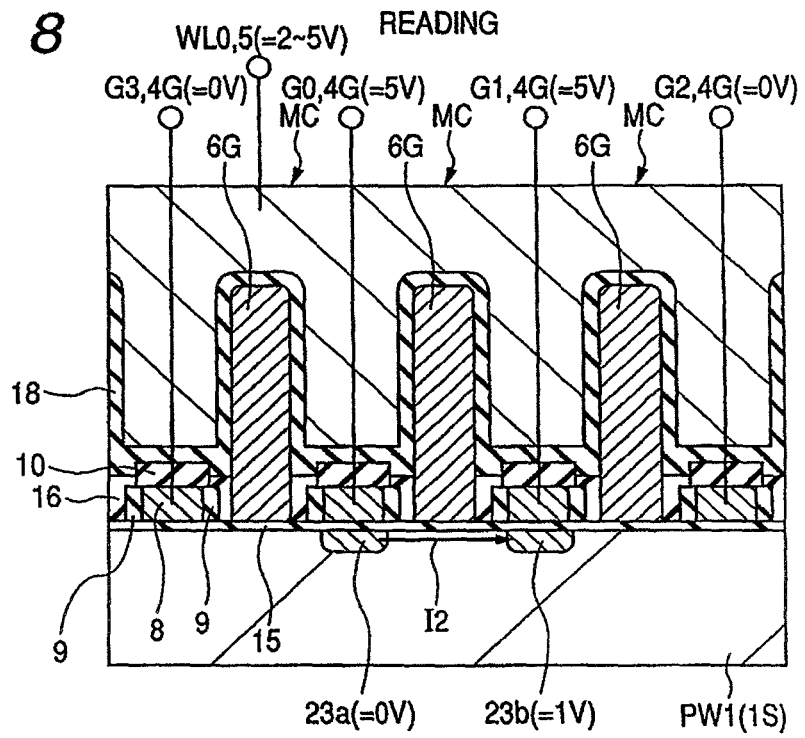
FIG. 8 is a cross sectional view of the semiconductor device during the data write operation of FIG. 7.

FIG. 7 shows a circuit diagram of the semiconductor device during a data read operation, and FIG. 8 shows a cross sectional view of the substrate 1S during a data read operation.

In data reading, the direction of a read current I2 is opposite to the current direction during the write operation. Namely, the read current I2 flows from the global bit lines GBL0 and GBL2 to the common drain line CD. In a data read operation, the word line WL0 (5) to which the selected memory cell MC is connected is supplied with a voltage of, for example, about 2 to 5 V, and the other word lines WL1(5) and the like are supplied with a voltage of, for example, 0V. Whereas, by supplying the first electrodes G0 (4G) and G1 (4G) for forming the source and the drain of the selected memory cell MC with a voltage of, for example, about 5 V, an n type inversion layer 23a for a source is formed in the principal surface portion of the substrate 1S facing the first electrode G0 (4G), and an n type inversion layer 23b for a drain is formed in the principal surface portion of the substrate 1S facing the first electrode G1 (4G). Whereas, by supplying the other first electrodes G2 (4G) and G3 (4G) with a voltage of, for example, 0V, an inversion layer is prevented from being formed in the principal surface portion of the substrate 1S facing the first electrodes G2 (4G) and G3 (4G). Thus, isolation is carried out. At this step, the global bit lines GBL0 and GBL2 to which the n type inversion layer 23a for a source of the selected memory cell MC is connected is supplied with a voltage of, for example, about 1V. On the other hand, the other global bit lines GBL1 and GBL3 are supplied with a voltage of, for example, 0 V. In this state, the wire 4LC is supplied with a voltage of, for example, about 3V, thereby to turn ON the selecting nMIS Qsn. Thus, a voltage of about 0V that is applied to the common drain line CD is supplied to the drain of the selected memory cell MC through the n⁻ type semiconductive region 7 and the n type inversion layer 23b. Data reading of the selected memory cell MC is performed in this manner. FIG. 7 schematically shows the state in which one bit is concurrently read out to 4 bits. At this step, the state of the accumulated electric charges of the floating gate electrode 6G changes the threshold voltage of the selected memory cell MC. For this reason, it is possible to judge the data of the selected memory cell MC according to the state of the current flowing between the source and the drain of the selected memory cell MC. For example, in the case of the two selected memory cells MC shown in FIG. 7, it is assumed that the threshold value level of the left-hand side selected memory cell MC is 4 V, and that the threshold value level of the right-hand side selected memory cell MC is 5V. In this case, when the read voltage is 5 V, a current flows through both the memory cells MC. However, when reading is performed at 4.5 V, a current does not flow to the left-hand side cell, but a current flows through the right-hand cell. Thus, it is possible to carry out a read operation on the multilevel storage memory cell according to the state of electric charges accumulated in the memory cell MC and the read voltage.

Figure 9:
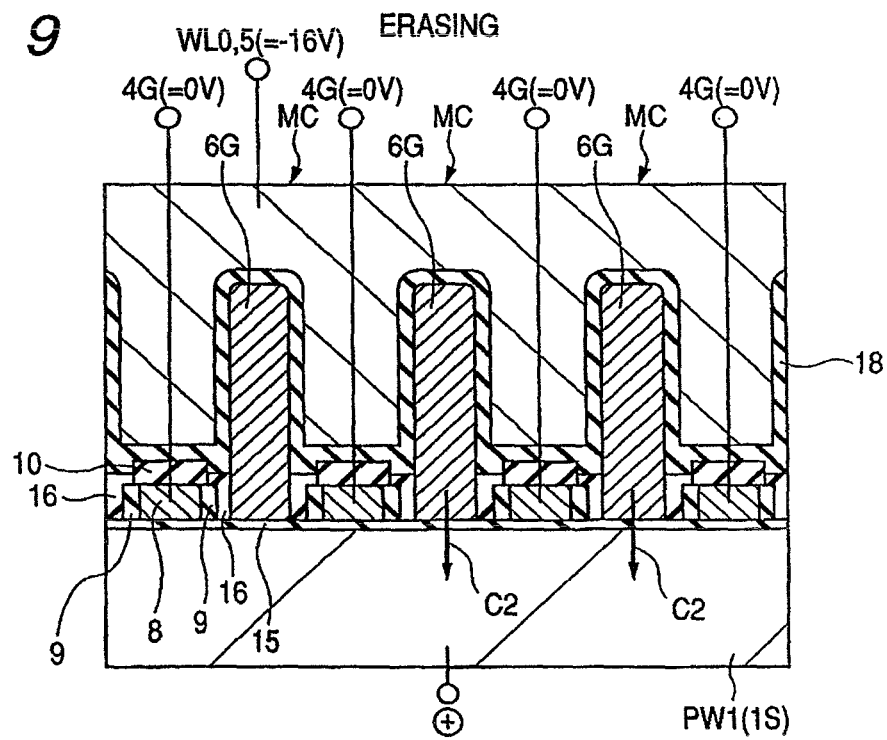
FIG. 9 is a cross sectional view of the semiconductor device during the data erasing operation.

FIG. 9 shows a cross sectional view of the substrate 1S during a data erasing operation. In a data erasing operation, a word line 5 to be selected is supplied with a negative voltage, thereby to cause F-N (Fowlor Nordheim) tunnel emission from the floating gate electrode 6G to the substrate 1S. Namely, the word line 5 to be selected is supplied with a voltage of, for example, about −16 V. On the other hand, the substrate 1S is applied with a positive voltage. The first electrode 4G is supplied with a voltage of, for example, 0V, so that an n type inversion layer is not formed. This causes the electric charges for data accumulated in the floating gate electrode 6G to be emitted into the substrate 1S via the insulating film 15. Thus, the data of a plurality of the memory cells MC are erased by one operation. Incidentally, FIG. 9 schematically shows the manner in which the electric charges for data are emitted.

Next, one example of a method of manufacturing the flash memory of this embodiment 1 will be described by reference to FIGS. 10 to 74.

Figure 10:
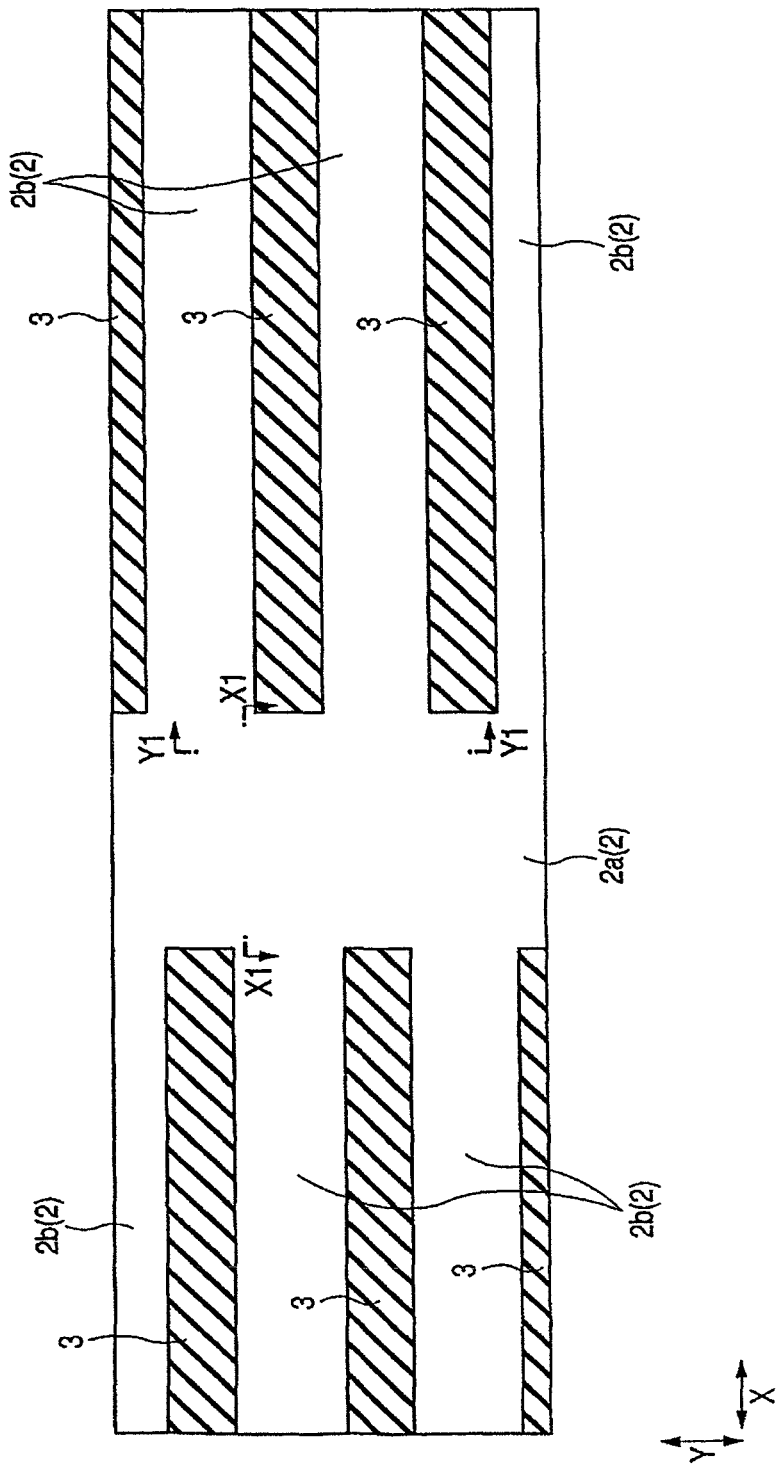
FIG. 10 is a plan view showing one example of a semiconductor substrate in a step of manufacturing the semiconductor device of FIG. 1.
Figure 11:
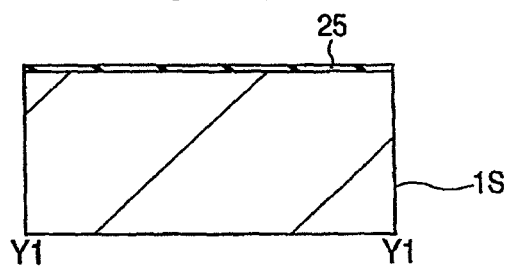
FIG. 11 is a cross sectional view taken along line Y1-Y1 of FIG. 10.
Figure 12:
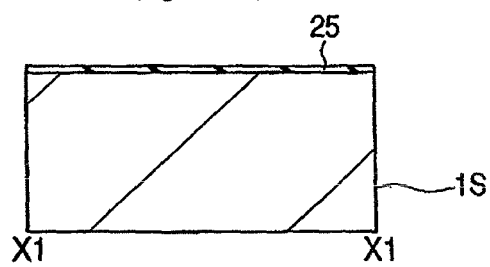
FIG. 12 is a cross sectional view taken along line X1-X1 of FIG. 10.
Figure 13:
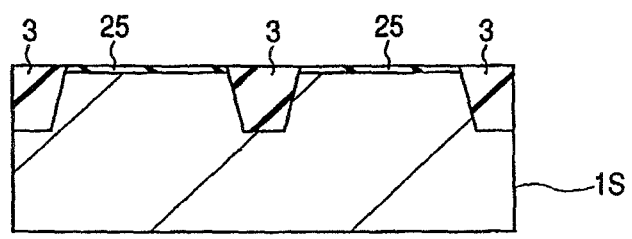
FIG. 13 is a cross sectional view showing one example of the semiconductor substrate in a peripheral circuit region of the semiconductor device in the manufacturing step of FIG. 10.

FIG. 10 is a plan view showing one example of the substrate 1S after a step of forming the active region 2 and the isolation region 3. FIG. 11 is a cross sectional view taken along line Y1-Y1 of FIG. 10. FIG. 12 is a cross sectional view taken along line X1-X1 of FIG. 10. FIG. 13 is a cross sectional view of the substrate 1S in the peripheral circuit region of the flash memory during the manufacturing step of FIG. 10. FIG. 10 is a plan view, wherein the isolation region 3 is hatched for convenient reference in the drawing. The substrate 1S (at this step, a semiconductor wafer circular in plan view (which is hereinafter simply referred to as a wafer)) is made of, for example, a p type silicon single crystal. Over the principal surface (device-formed surface) thereof, the active region 2 and the trench type isolation region 3 are formed. The active region 2 is a region where devices are formed. As shown in FIG. 10, it has a central rectangular region 2a, and a plurality of band-shaped regions 2b extend outwardly from the oppositely facing sides of the rectangular region 2a in the first direction X. In this rectangular region 2a, the plurality of memory cells MC and the inversion layer for a bit line are formed. In the band-shaped region 2b, the inversion layer for a bit line is formed. Over the principal surface of the substrate 1S in the active region 2, an insulating film 25 made of, for example, silicon oxide is formed. The trench type isolation regions 3 for defining the outline of the plan configuration of the active region 2 are formed by embedding an insulating film made of, for example, silicon oxide, in the trenches dug in the principal surface of the substrate 15.

Figure 14:
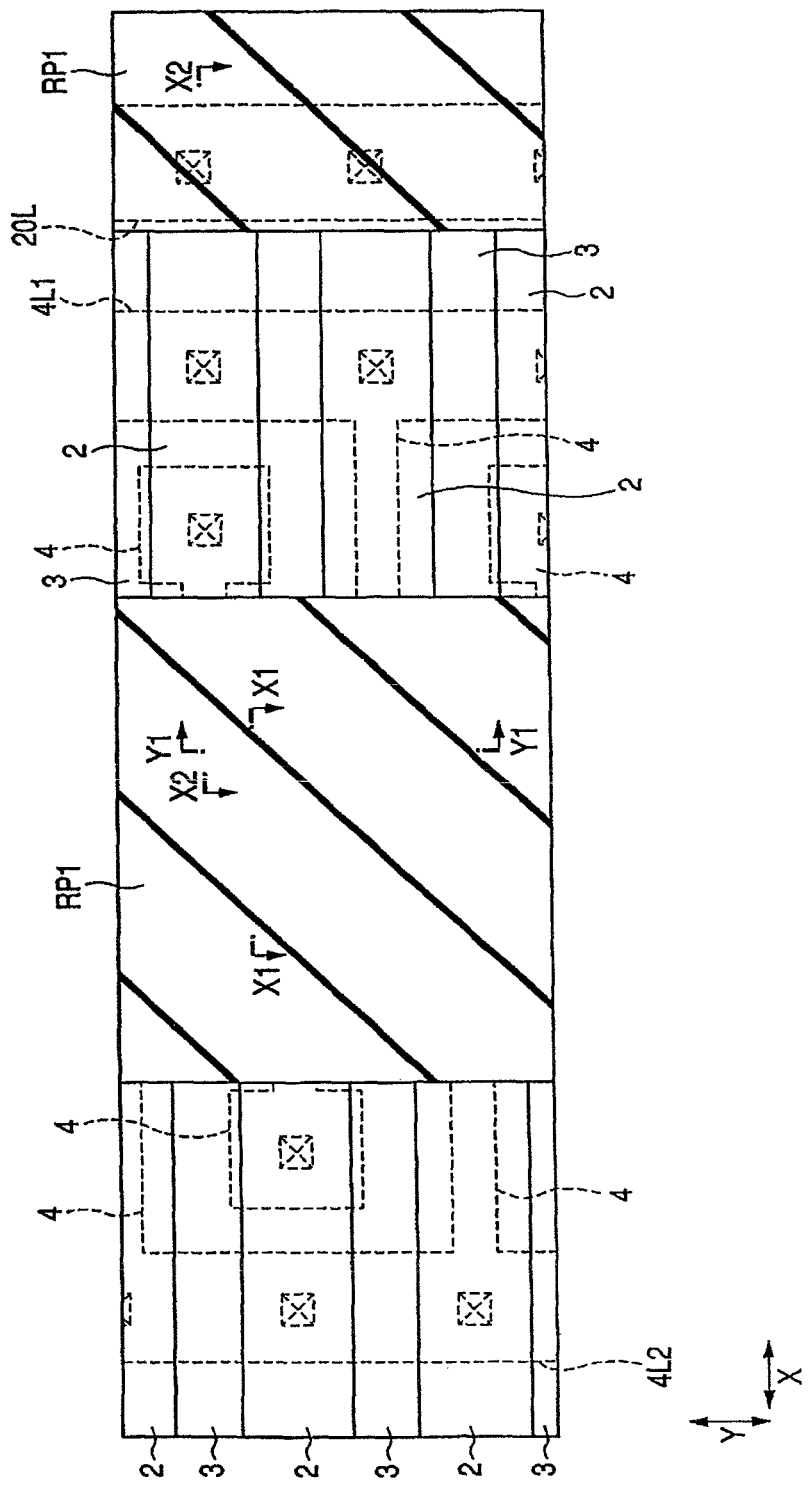
FIG. 14 is a plan view showing one example of the semiconductor substrate in a step of manufacturing the semiconductor device subsequent to the manufacturing step of FIG. 10.
Figure 15:
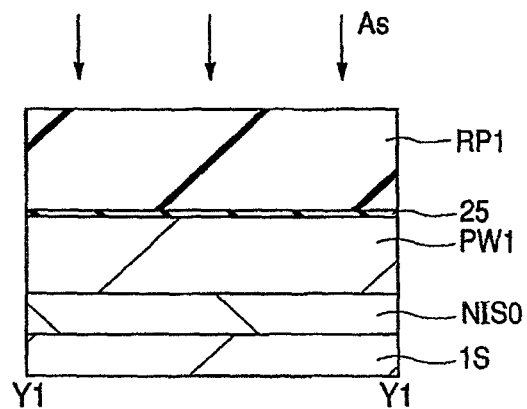
FIG. 15 is a cross sectional view taken along line Y1-Y1 of FIG. 14.
Figure 16:
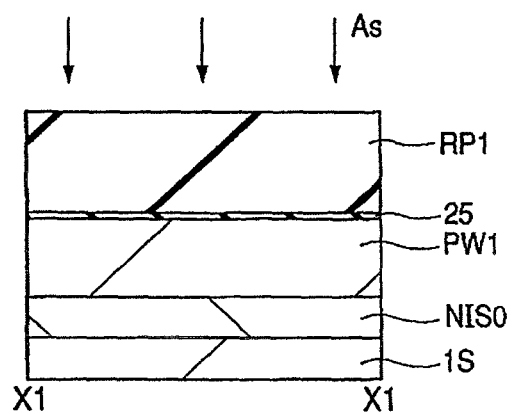
FIG. 16 is a cross sectional view taken along line X1-X1 of FIG. 14.
Figure 17:
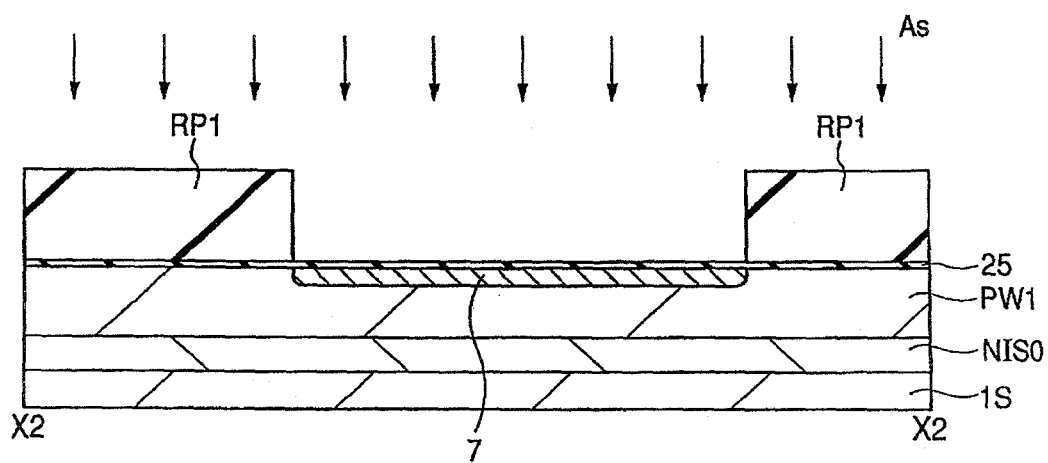
FIG. 17 is a cross sectional view taken along line X2-X2 of FIG. 14.
Figure 18:
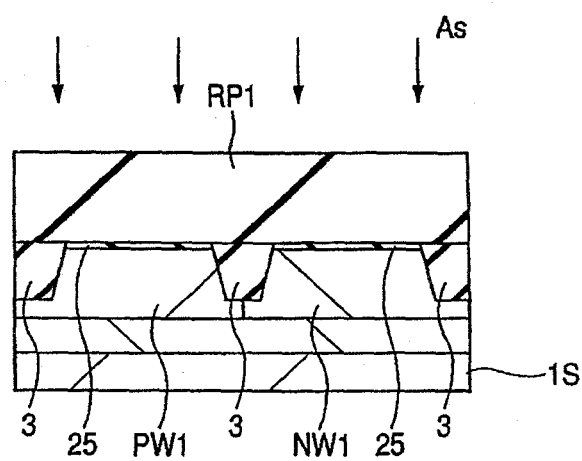
FIG. 18 is a cross sectional view showing one example of the semiconductor substrate in a peripheral circuit region of a flash memory in the manufacturing step of FIG. 14.

FIG. 14 is a plan view of one example of the substrate 1S during a manufacturing step of the flash memory subsequent to the manufacturing steps of FIG. 10. FIG. 15 is a cross sectional view taken along line Y1-Y1 of FIG. 14. FIG. 16 is a cross sectional view taken along line X1-X1 of FIG. 14. FIG. 17 is a cross sectional view taken along line X2-X2 of FIG. 14. FIG. 18 is a cross sectional view of one example of the substrate 1S in the peripheral circuit region of the flash memory during the manufacturing step of FIG. 14.

First, for example, phosphorous (P) is selectively introduced into the memory region of the substrate 1S by a conventional ion implantation method, or the like. As a result, an n type buried region NISO is formed. Then, for example, boron (B) is selectively introduced into the memory region and the peripheral circuit region of the substrate 1S by a conventional ion implantation method, or the like. As a result, a p type well PW1 is formed. Whereas, for example, phosphorus is selectively introduced into the peripheral circuit region of the substrate 1S. As a result, an n type well NW1 is formed.

Thereafter, as shown in FIGS. 14 to 17, such a photoresist pattern (which is hereinafter simply referred to as a resist pattern) as to expose the formation region of the n⁻ type semiconductive region 7 and to cover the other region is formed. Then, by the use of it as a mask, for example, arsenic is introduced into the substrate 1S by an ion implantation method, or the like. As a result, the n⁻ type semiconductive region 7 for connecting the memory cell MC with the selecting MOS Qsn is formed in the principal surface of the substrate 1S. Incidentally, at this stage, the first electrode 4G, the wires 4LA, 4LB, 4LC, and the like are not formed. However, in FIG. 4, the first electrode 4G, the wires 4LA, 4LB, 4LC, and the like are indicated by dashed lines for convenience of understanding the relative position at which the resist pattern RP1 is formed.

Figure 19:
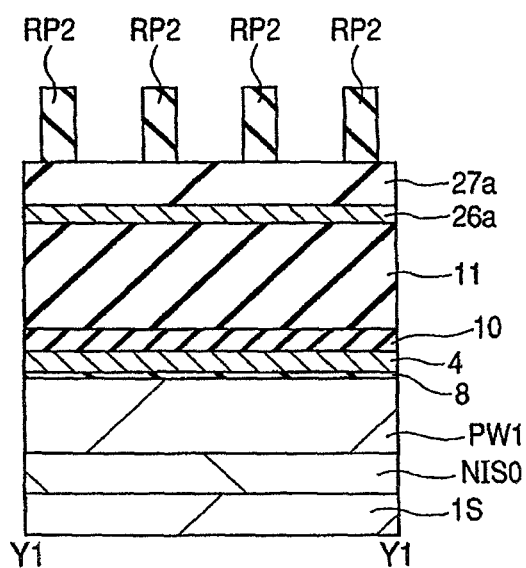
Figure 20:
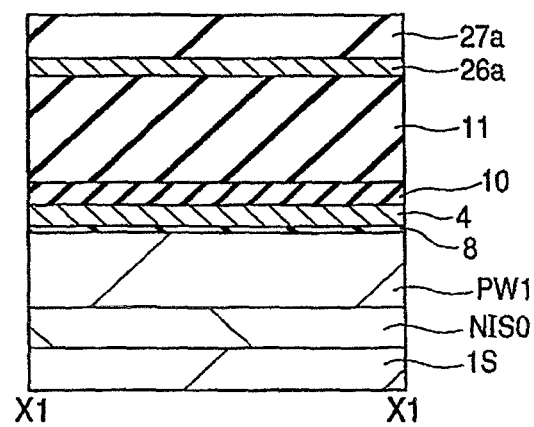
FIG. 20 is a cross sectional view of the portion corresponding to line X1-X1 of FIG. 14 in the same step as that of FIG. 19.
Figure 21:
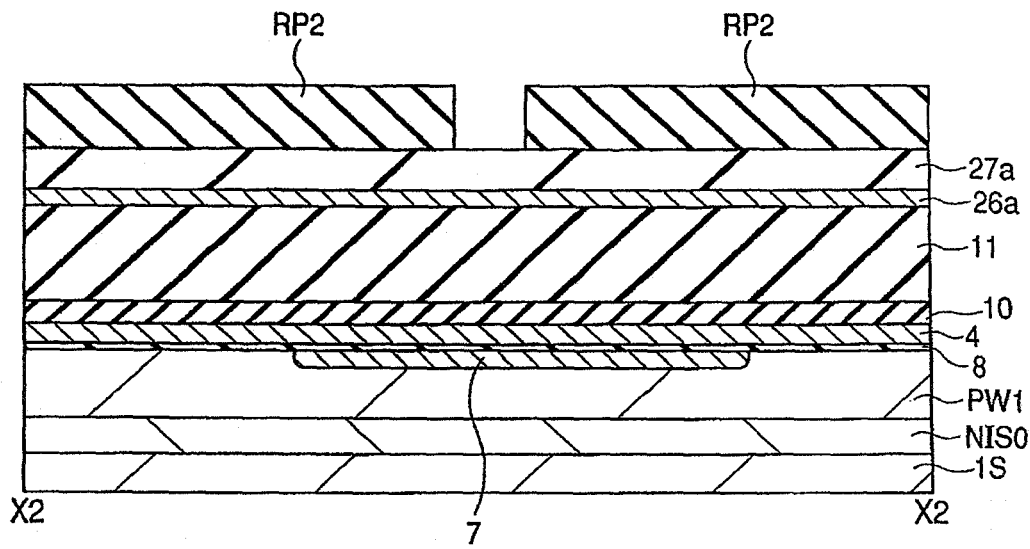
FIG. 21 is a cross sectional view of the portion corresponding to line X2-X2 of FIG. 14 in the same step as that of FIG. 19.
Figure 22:
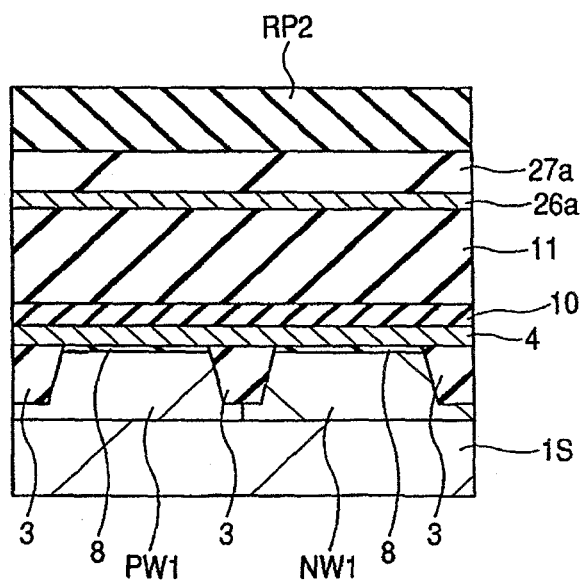
FIG. 22 is a cross sectional view showing one example of the semiconductor substrate in the peripheral circuit region of the flash memory in the same step as that of FIG. 14.

FIG. 19 is a cross sectional view of a portion corresponding to line Y1-Y1 of FIG. 14 during a manufacturing step of the flash memory subsequent to the manufacturing step of FIG. 14. FIG. 20 is a cross sectional view of a portion corresponding to line X1-X1 of FIG. 14 during the same step as FIG. 19. FIG. 21 is a cross sectional view of a portion corresponding to line X2-X2 of FIG. 14 during the same step as FIG. 19. FIG. 22 shows a cross sectional view of one example of the substrate 1S in the peripheral circuit region of the flash memory during the same step as FIG. 19. Herein, first, over the principal surface of the substrate 1S (wafer), an insulating film (first insulating film) 8 made of, for example, silicon oxide, is formed so as to have a thickness of, for example, about 8.5 nm in terms of the silicon dioxide equivalent film thickness by a thermal oxidation method such as an ISSG (In-Situ Steam Generation) oxidation method. Then, a conductor film 4 made of, for example, a low resistive polysilicon is deposited thereon so as to have a thickness of, for example, about 50 nm by a CVD (Chemical Vapor Deposition) method, or the like. A cap film (second insulating film) 10 made of, for example, silicon nitride is further deposited thereon so as to have a thickness of, for example, about 70 nm by a CVD method or the like. Subsequently, on the cap film 10, an insulating film (third insulating film) 11 made of, for example, silicon oxide, is deposited by a CVD method using, for example, TEOS (Tetraethoxysilane) gas, or the like. Then, a hard mask film 26a made of, for example, a low resistive polysilicon, is deposited thereon by a CVD method or the like. An antireflection film 27a made of, for example, silicon oxynitride (SiON) is further deposited thereon by a plasma CVD method or the like. Thereafter, on the antireflection film 27a, a resist pattern RP2 for forming the first electrodes 4G is formed. In an exposure processing for the formation of the resist pattern RP2, a Levenson type phase shift mask is used as a photomask. Namely, a phase shift mask is used which has a configuration such that the phases of lights which have passed through transmission regions adjacent to each other are inverted by 180 degrees relative to each other. Then, by the use of the resist pattern RP2 as an etching mask, the portions of the antireflection film 27a and the hard mask film 26, exposed therefrom, are etched, followed by removal of the resist pattern RP2. The states of the flash memory during the manufacturing steps subsequent to this step are shown in FIGS. 23 to 26.

Figure 23:
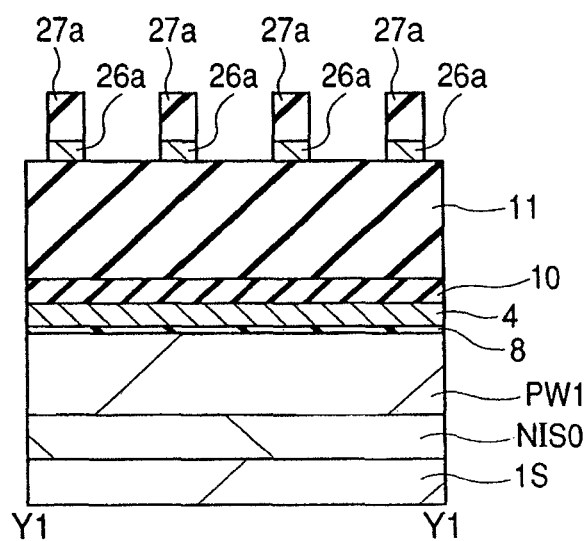
FIG. 23 is a cross sectional view of the portion corresponding to line Y1-Y1 of FIG. 14 in a step of manufacturing the semiconductor device subsequent to the manufacturing step of FIG. 19.
Figure 24:
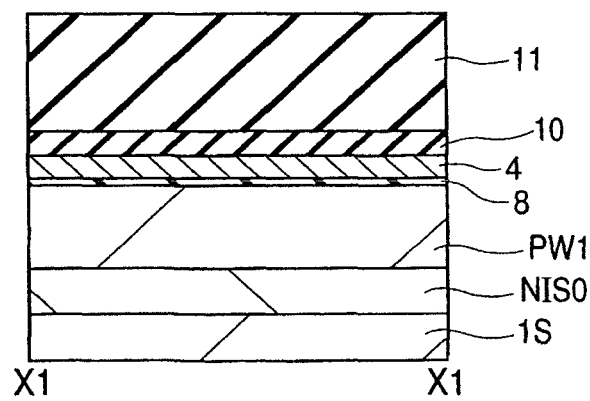
FIG. 24 is a cross sectional view of the portion corresponding to line X1-X1 of FIG. 14 in the same step as that of FIG. 23.
Figure 25:
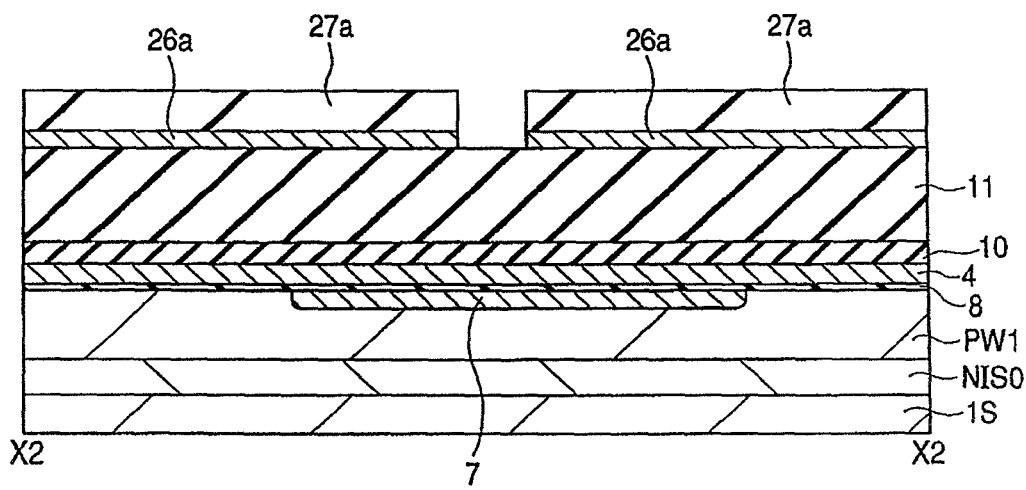
FIG. 25 is a cross sectional view of the portion corresponding to line X2-X2 of FIG. 14 in the same step as that of FIG. 23.
Figure 26:
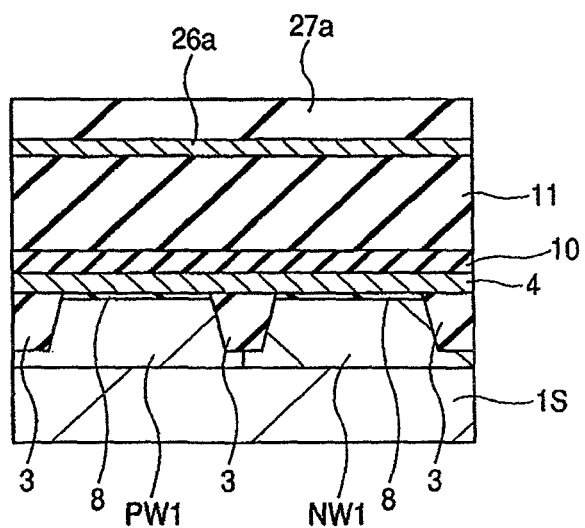
FIG. 26 is a cross sectional view showing one example of the semiconductor substrate in the peripheral circuit region of the semiconductor device in the same step as that of FIG. 23.

FIG. 23 is a cross sectional view of a portion corresponding to line Y1-Y1 of FIG. 14 during a manufacturing step of the flash memory subsequent to the manufacturing step of FIG. 19. FIG. 24 is a cross sectional view of a portion corresponding to line X1-X1 of FIG. 14 during the same step as FIG. 23. FIG. 25 is a cross sectional view of a portion corresponding to line X2-X2 of FIG. 14 during the same step as FIG. 23. FIG. 26 shows a cross sectional view of one example of the substrate 1S in the peripheral circuit region of the flash memory during the same step as FIG. 23. Herein, the pattern of the antireflection film 27a and the hard mask film 26a for forming the first electrodes is formed by etching processing. Subsequently, by the use of the antireflection film 27a and the hard mask film 26a as an etching mask, the portions of the insulating film 11, the cap film 10, and the conductor film 4, exposed therefrom, are etched. The states of the flash memory during the manufacturing steps subsequent to this step are shown in FIGS. 27 to 32.

Figure 27:
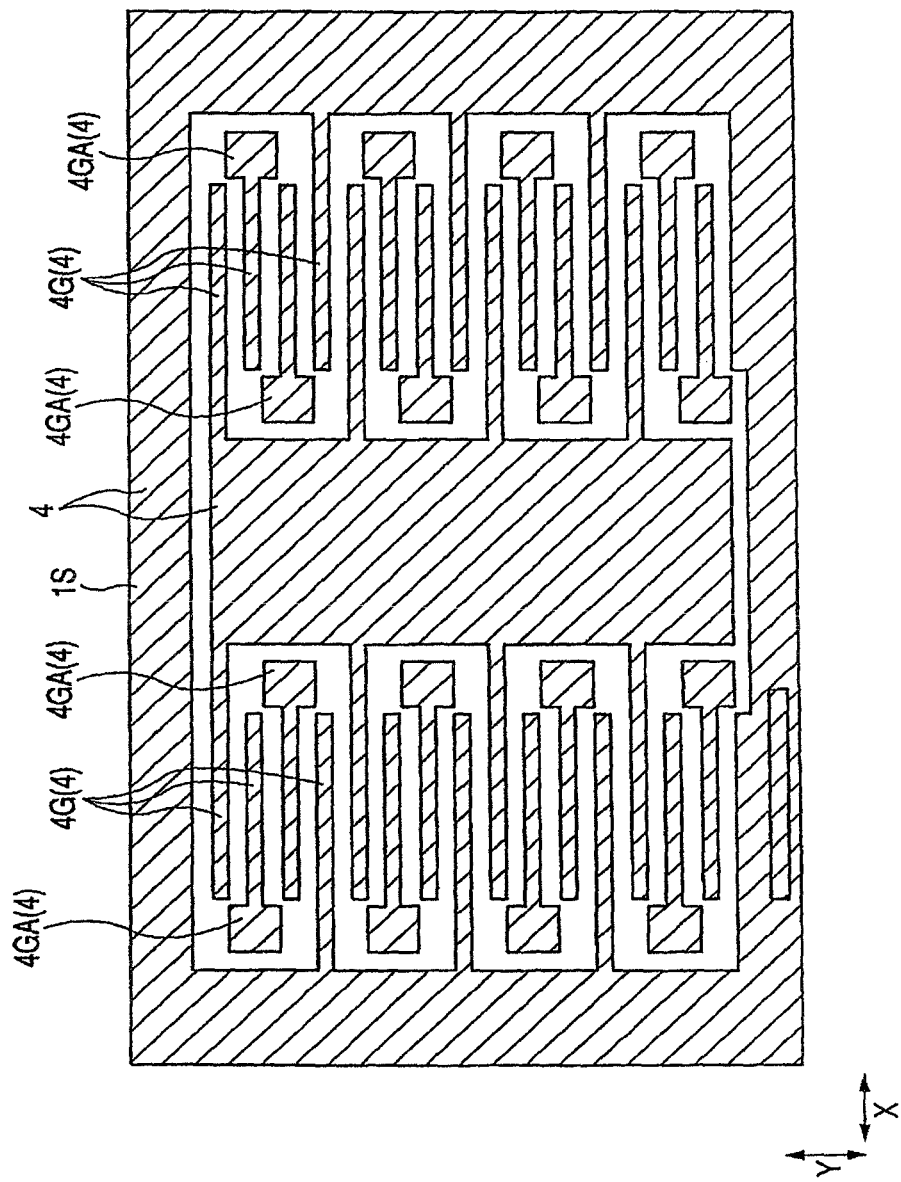
Figure 28:
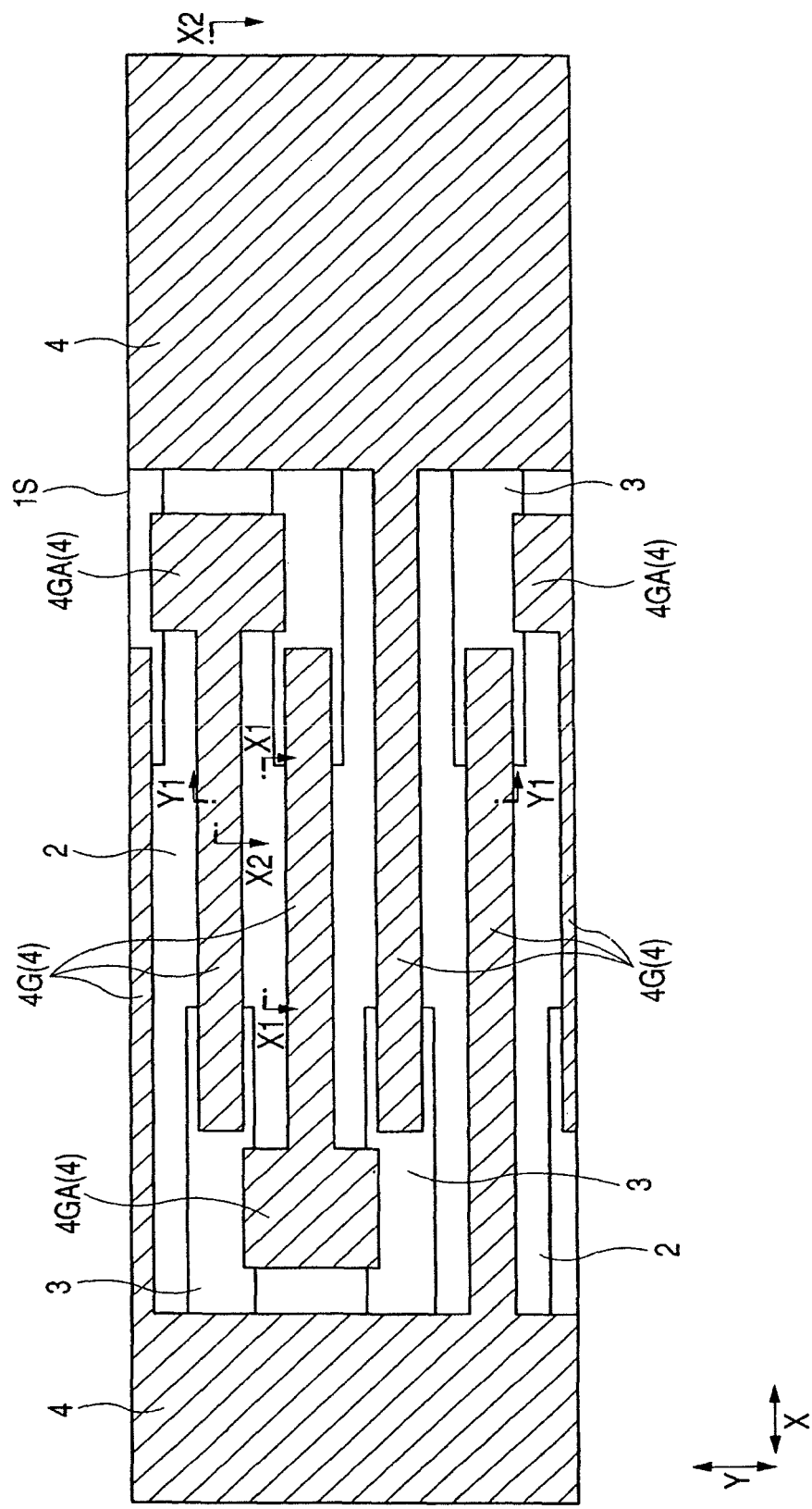
FIG. 28 is a plan view on an enlarged scale of the semiconductor device of FIG. 27.
Figure 29:
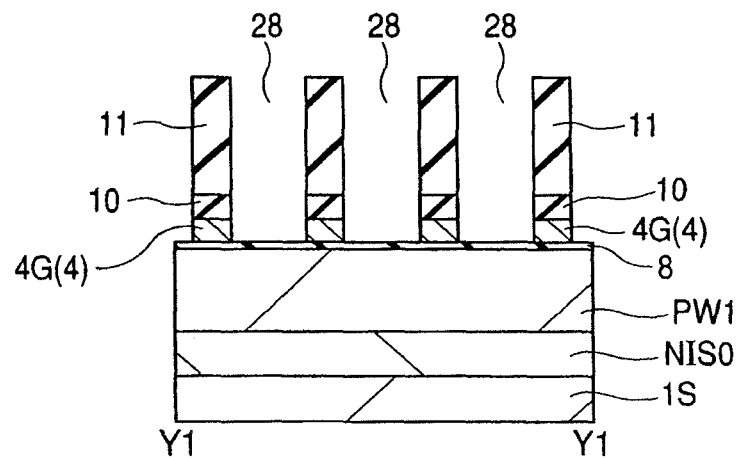
FIG. 29 is a cross sectional view taken along line Y1-Y1 of FIG. 28.
Figure 30:
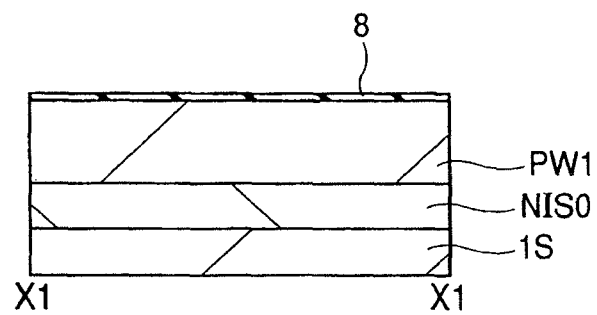
FIG. 30 is a cross sectional view taken along line X1-X1 of FIG. 28.
Figure 31:
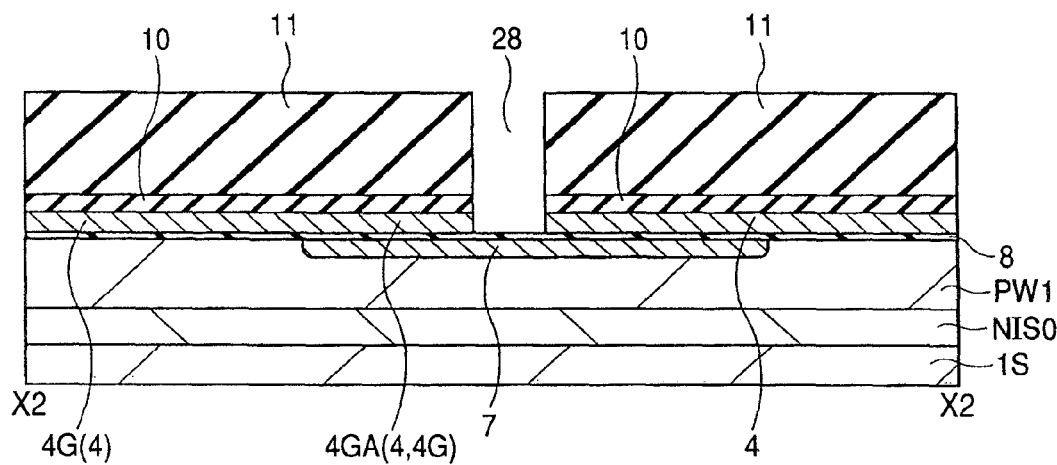
FIG. 31 is a cross sectional view taken along line X2-X2 of FIG. 28.
Figure 32:
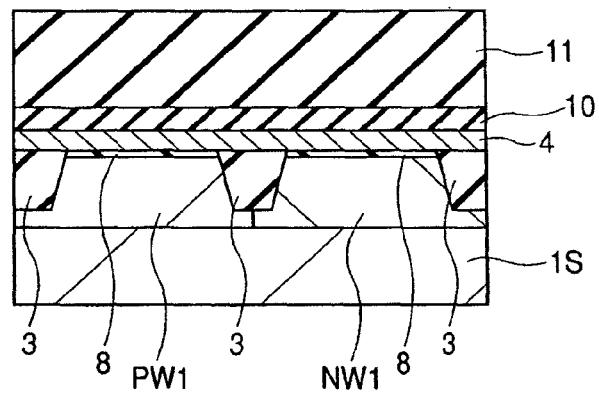
FIG. 32 is a cross sectional view showing one example of the semiconductor substrate in the peripheral circuit region of the semiconductor device in the same step as that of FIG. 27.

FIG. 27 is a plan view of the flash memory during a manufacturing step of the flash memory subsequent to the manufacturing step of FIG. 23. FIG. 28 is a plan view on an enlarged scale of the device of FIG. 27. FIG. 29 is a cross sectional view taken along line Y1-Y1 of FIG. 28. FIG. 30 is a cross sectional view taken along line X1-X1 of FIG. 28. FIG. 31 is a cross sectional view taken along line X2-X2 of FIG. 28. FIG. 32 shows a cross sectional view of one example of the substrate 1S in the peripheral circuit region of the flash memory during the same step as FIG. 27. Herein, the first electrodes 4G and the broad regions 4GA are formed through patterning by the etching processing of the conductor film 4. At this step, the dimension along the width direction (the dimension along the second direction Y of FIGS. 27, 28, and the like) of each first electrode 4G is, for example, about 75 nm. The spacing along the second direction Y between the adjacent first electrodes 4G is, for example, about 105 nm. With the etching processing of the conductor film 4, the side of each trench 28 in the etching region, i.e., the side of each pattern of a multilayered film of the left first electrodes 4G, cap film 10, and insulating film 11, is preferably as vertical as possible with respect to the principal surface of the substrate 1S. The reason for this will be described later. With the etching processing, when the insulating film 11 and the cap film 10 are etched, the antireflection film 27a is etched. Whereas, when the conductor film 4 is etched, the hard mask film 26a is etched. Therefore, after the etching processing, the antireflection film 27a and the hard mask film 26a are not left.

Figure 33:
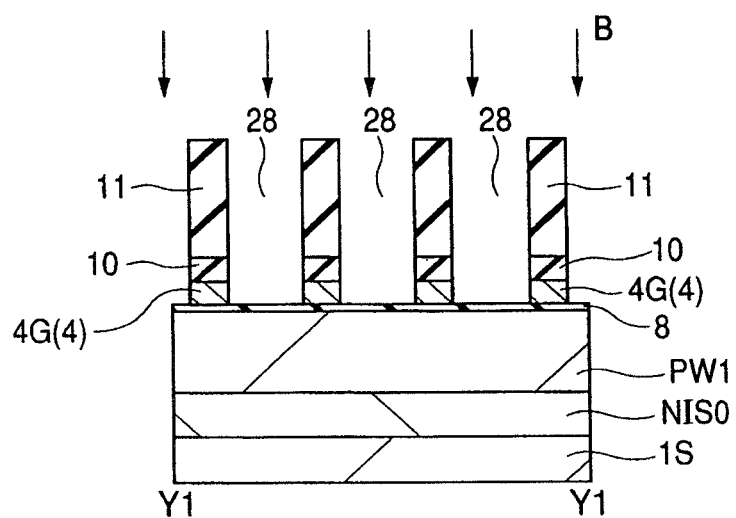
FIG. 33 is a cross sectional view of the portion corresponding to line Y1-Y1 of FIG. 28 in a manufacturing step subsequent to the manufacturing step of FIG. 27.
Figure 34:
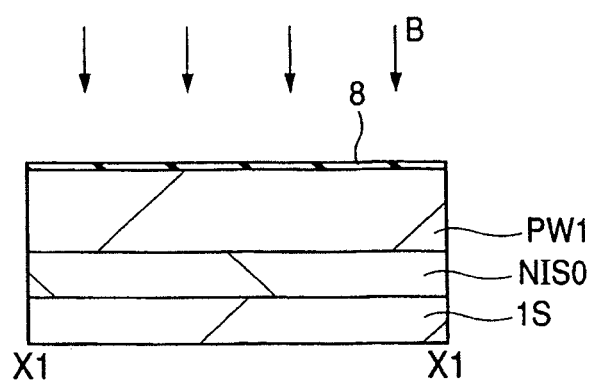
FIG. 34 is a cross sectional view of the portion corresponding to line X1-X1 of FIG. 28 in the same step as that of FIG. 33.
Figure 35:
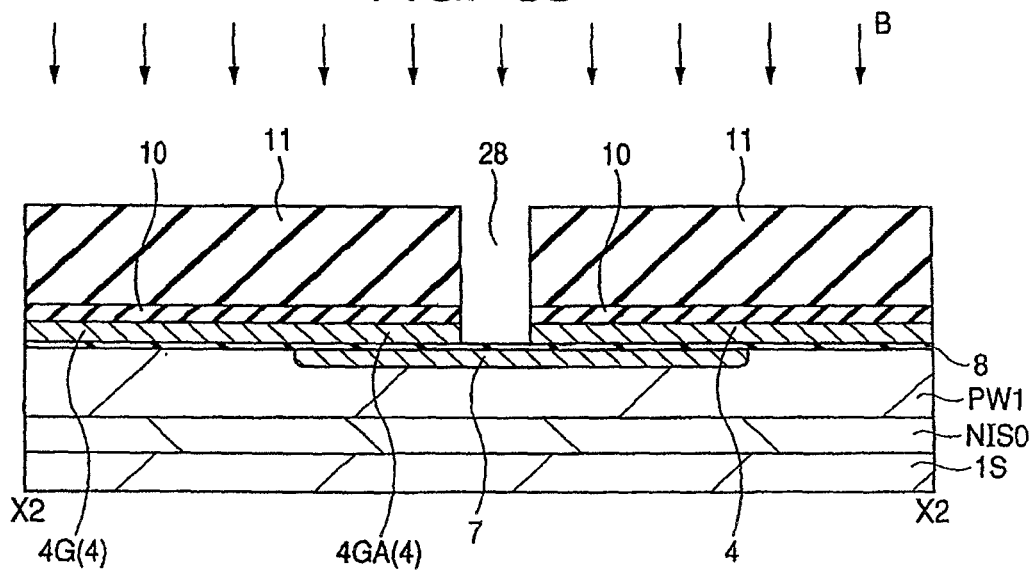
FIG. 35 is a cross sectional view of the portion corresponding to line X2-X2 of FIG. 28 in the same step as that of FIG. 33.
Figure 36:
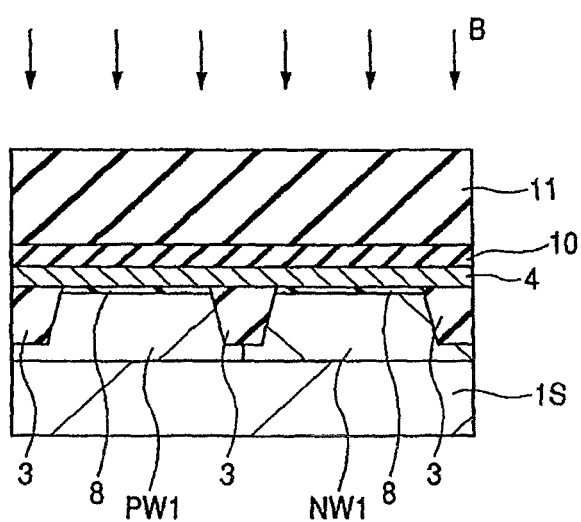
FIG. 36 is a cross sectional view showing one example of the semiconductor substrate in the peripheral circuit region of the semiconductor device in the same step as that of FIG. 33.

FIG. 33 is a cross sectional view of a portion corresponding to line Y1-Y1 of FIG. 28 during a manufacturing step of the flash memory subsequent to the manufacturing step of FIG. 28. FIG. 34 is a cross sectional view of a portion corresponding to line X1-X1 of FIG. 28 during the same step as FIG. 33. FIG. 35 is a cross sectional view of a portion corresponding to line X2-X2 of FIG. 28 during the same step as FIG. 33. FIG. 36 shows a cross sectional view of one example of the substrate 1S in the peripheral circuit region of the flash memory during the same step as FIG. 33. Herein, into the region where the first electrode 4G and the conductor film 4 are not present on the principal surface portion of the substrate 1S (wafer), an impurity such as boron is introduced by a conventional ion implantation method or the like. At this step, as shown in FIG. 35, boron is also introduced into a part of the n⁻ type semiconductive region 7 of a connecting part between the first electrode 4G and the selecting transistor region. However, the amount of boron to be introduced is about one order smaller than the amount of the impurity to be introduced into the n⁻ type semiconductive region 7. For this reason, it is possible to ensure the continuity of the electric current path of the n⁻ type semiconductive region 7. This impurity introducing processing is used for causing a difference between the threshold voltage at the substrate 1S under the first electrode 4G and the threshold voltage at the substrate 1S under the floating gate electrode 6G. By this processing, the p type impurity concentration under the floating gate electrode 6G becomes higher than the p type impurity concentration of the first electrode 4G. Therefore, the threshold voltage at the substrate 1S under the first electrode 4G, with a relatively low p type impurity concentration, becomes lower than the threshold voltage at the substrate 1S under the floating gate electrode 6G. Incidentally, the boron introducing step need not be performed in some cases. A study conducted by the present inventors has proved that the flash memory normally operates either with or without the introduction of boron. Alternatively, it is also possible to carry out the boron introducing step after the formation of an insulating film 16 (sidewalls in the periphery) to be described later.

Figure 37:
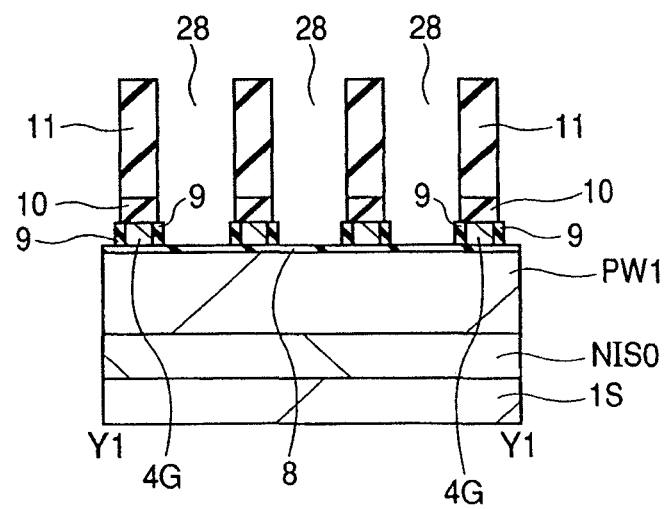
FIG. 37 is a cross sectional view of the portion corresponding to line Y1-Y1 of FIG. 28 in a step of manufacturing the semiconductor device subsequent to the manufacturing step of FIG. 33.
Figure 38:
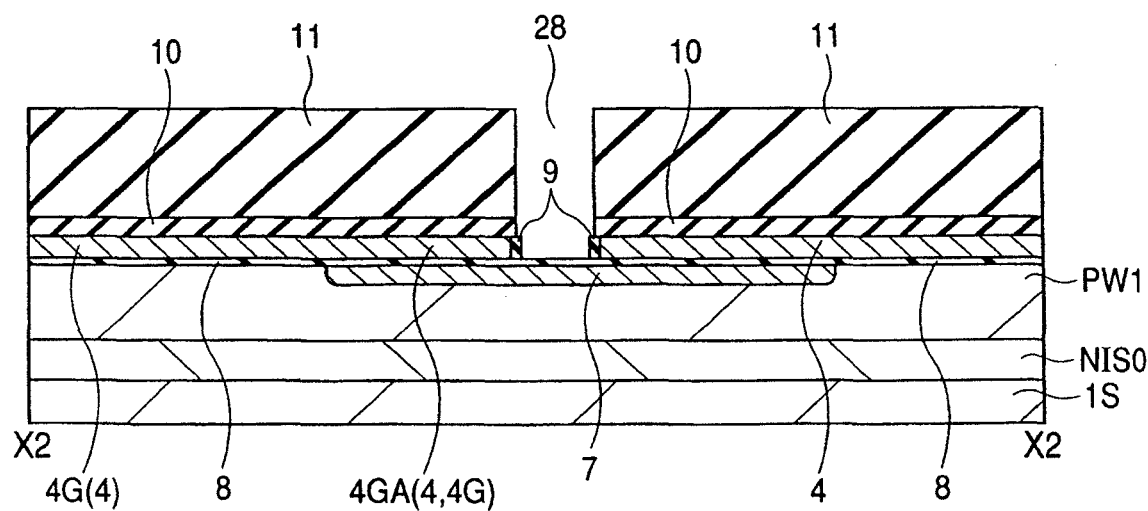
FIG. 38 is a cross sectional view of the portion corresponding to line X2-X2 of FIG. 28 in the same step as that of FIG. 37.

Subsequently, the substrate 1S is subjected to a thermal oxidation processing, such as an ISSG oxidation method. The states of the device in manufacturing steps subsequent to this step are shown FIGS. 37 and 38. FIG. 37 is a cross sectional view of a portion corresponding to line Y1-Y1 of FIG. 28 during a manufacturing step of the flash memory subsequent to the manufacturing step of FIG. 33 and the like. FIG. 38 shows a cross sectional view of a portion corresponding to line X2-X2 of FIG. 28 during the same step as FIG. 37. Herein, an insulating film (fourth insulating film) 9 made of, for example, silicon oxide is formed on the sides of the first electrodes 4G and the conductor film 4 by the thermal oxidation method. By forming the insulating film 9 with a thermal oxide film having a good film quality, it is possible to improve the withstand voltage between the first electrode 4G and the floating gate electrode 6G. The thickness (the dimension along the direction parallel with the principal surface of the substrate 1S) of the insulating film 9 is, for example, about 10 nm in terms of the silicon dioxide equivalent film thickness. Whereas, by the thermal oxidation processing, the dimension along the second direction Y of the first electrode 4G becomes, for example, about 65 nm.

Figure 39:
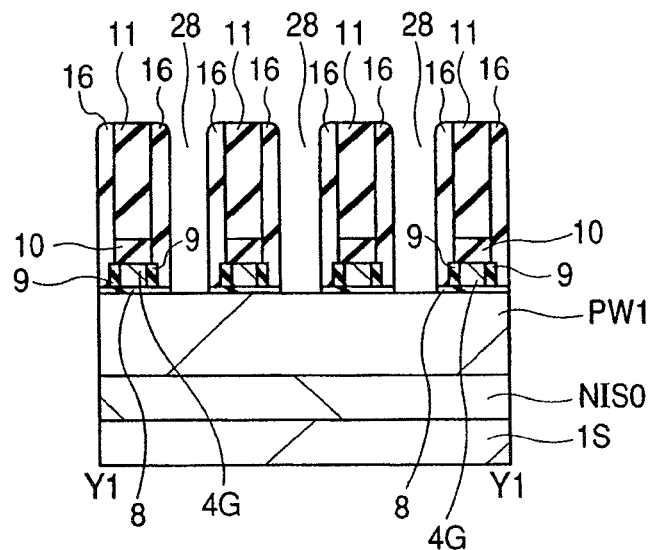
Figure 40:
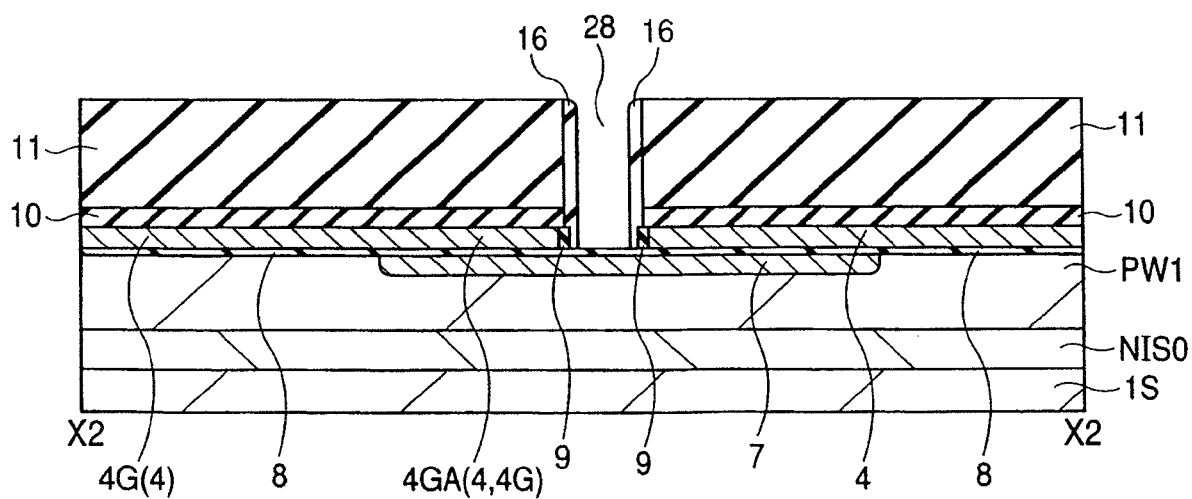
FIG. 40 is a cross sectional view of the portion corresponding to line X2-X2 of FIG. 28 in the same step as that of FIG. 39.

Subsequently, over the principal surface of the substrate 15, an insulating film made of, for example, silicon oxide is deposited by a CVD method using, for example, TEOS, and then, this is etched back. The state of the device after this step is shown in FIGS. 39 and 40. FIG. 39 shows a cross sectional view of a portion corresponding to line Y1-Y1 of FIG. 28 during the manufacturing step of the flash memory subsequent to the manufacturing step of FIG. 37. FIG. 40 shows a cross sectional view of a portion corresponding to line X2-X2 of FIG. 28 during the same step as FIG. 39. By the etch back processing of the insulating film, the sidewall of the insulating film (fourth insulating film) 16 is formed on the sides of the multilayered film of the first electrode 4G, the cap film 10, and the insulating film 11. Whereas, at this step, the portions of the insulating film 8 at the bottom of each trench 28 are removed to expose the corresponding portions of the principal surface of the substrate 1S. Further, by the formation of the sidewall of the insulating film 16, the dimension along the second direction Y (width) of the trench 28 becomes, for example, about 65 nm.

Herein, when the boron introducing steps shown in FIGS. 33 to 36 have not been carried out, it is possible to carry out the boron introducing steps after the formation of the insulating film 16 (sidewall in the periphery). Also in this case, similarly, by setting the p type impurity concentration of the substrate 1S under the first electrode 4G relatively lower than the p type impurity concentration under the floating gate electrode 6G, it is possible to set the threshold voltage of the first electrode 4G lower than the threshold voltage of the floating gate electrode 6G.

Figure 41:
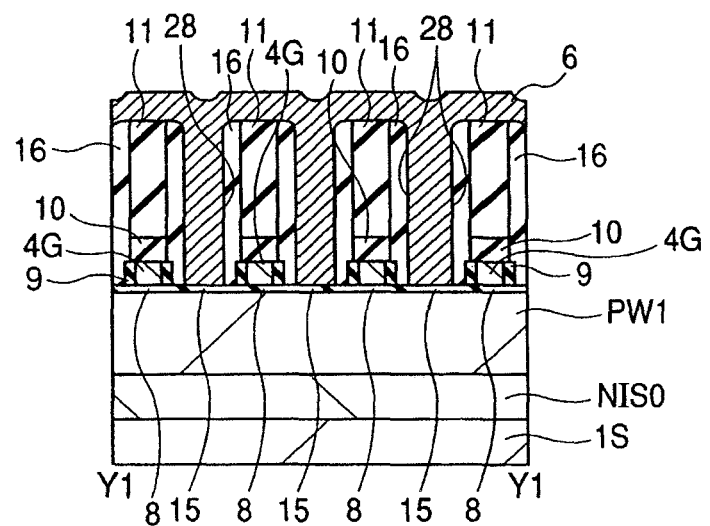
FIG. 41 is a cross sectional view of the portion corresponding to line Y1-Y1 of FIG. 28 in a step of manufacturing the semiconductor device subsequent to the manufacturing step of FIG. 39.
Figure 42:
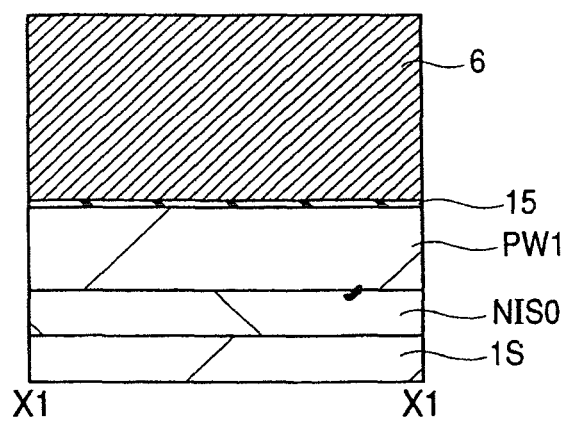
FIG. 42 is a cross sectional view of the portion corresponding to line X1-X1 of FIG. 28 in the same step as that of FIG. 41.
Figure 43:
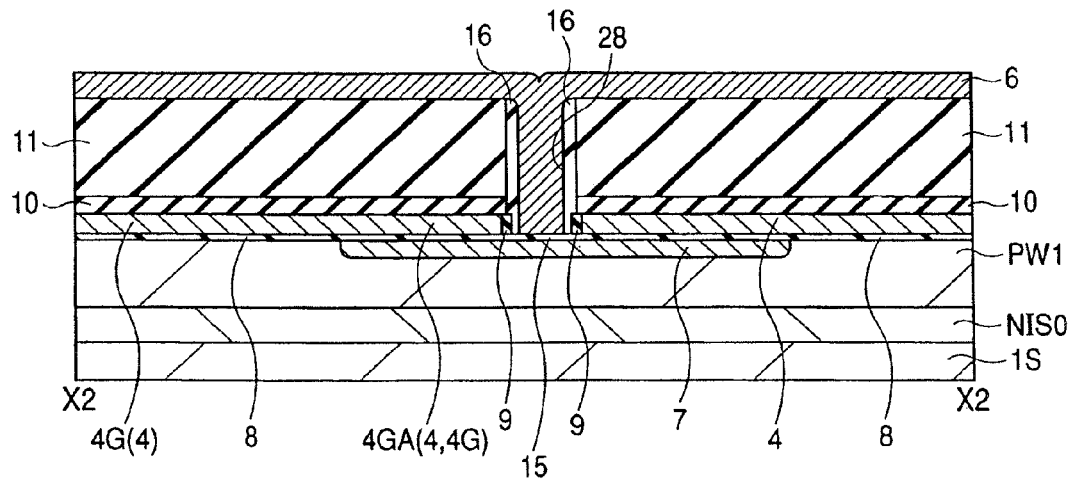
FIG. 43 is a cross sectional view of the portion corresponding to line X2-X2 of FIG. 28 in the same step as that of FIG. 41.
Figure 44:
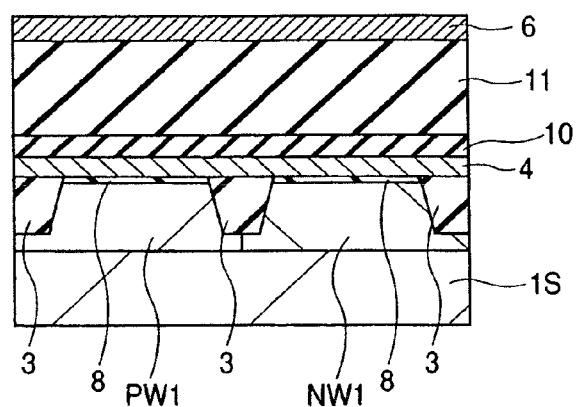
FIG. 44 is a cross sectional view showing one example of the semiconductor substrate in the peripheral circuit region of the semiconductor device in the same step as that of FIG. 33.

FIG. 41 is a cross sectional view of a portion corresponding to line Y1-Y1 of FIG. 28 during a manufacturing step of the flash memory subsequent to the manufacturing step in FIG. 39. FIG. 42 is a cross sectional view of a portion corresponding to line X1-X1 of FIG. 28 during the same step as FIG. 41. FIG. 43 is a cross sectional view of a portion corresponding to line X2-X2 of FIG. 28 during the same step as FIG. 41. FIG. 44 shows a cross sectional view of one example of the substrate 1S in the peripheral circuit region of the flash memory during the same step as FIG. 33. Herein, first, the substrate 1S (wafer) is subjected to a thermal oxidation processing such as an ISSG oxidation method. As a result, an insulating film made of, for example, silicon oxide, is formed over the portions of the principal surface of the substrate 1S at the bottoms of the trenches 28. Then, a thermal processing (oxynitriding) is carried out in a gas atmosphere containing nitrogen (N). As a result, nitrogen is segregated in the interface between the insulating film and the substrate 1S, thereby to form the insulating film (fifth insulating film) 15 made of silicon oxynitride (SiON). The insulating film 15 is a film functioning as a tunnel insulating film of the memory cells MC. The thickness is, for example, about 9 nm in terms of the silicon dioxide equivalent film thickness. Subsequently, a conductor film 6 made of, for example, a low resistive polysilicon is deposited over the principal surface of the substrate 1S by a CVD method or the like. At this step, the trenches 28 are fully filled with the conductor film 6, so that a "cavity" is prevented from being formed in each trench 28. In this embodiment 1, the side of each trench 28 is set as vertical as possible with respect to the principal surface of the substrate 1S. This enables the conductor film 6 to be satisfactorily buried so that "a cavity" is prevented from being formed in the trench 28.

Figure 45:
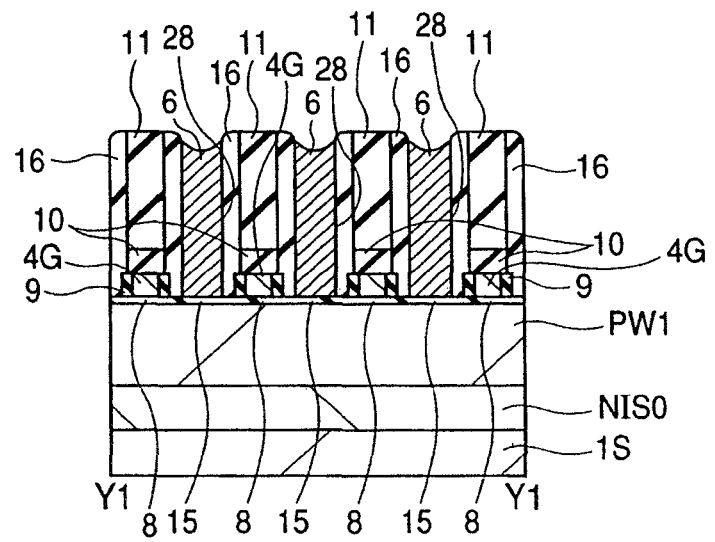
FIG. 45 is a cross sectional view of the portion corresponding to line Y1-Y1 of FIG. 28 in a step of manufacturing the semiconductor device subsequent to the manufacturing step of FIG. 41.
Figure 46:
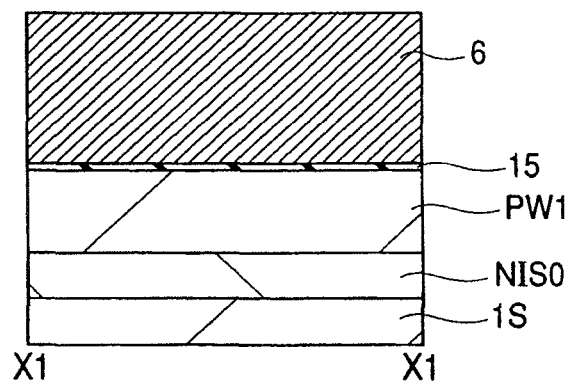
FIG. 46 is a cross sectional view of the portion corresponding to line X1-X1 of FIG. 28 in the same step as that of FIG. 45.
Figure 47:
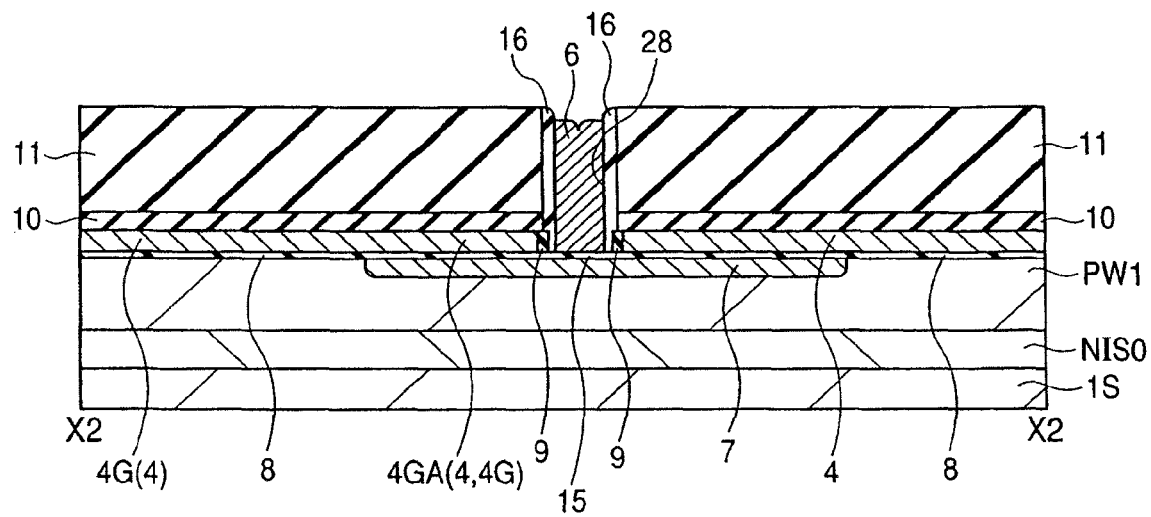
FIG. 47 is a cross sectional view showing the portion corresponding to line X2-X2 of FIG. 28 in the same step as that of FIG. 45.
Figure 48:
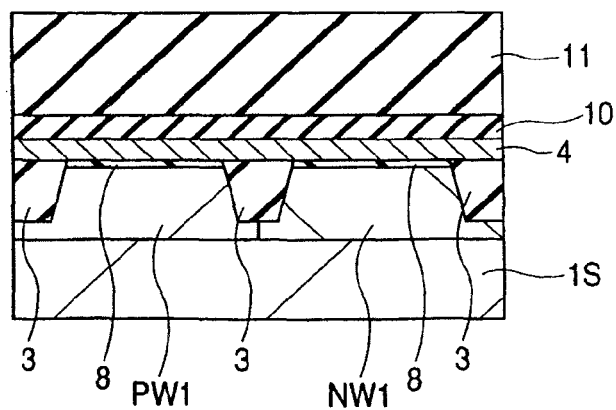
FIG. 48 is a cross sectional view showing one example of the semiconductor substrate in the peripheral circuit region of the semiconductor device in the same step as that of FIG. 45.

Subsequently, the conductor film 6 which is provided entirely over the principal surface of the substrate 1S is subjected to an etch back processing by an anisotropic dry etching processing, or a CMP (Chemical Mechanical Polishing) processing. The states of the device after the processing are shown in FIGS. 45 to 48. FIG. 45 is a cross sectional view of a portion corresponding to line Y1-Y1 of FIG. 28 during a manufacturing step of the flash memory subsequent to the manufacturing step of FIG. 41. FIG. 46 is a cross sectional view of a portion corresponding to line X1-X1 of FIG. 28 during the same step as FIG. 45. FIG. 47 is a cross sectional view of a portion corresponding to line X2-X2 of FIG. 28 during the same step as FIG. 45. FIG. 48 shows a cross sectional view of one example of the substrate 1S in the peripheral circuit region of the flash memory during the same step as FIG. 45. By the etch back processing or the CMP processing, the portions of the conductor film 6 are left only in the trenches 28 (each hollow region of FIGS. 27 and 28 as seen in a plan view). At this step, the depth of the pit from the top surface of the insulating film 11 to the top surface of the conductor film 6 is preferably set at, for example, about 30 nm or less.

Figure 49:
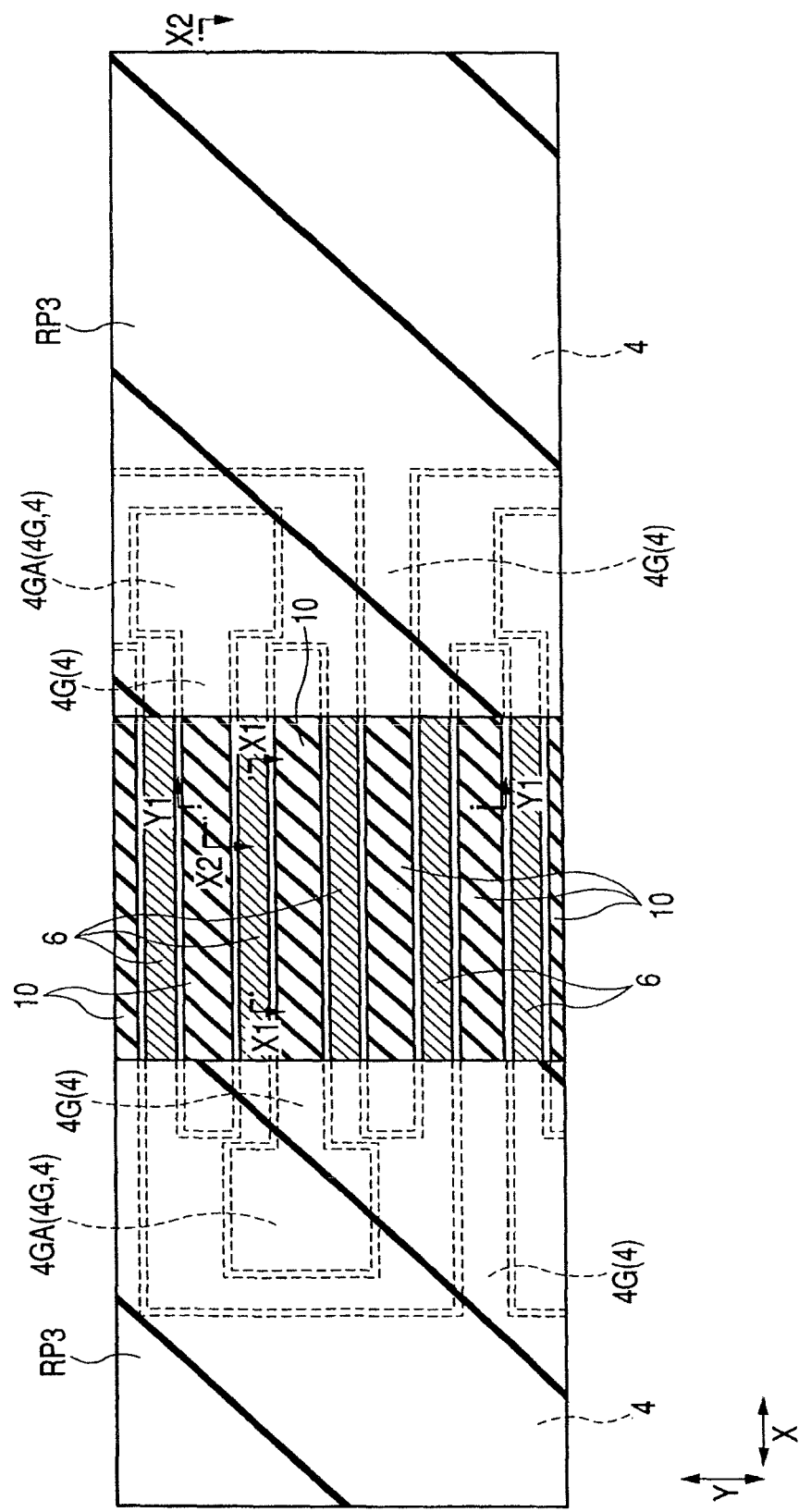
FIG. 49 is a plan view showing one example of the semiconductor substrate in a step of manufacturing the semiconductor device subsequent to the manufacturing step of FIG. 41.
Figure 50:
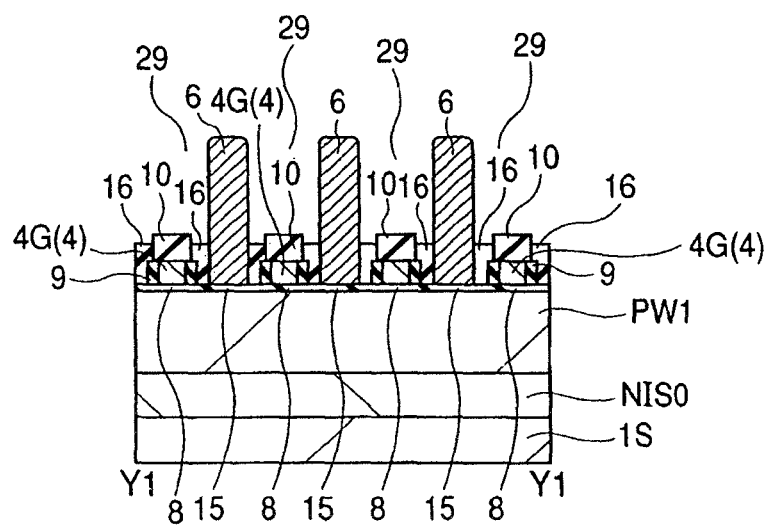
FIG. 50 is a cross sectional view taken along line Y1-Y1 of FIG. 49.
Figure 51:
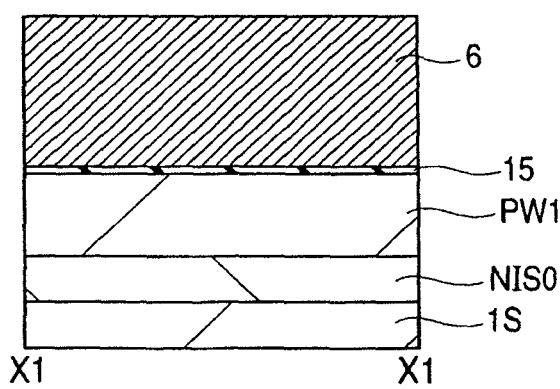
FIG. 51 is a cross sectional view taken along line X1-X1 of FIG. 49.
Figure 52:
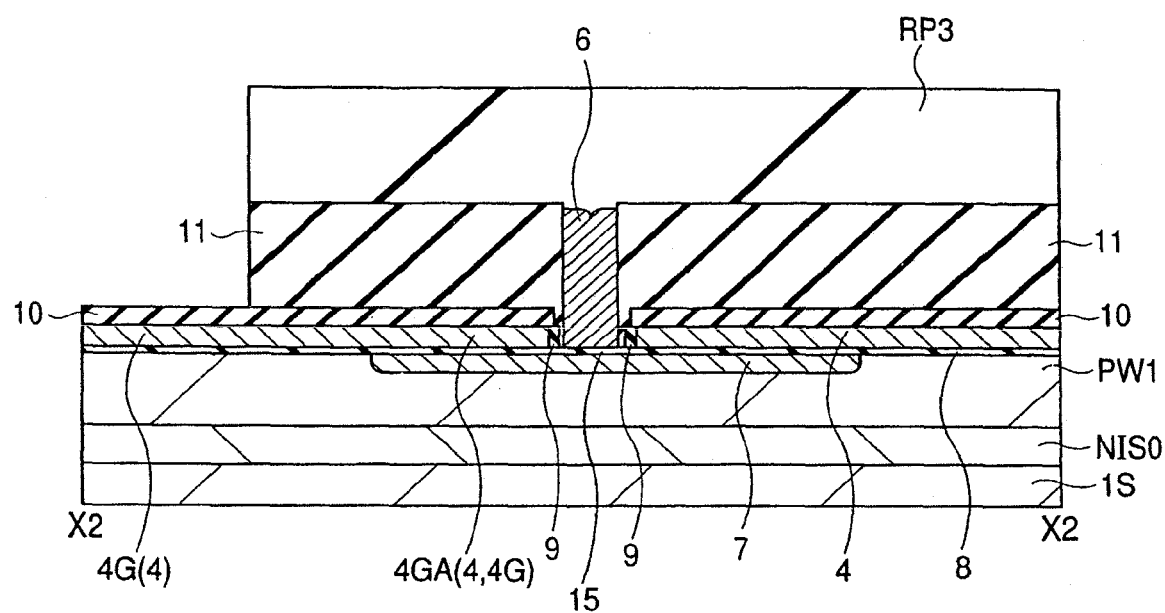
FIG. 52 is a cross sectional view showing one example of the semiconductor substrate in the peripheral circuit region of the semiconductor device in the same step as that of FIG. 49.

FIG. 49 is a plan view showing one example of the substrate 1S during a manufacturing step of the flash memory subsequent to the manufacturing step of FIG. 41. FIG. 50 is a cross sectional view taken along line Y1-Y1 of FIG. 49. FIG. 51 is a cross sectional view taken along line X1-X1 of FIG. 49. FIG. 52 is a cross sectional view showing one example of the substrate 1S in the peripheral circuit region of the flash memory during the same step as FIG. 49. Herein, first, over the principal surface of the substrate 1S (wafer), such a resist pattern RP3 as to expose a memory region (region where a memory cell MC group is arranged) and to cover the other regions is formed. Then, by using this resist pattern as an etching mask, the portions of the insulating films 11 and 16, exposed therefrom, are etched by a dry etching method or the like. At this step, the etch selectivity of silicon oxide to silicon and silicon nitride is increased so that silicon oxide becomes more likely to be removed than silicon and silicon nitride. This allows the cap film 10 made of silicon nitride to function as an etching stopper, and in addition, it allows the insulating films 11 and 16 made of silicon oxide to be selectively removed. At this step, when the etching residue of the insulating film 16 is to be formed at a part of the side of the conductor film 6, a wet etching processing may be performed, thereby to remove the etching residue of the insulating film 16 made of silicon oxide. Then, the resist pattern RP3 is removed. Thus, in this embodiment 1, the conductor film 6 for forming the floating gate electrodes is formed in self-alignment with the first electrodes 4G without using a photomask. For this reason, it is possible to set the alignment allowance between the conductor film 6 and the first electrodes 4G smaller than in the case where the conductor film 6 at this step is formed by a photolithography step using a photomask. Therefore, the memory cell MC can be reduced in size, and the chip size can be reduced. Further, it is possible to improve the alignment accuracy between the conductor film 6 and the first electrodes 4G. Accordingly, it is possible to improve the electrical characteristics of the memory cells MC. Still further, since the conductor film 6 is formed without using a photomask, it is possible to omit a manufacturing step for a sheet of a photomask. In addition, it is possible to omit a series of photolithography steps of coating, exposure, and development of a photoresist film. For this reason, as compared with the case where the conductor film 6 at this step is formed by a photolithography step using a photomask, it is possible to reduce the time required for manufacturing the flash memory, which can shorten the delivery time of the flash memory. In addition, it is possible to reduce the number of photomasks, which can reduce the cost of the flash memory. Trenches 29 are formed between the portions of the conductor film 6 adjacent to each other along the second direction Y of FIG. 49. In this embodiment 1, the side of the trench 28 is set as vertical as possible with respect to the principal surface of the substrate 1S. This also causes the side of the trench 29 to be roughly as vertical as possible with respect to the principal surface of the substrate 1S.

Figure 53:
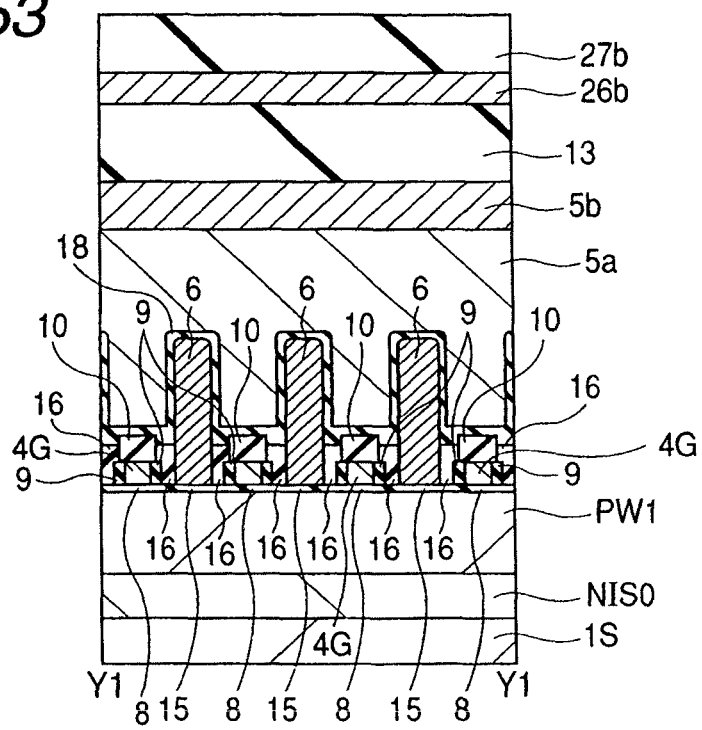
Figure 54:
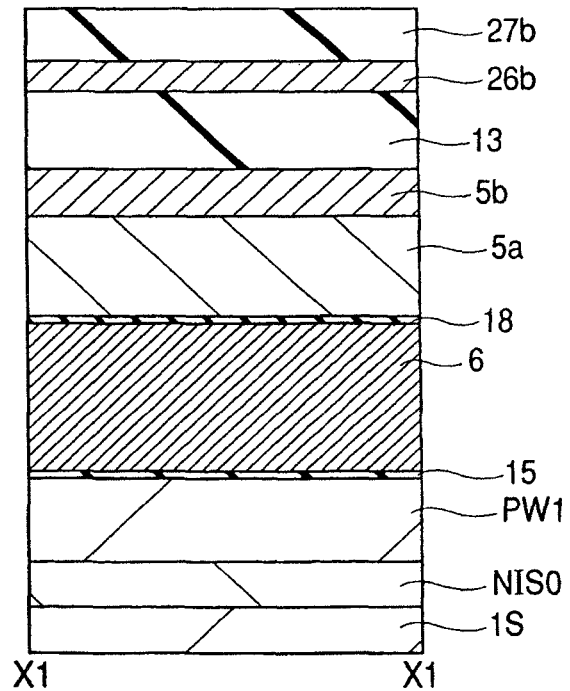
FIG. 54 is a cross sectional view of the portion corresponding to line X1-X1 of FIG. 49 in the same step as that of FIG. 53.
Figure 55:
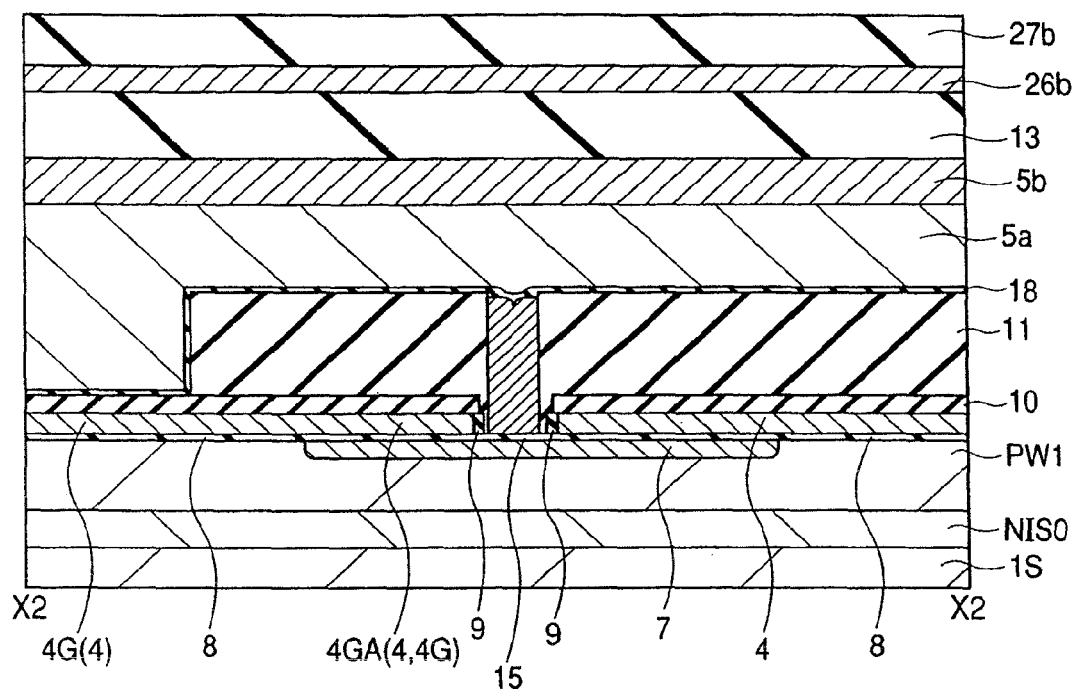
FIG. 55 is a cross sectional view of the portion corresponding to line X2-X2 of FIG. 49 in the same step as that of FIG. 53.
Figure 56:
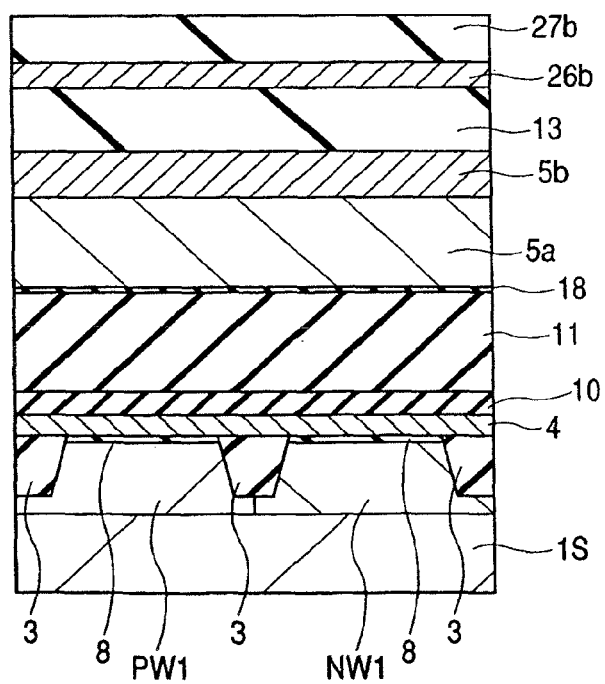
FIG. 56 is a cross sectional view showing one example of the semiconductor substrate in the peripheral circuit region of the semiconductor device in the same step as that of FIG. 53.

FIG. 53 is a cross sectional view of a portion corresponding to line Y1-Y1 of FIG. 49 during a manufacturing step of the flash memory subsequent to the manufacturing step of FIG. 49. FIG. 54 is a cross sectional view of a portion corresponding to line X1-X1 of FIG. 49 during the same step as FIG. 53. FIG. 55 is a cross sectional view of a portion corresponding to line X2-X2 of FIG. 49 during the same step as FIG. 53. FIG. 56 shows a cross sectional view one example of the substrate 1S in the peripheral circuit region of the flash memory during the same step as FIG. 53. Herein, first, over the principal surface of the substrate 1S (wafer), for example, an insulating film made of silicon oxide, an insulating film made of silicon nitride, and an insulating film made of silicon oxide are sequentially deposited from the bottom layer by a CVD method or the like. As a result, an insulating film for an interlayer film (sixth insulating film) 18 is formed. The top and bottom insulating films of the insulating film 18 which are made of silicon oxide also can be formed by a thermal oxidation method such as an ISSG oxidation method. In this case, it is possible to improve the film quality of the insulating film 18. Subsequently, over the insulating film 18 of the substrate 1S, a conductor film 5a made of, for example, a low resistive polysilicon, and a refractory metal silicide film 5b, such as a film of tungsten silicide serving as a conductor film 5b that is lower in resistance than the conductor film 5a, are sequentially deposited from the lower layer by a CVD method or the like. The conductor films 5a and 5b are patterned in the subsequent step to form a word line 5 of memory cells MC. In this embodiment 1, the side of each trench 29 is set as vertical as possible with respect to the principal surface of the substrate 1S. This enables the conductor film 5a to be satisfactorily buried so that "a cavity" is prevented from being formed between the adjacent portions of the conductor film 6. The thickness of the conductor film 5a is, for example, about 100 to 150 nm. The thickness of the refractory metal silicide film 5b is, for example, about 100 nm. Subsequently, over the refractory metal silicide film 5b, an insulating film 13 made of, for example, silicon oxide is deposited by a CVD method using a TEOS gas, or the like. Then, a hard mask film 26b made of, for example, a low resistive polysilicon is deposited thereon by a CVD method or the like. Further, an antireflection film 27b made of, for example, silicon oxynitride (SiON) is deposited thereon by a CVD method or the like.

Figure 57:
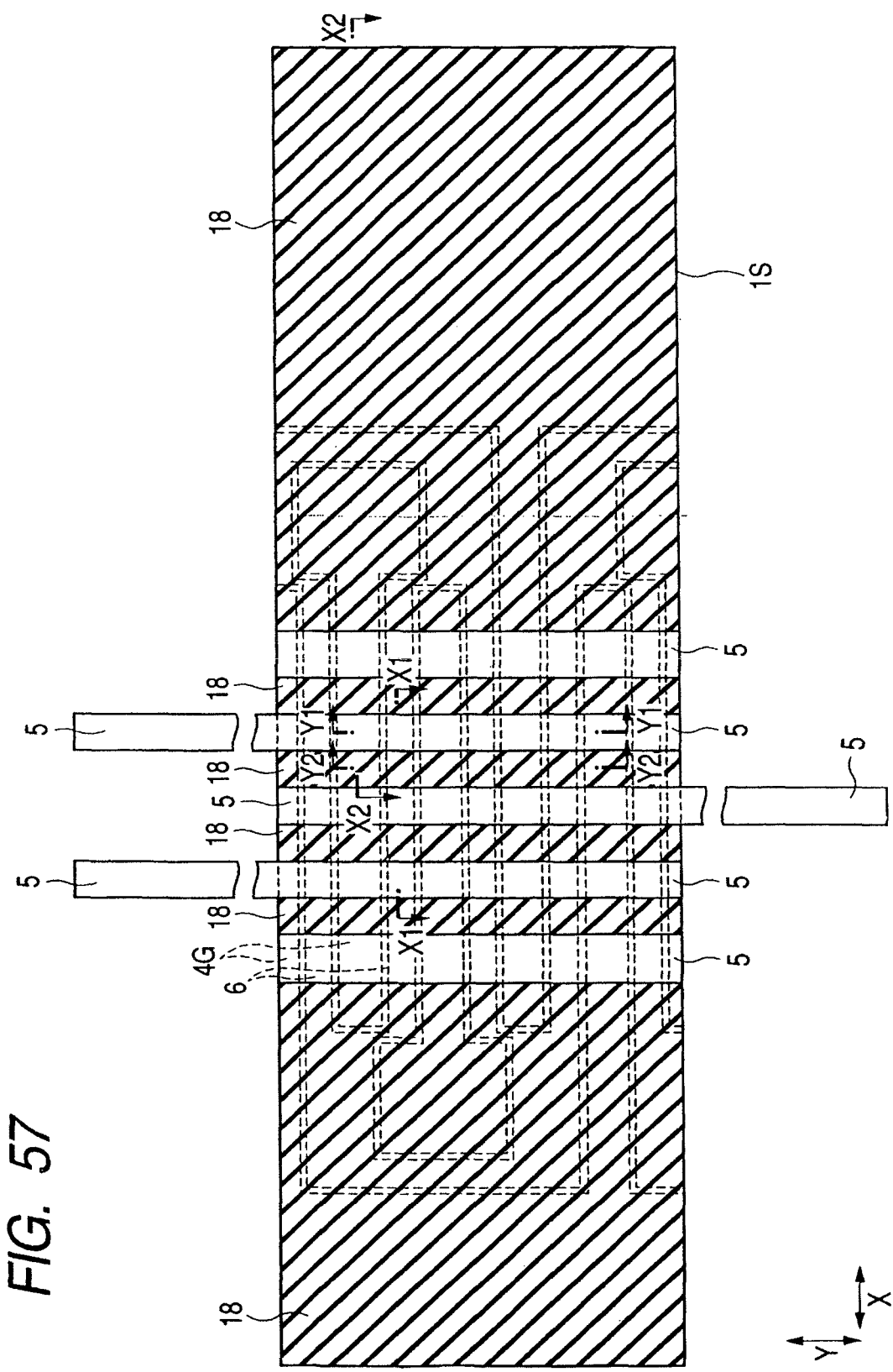
FIG. 57 is a plan view of the semiconductor device in a manufacturing step subsequent to the manufacturing step of FIG. 53.
Figure 58:
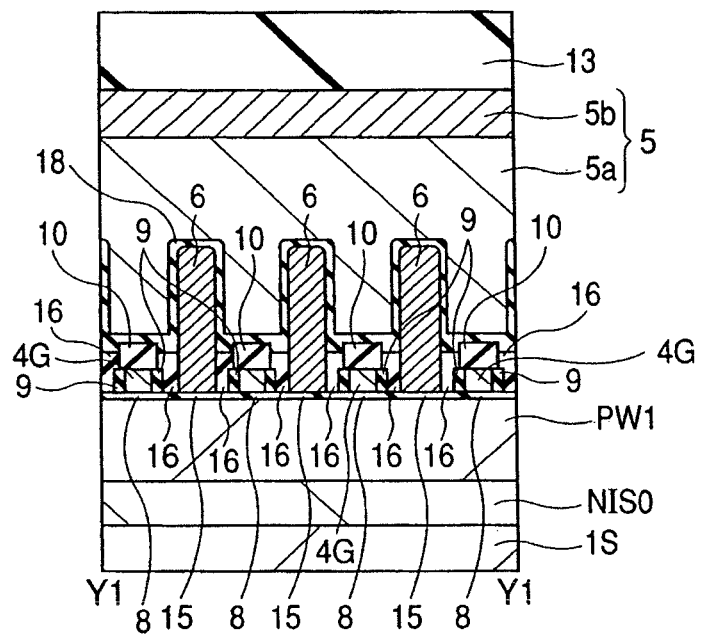
FIG. 58 is a cross sectional view taken along line Y1-Y1 of FIG. 57.
Figure 59:
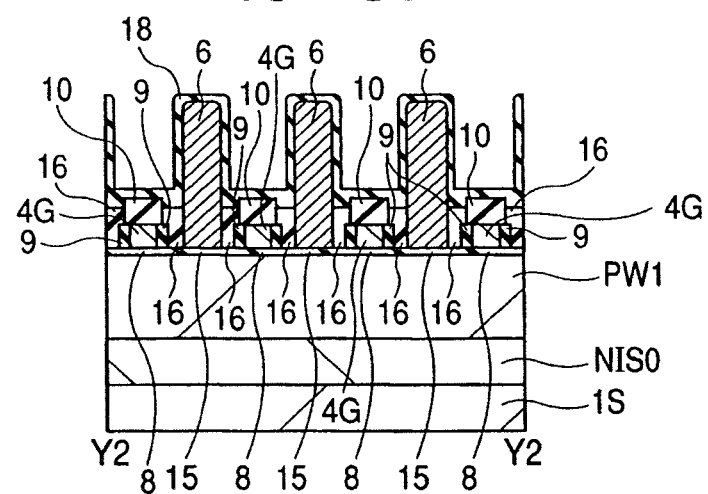
FIG. 59 is a cross sectional view taken along line Y2-Y2 of FIG. 57.
Figure 60:
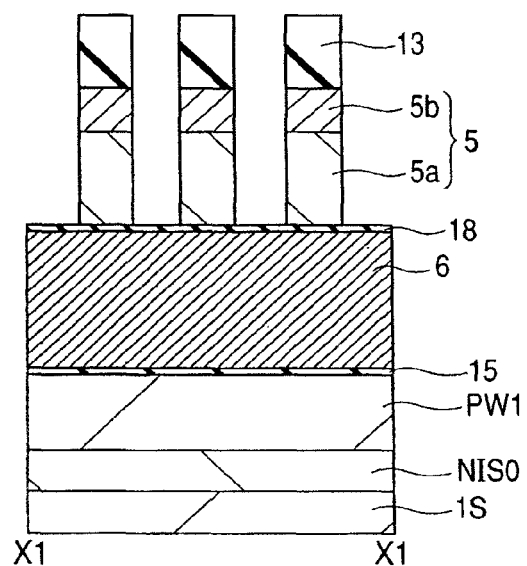
FIG. 60 is a cross sectional view taken along line X1-X1 of FIG. 57.
Figure 61:
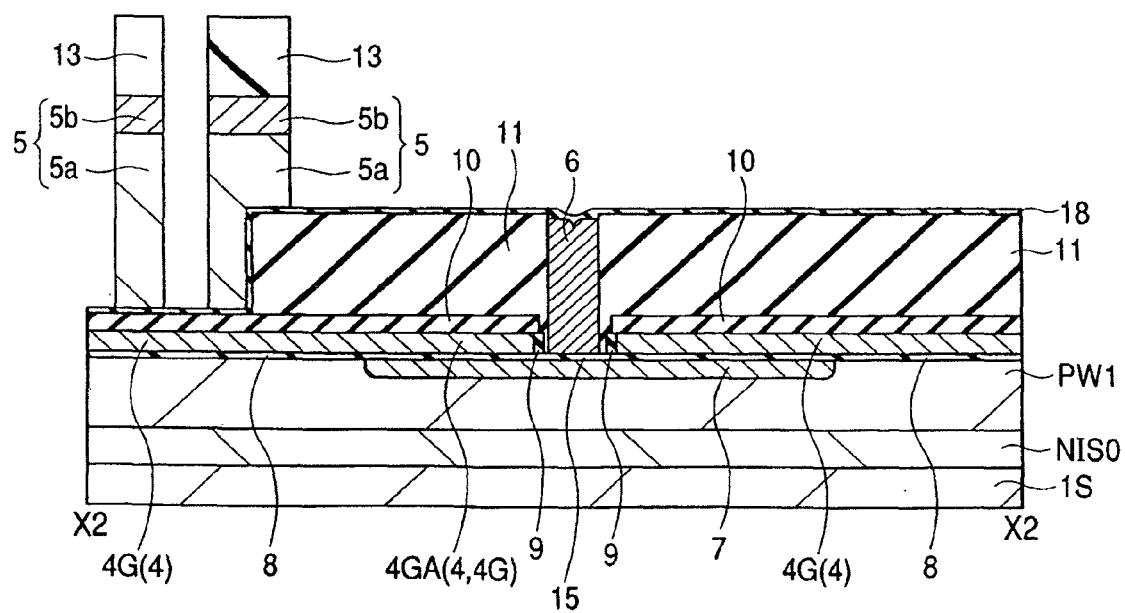
FIG. 61 is a cross sectional view taken along line X2-X2 of FIG. 57.

Then, over the antireflection film 27b, a resist pattern for forming a word line is formed. By using this resist pattern as an etching mask, the antireflection film 27b and the hard mask film 26b are patterned. Then, the resist pattern for forming a word line is removed. Subsequently, by the use of the multi-layered film of the left portions of the hard mask film 26b and the antireflection film 27b as an etching mask, the portions of the insulating film 13, the refractory metal silicide film 5b, and the conductor film 5a, exposed therefrom, are etched. The etching at this step is carried out in the same manner as used in the patterning step for the first electrodes. Whereas, for the etching, the interlayer insulating film 18 is allowed to function as an etching stopper. Further, for example, when the trench 29 is in the form of an inverted taper, which may cause an etching residue of the conductor film 5a to be left on the bottom side or the like of the trench 29, it is possible to remove the etching residue of the conductor film 5a by adding an isotropic etching processing, such as a wet etching method. The states of the device after such a step are shown in FIGS. 57 to 61. FIG. 57 is a plan view showing the flash memory during a manufacturing step subsequent to the manufacturing step of FIG. 53. FIG. 58 is a cross sectional view taken along line Y1-Y1 of FIG. 57. FIG. 59 is a cross sectional view taken along line Y2-Y2 of FIG. 57. FIG. 60 is a cross sectional view taken along line X1-X1 of FIG. 57. FIG. 61 is a cross sectional view taken along line X2-X2 of FIG. 57. Herein, a plurality of word lines 5, each in the form of a band, as seen in plan view, and extending in the second direction Y of FIG. 57, are formed by the etching processing.

Figure 62:
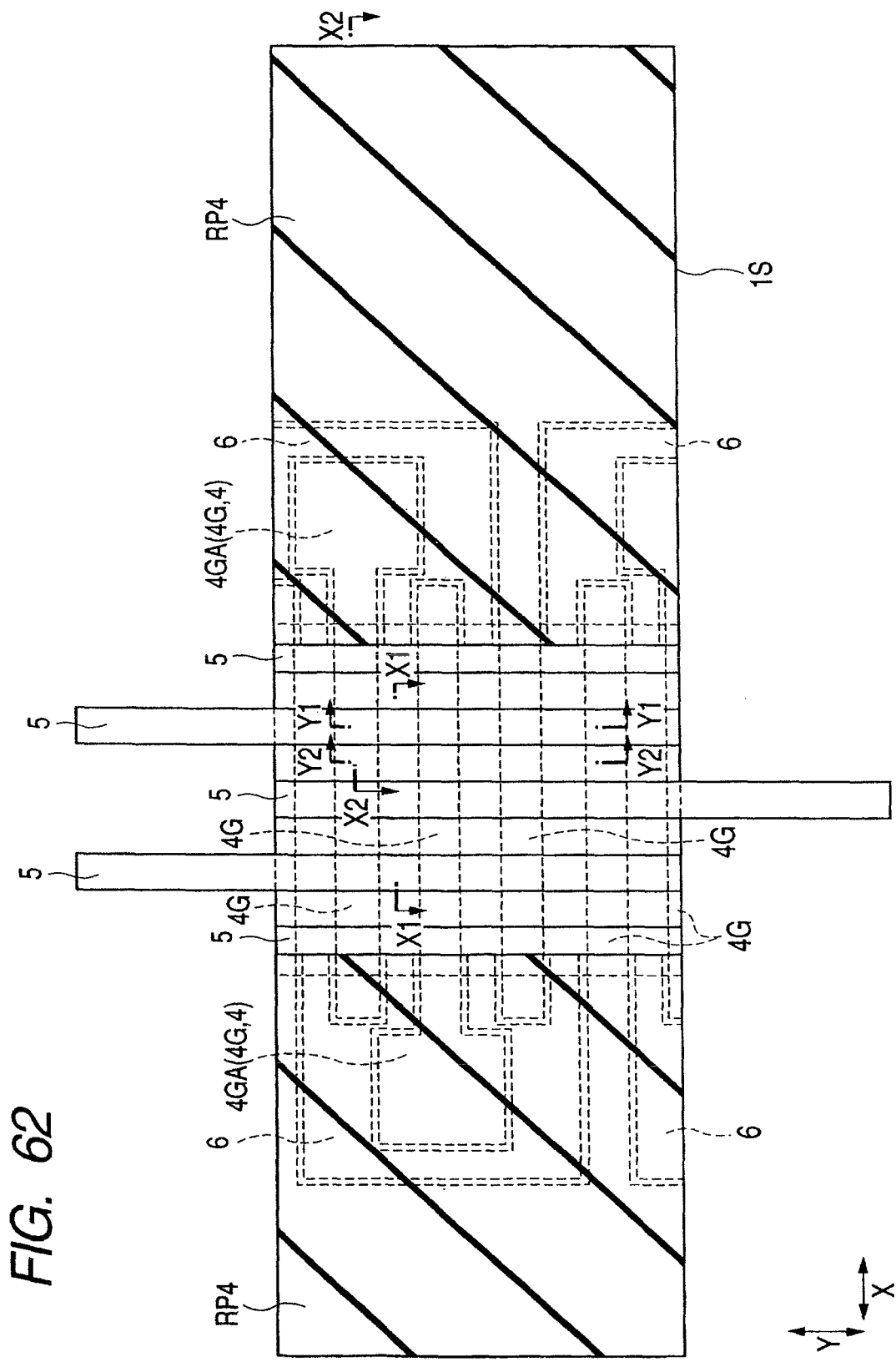
FIG. 62 is a plan view of the semiconductor device in a manufacturing step subsequent to the manufacturing step of FIG. 57.
Figure 63:
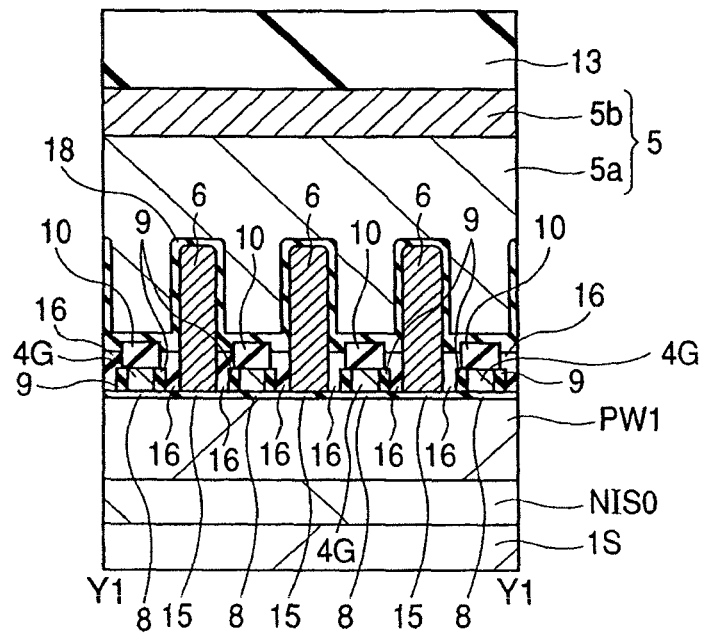
FIG. 63 is a cross sectional view taken along line Y1-Y1 of FIG. 62.
Figure 64:
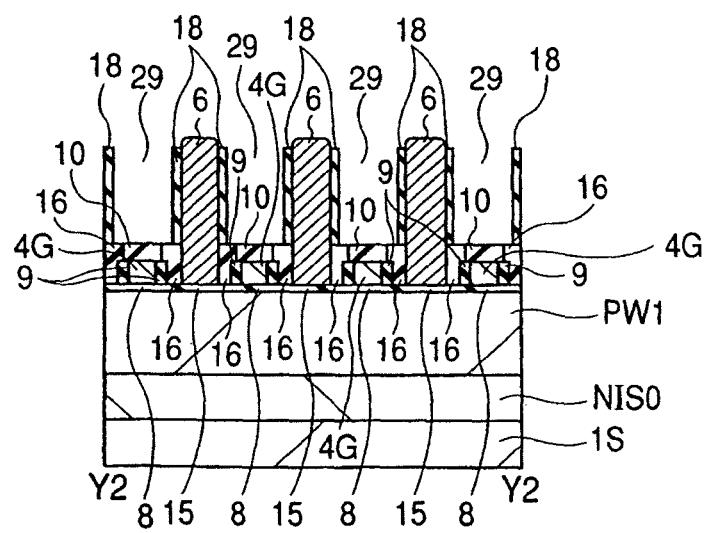
FIG. 64 is a cross sectional view taken along line Y2-Y2 of FIG. 62.
Figure 65:
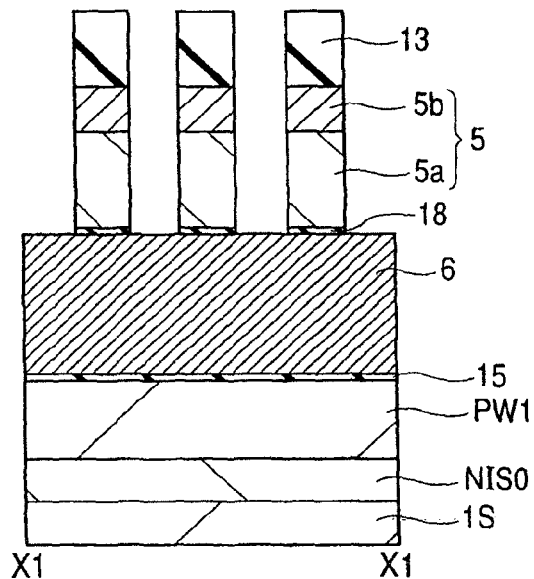
FIG. 65 is a cross sectional view taken along line X1-X1 of FIG. 62.
Figure 66:
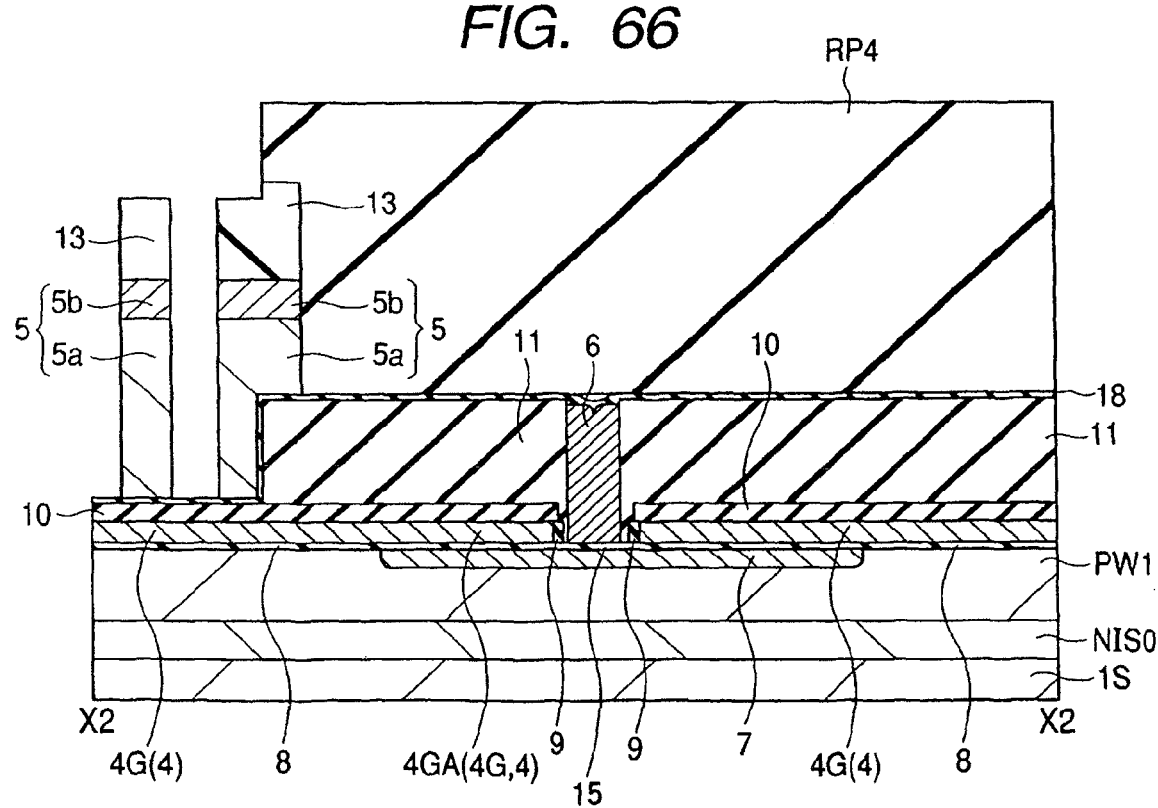
FIG. 66 is a cross sectional view taken along line X2-X2 of FIG. 62.
Figure 67:
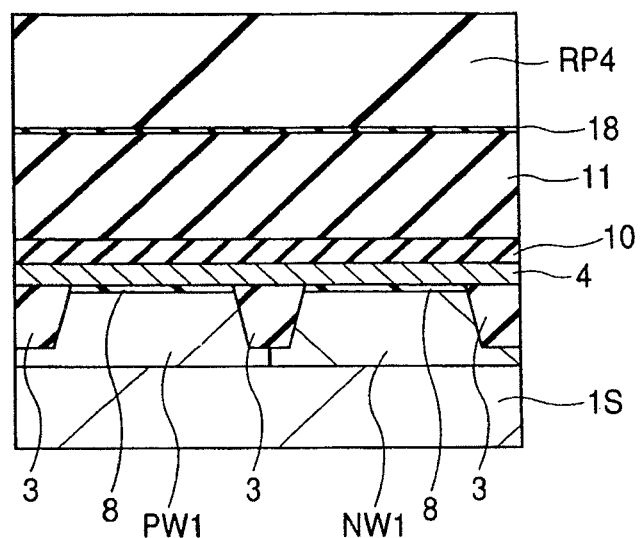
FIG. 67 is a cross sectional view of one example of the semiconductor substrate in the peripheral circuit region of the semiconductor device in the same step as that of FIG. 62.

FIG. 62 is a plan view showing the flash memory during a manufacturing step subsequent to the manufacturing step of FIG. 57. FIG. 63 is a cross sectional view taken along line Y1-Y1 of FIG. 62. FIG. 64 is a cross sectional view taken along line Y2-Y2 of FIG. 62. FIG. 65 is a cross sectional view taken along line X1-X1 of FIG. 62. FIG. 66 is a cross sectional view taken along line X2-X2 of FIG. 62. FIG. 67 is a cross sectional view showing one example of the substrate 1S in the peripheral circuit region of the flash memory during the same step as FIG. 62. Herein, first, over the principal surface of the substrate 1S (wafer), such a resist pattern RP4 as to expose a memory region and to cover the other regions is formed. Then, by using the resist pattern as an etching mask, the portions of the insulating film 18 on the bottom of each trench 29 and the top of the conductor film 6 are etched. At this step, as shown in FIG. 64, the insulating film 18 on the side of the conductor film 6 may be lifted off by a washing processing or the like after the removal processing of the conductor film 6, resulting in the formation of foreign matter. Such being the situation, in this embodiment 1, an overetching processing is carried out to some degree at the time of the etching processing of the insulating film 18, thereby to remove the top portion of the insulating film 18 on the side of the conductor film 6. This causes the left insulating film 18 to be reduced in height, and makes it resistant to being lifted off.

Figure 68:
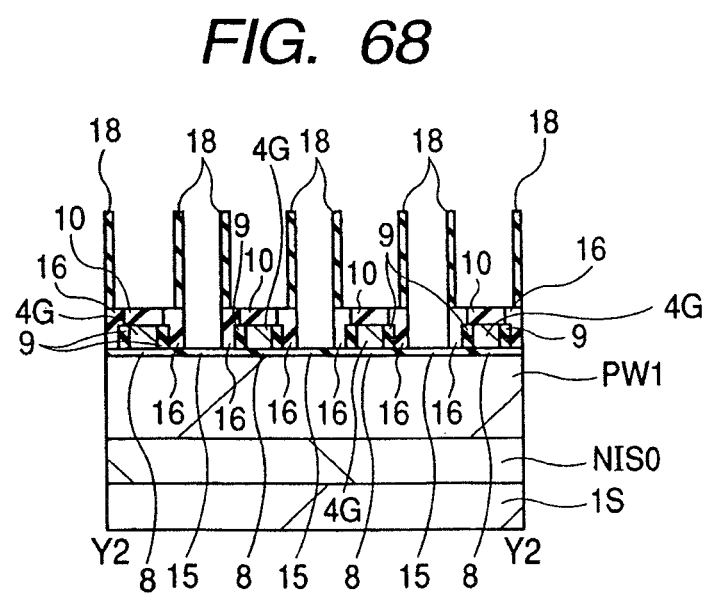
FIG. 68 is a cross sectional view of the portion corresponding to line Y2-Y2 of FIG. 62 in a manufacturing step of the semiconductor device subsequent to the manufacturing step of FIG. 62.
Figure 69:
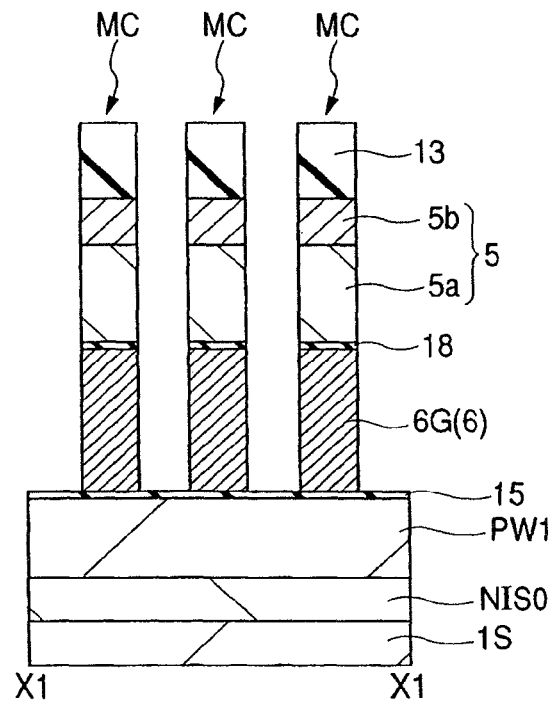
FIG. 69 is a cross sectional view of the portion corresponding to line X1-X1 of FIG. 62.

Subsequently, as shown in FIGS. 68 and 69, by the use of the word lines 5 that have been formed in the foregoing manner as an etching mask, the portions of the conductor film 6 exposed therefrom are etched. FIG. 68 is a cross sectional view of a portion corresponding to line Y2-Y2 of FIG. 62 during the manufacturing step of the flash memory subsequent to the manufacturing step of FIG. 62. FIG. 69 is a cross sectional view of a portion corresponding to line X1-X1 of FIG. 62. Herein, by the etching processing of the conductor film 6 using the word lines 5 as an etching mask, floating gate electrodes 6G are formed in self-alignment with the word lines 5. Namely, the floating gate electrodes 6G are formed in self-alignment with both the first electrodes 4G and the word lines 5. Then, memory cells MC are formed in this manner. When floating gate electrodes each in a concave form as seen in cross section are formed in trenches, the conductor film for the floating gate electrodes must be reduced in thickness with the reduction in size of memory cells MC. Therefore, the processing of the floating gate electrodes is difficult. In contrast, in this embodiment 1, each floating gate electrode 6G is in a convex form as seen in cross section. As a result, it is possible to carry out the processing of the floating gate electrode 6G with ease even when the memory cell MC has been reduced in size. Whereas, the floating gate electrodes 6G are formed in self-alignment with both the first electrodes 4G and the word lines 5 without using a photomask. For this reason, it is possible to set the alignment allowance between the floating gate electrodes 6G and the first electrodes 4G and the word lines 5 smaller than in the case where the floating gate electrodes 6G are formed by a photolithography step using a photomask. Therefore, the memory cell MC can be reduced in size, and the chip size can be reduced. Further, it is possible to improve the alignment accuracy between the floating gate electrodes 6G and the first electrodes 4G and the word lines 5. Accordingly, it is possible to improve the electrical characteristics of the memory cells MC. Still further, since the floating gate electrodes 6G are formed without using a photomask, it is possible to omit a manufacturing step of a sheet of a photomask (or two sheets of photomasks in a total number including the aforesaid one). In addition, it is possible to omit a series of photolithography steps of coating, exposure, and development of a photoresist film. For this reason, as compared with the case where the floating gate electrodes 6G are formed by a photolithography step using a photomask, it is possible to reduce the time required for manufacturing the flash memory, which can shorten the delivery time of the flash memory. In addition, it is possible to reduce the number of photomasks, which can reduce the cost of the flash memory.

Figure 70:
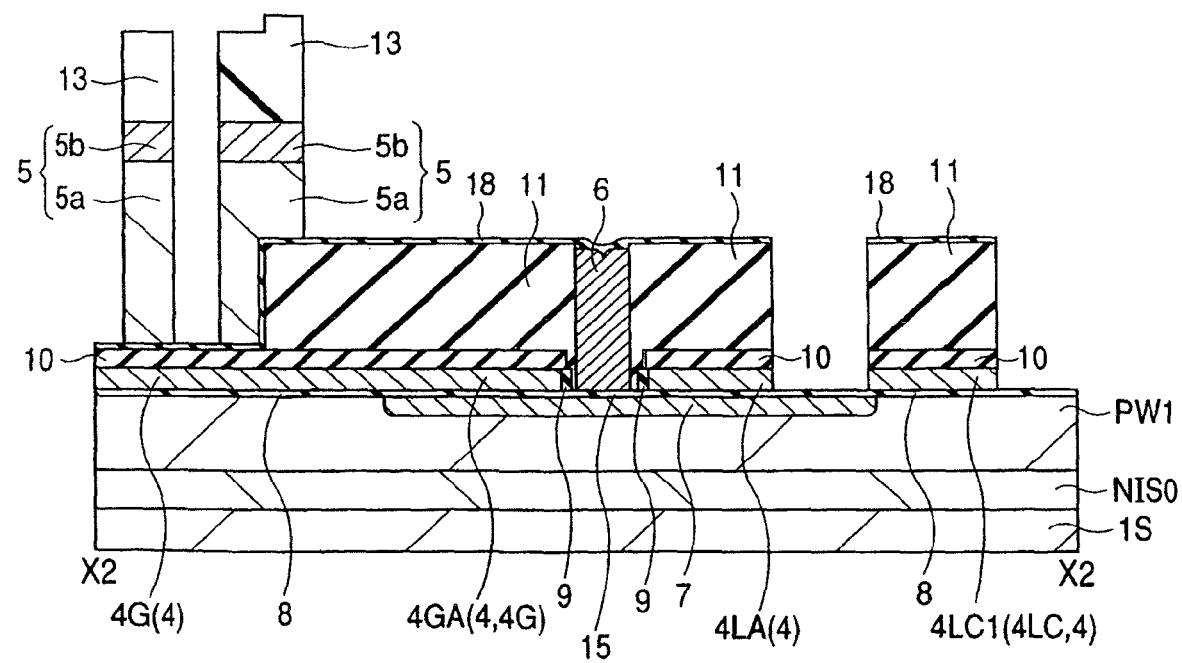
FIG. 70 is a cross sectional view of the portion corresponding to line X2-X2 of FIG. 62 in a step of manufacturing the semiconductor device subsequent to the manufacturing step of FIG. 68.
Figure 71:
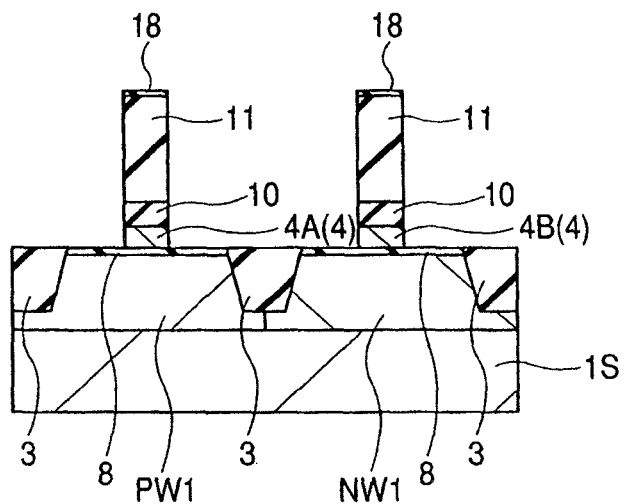
FIG. 71 is a cross sectional view one example of the semiconductor substrate in the peripheral circuit region of the semiconductor device in the same step as that of FIG. 70.

Thereafter, by a photolithography technique and a dry etching technique, the conductor film 4 for forming the first electrodes left in the periphery of the memory region and in the peripheral circuit region is patterned. As a result, as shown in FIGS. 70 and 71, wires 4LA and 4LC (4LC1), the gate electrodes 4A and 4B of the MIS in the peripheral circuit, and the like are formed in the outer periphery of the memory region and the peripheral circuit region. FIG. 70 shows a cross sectional view of a portion corresponding to line X2-X2 of FIG. 62 during a manufacturing step of the flash memory subsequent to the manufacturing step of FIG. 68. FIG. 71 shows a cross sectional view of one example of the substrate 1S in the peripheral circuit region of the flash memory during the same step as FIG. 70.

Figure 72:
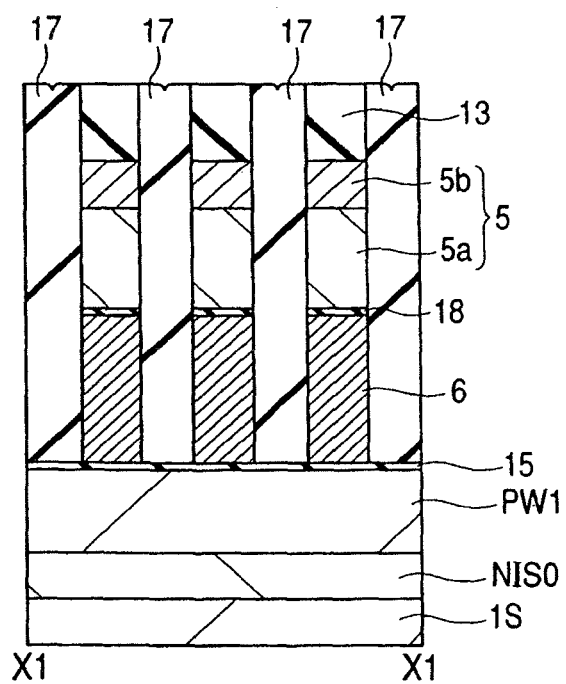
FIG. 72 is a cross sectional view of the portion corresponding to line X1-X1 of FIG. 62 in a step of manufacturing the semiconductor device subsequent to the manufacturing step of FIG. 70.
Figure 73:
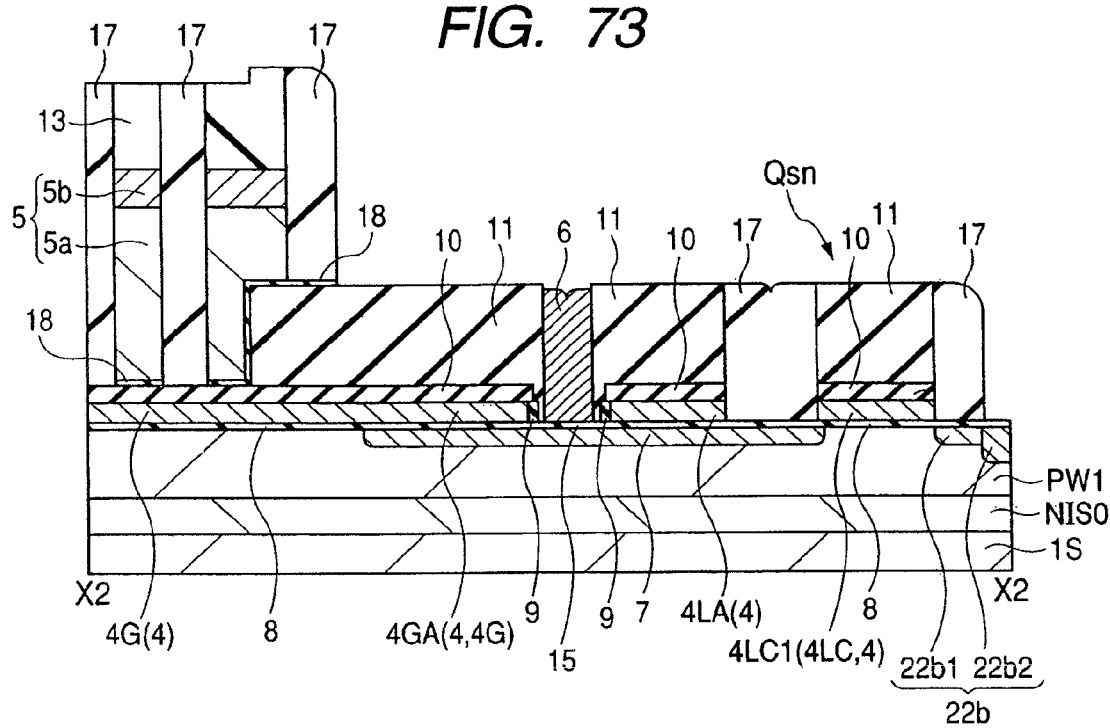
FIG. 73 is a cross sectional view of the portion corresponding to line X2-X2 of FIG. 62 in the same step as that of FIG. 72.
Figure 74:
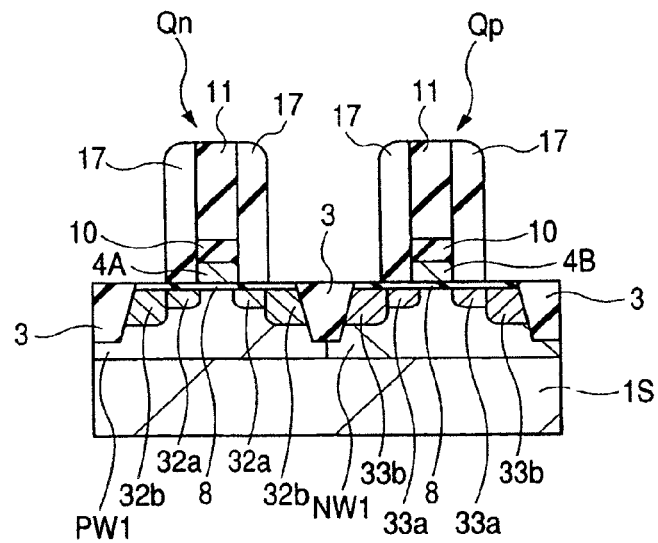
FIG. 74 is a cross sectional view showing one example of the semiconductor substrate in the peripheral circuit region of the semiconductor device in the same step as that of FIG. 72.

As shown in FIGS. 72 to 74, an n⁻ type semiconductive region 22b1 for the source and the drain of a selecting nMIS Qsn, an n⁻ type semiconductive region 32a for the source and the drain of an nMIS Qn for the peripheral circuit, and a p⁻ type semiconductive region 33a for the source and the drain of a pMIS are respectively formed by separate steps. Subsequently, over the principal surface of the substrate 1S (wafer), an insulating film made of silicon oxide or the like is deposited by a CVD method using, for example, a TEOS gas, or the like. Then, the insulating film is etched back by an anisotropic dry etching method. As a result, the insulating film 17 is buried in the gap between the word lines 5 that are adjacent to each other, and between the first electrode 4G and the wire 4LA (4LB). In addition, sidewalls of the insulating film 17 are formed on the one side surface of the outermost peripheral word line 5, the one side surface of the wire 4LC, and the sides of the gate electrodes 4A and 4B. Subsequently, an n⁺ type semiconductive region 22b2 of the selecting nMIS Qsn, an n⁺ type semiconductive region 32b for the source and the drain of the nMIS Qn for a peripheral circuit, and a p⁺ type semiconductive region 33b for the source and the drain of the pMIS are respectively formed by separate steps. FIG. 72 shows a cross sectional view of a portion corresponding to line X1-X1 of FIG. 62 during a manufacturing step of the flash memory subsequent to the manufacturing step of FIG. 70. FIG. 73 shows a cross sectional view of a portion corresponding to line X2-X2 of FIG. 62 during the same step as FIG. 72. FIG. 74 shows a cross sectional view of one example of the substrate 1S in the peripheral circuit region of the flash memory during the same step as FIG. 72. Thereafter, the flash memory shown in FIGS. 1 to 4 is manufactured through conventional wire forming steps.

Figure 75:
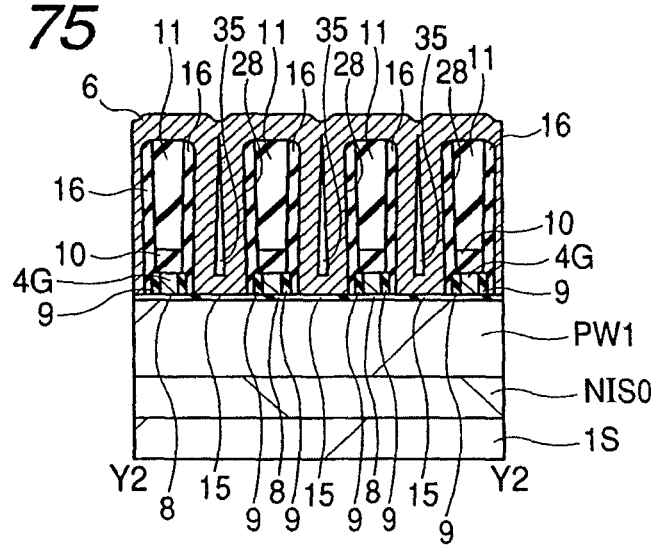
FIG. 75 is a cross sectional view showing the semiconductor device in a manufacturing step for illustrating a problem which has occurred in the manufacturing step of the semiconductor device of the present invention.
Figure 76:
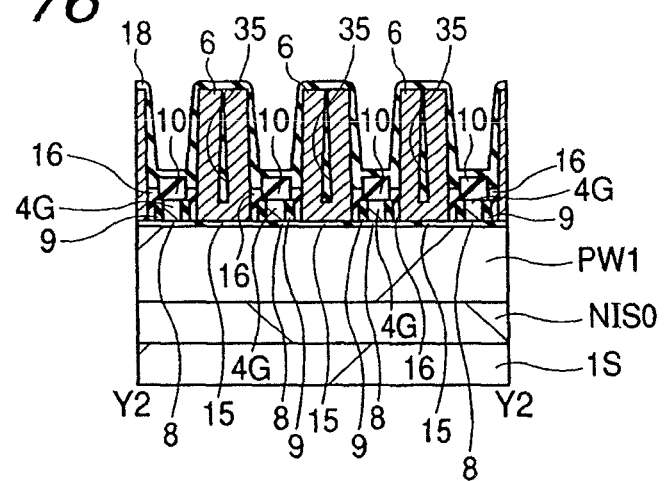
FIG. 76 is a cross sectional view showing the semiconductor device in a manufacturing step subsequent to the step of FIG. 75.
Figure 77:
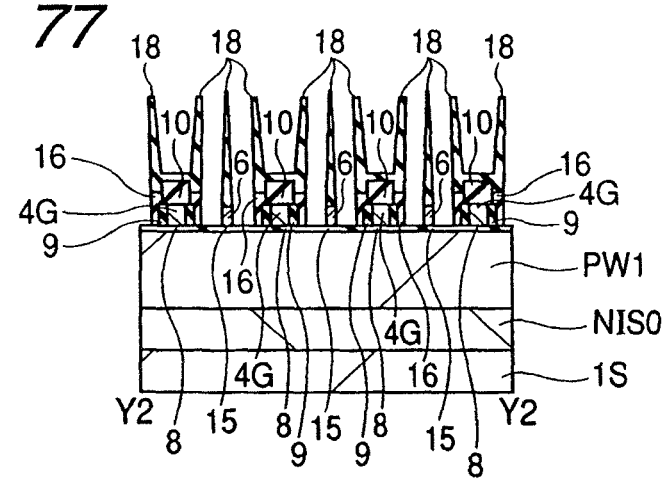
FIG. 77 is a cross sectional view showing the semiconductor device in a manufacturing step subsequent to the step of FIG. 76.
Figure 78:
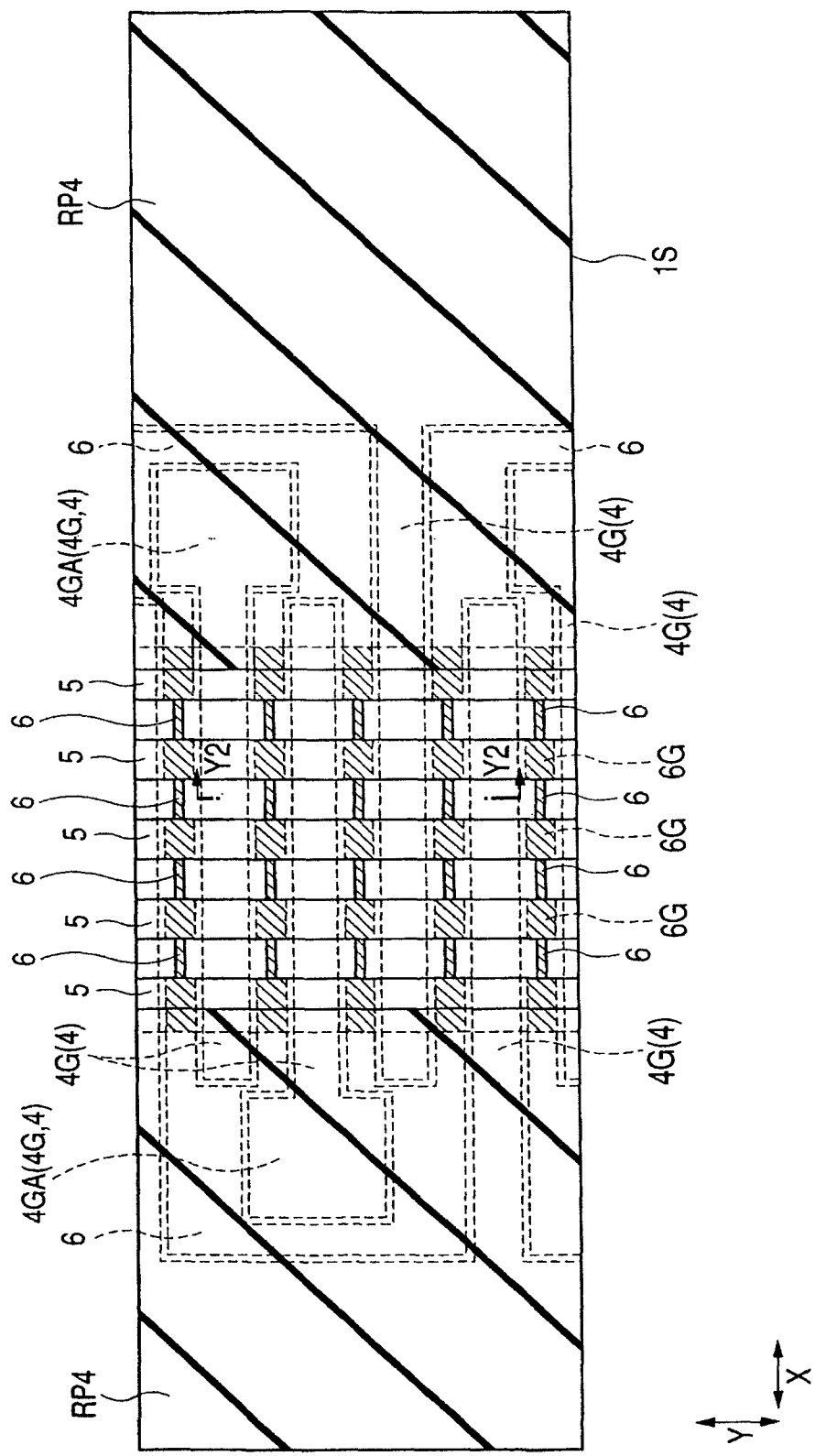
FIG. 78 is a plan view showing the semiconductor device of FIG. 77 in a manufacturing step.
Figure 79:
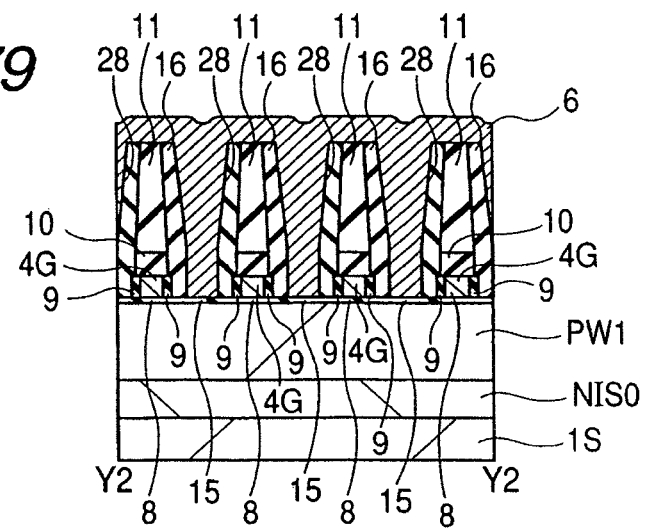
FIG. 79 is a cross sectional view showing the semiconductor device in a manufacturing step for illustrating a problem which has occurred in the manufacturing step of the semiconductor device of the present invention.
Figure 80:
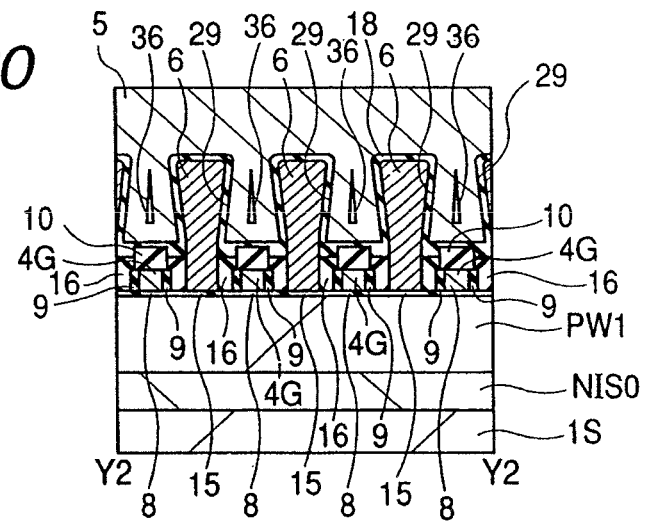
FIG. 80 is a cross sectional view of the semiconductor device in a manufacturing step subsequent to the step of FIG. 79.
Figure 81:
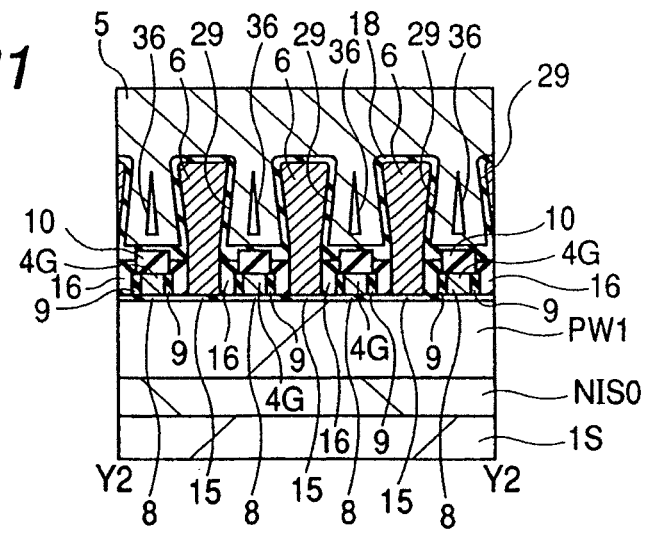
FIG. 81 is a cross sectional view of the semiconductor device in a manufacturing step subsequent to the step of FIG. 80.

The reason why the side of the trench 28 has been set as vertical as possible with respect to the principal surface of the substrate 1S will be described. First, as shown in FIG. 75, in the case where an inverted taper (the shape in which the aperture diameter of the trench 28 gradually decreases from the bottom toward the top of the trench 28) is formed at the side of the trench 28, a cavity 35 is formed in the conductor film 6 in the trench 28 upon depositing the conductor film 6. When the insulating film 18 is formed as shown in FIG. 76 while still in this state, the insulating film 18 is buried in the cavity 35. With this being the situation, the unnecessary conductor film 6 is removed in the subsequent step. As a result, as shown in FIGS. 77 and 78, the insulating film 18 in the cavity 35 serves as a mask, so that the etching residue of the conductor film 6 resulting from the insulating film 18 in the cavity 35 is generated between the word lines 5. As a result, an electrical connection is established between the adjacent floating gate electrodes 6G by the etching residue of the conductor film 6. Incidentally, FIGS. 75 to 77 show cross sectional views during respective manufacturing steps of a portion corresponding to line Y2-Y2 of FIG. 78. On the other hand, as shown in FIG. 79, when a forward taper (the shape in which the aperture diameter of the trench 28 gradually increases from the bottom toward the top of the trench 28) is formed at the side of the trench 28, it is possible to satisfactorily bury the conductor film 6 without the formation of a "cavity" in the trench 28. However, as shown in FIG. 80, the trench 29 between the adjacent portions of the conductor film 6 is shaped in an inverted taper. This results in the formation of a cavity 36 in the conductor film 5 in the trench 29 during the subsequent deposition step of the conductor film 5a for a word line. When the word line 5 is processed with the cavity 36 still in this state, the cavity 36 expands, as shown in FIG. 81. For this reason, it becomes difficult to process the word line 5. Further, the resistance of the word line 5 increases due to the cavity 36. All of these problems become noticeable with increased reduction in the size of a memory cell MC, and, hence, this causes an inhibition of the advancement of a desired reduction in the size of the memory cells MC. Such being the situation, in this embodiment 1, the side of the trench 28 is formed as vertically as possible with respect to the principal surface of the substrate 1S. As a result, it is possible to form memory cells MC without leaving the etching residue of the conductor film 6 resulting from the cavity 35, and without causing problems in the processing of the word line 5 due to the cavity 36. Therefore, it is possible to improve the reliability and the yield of the flash memory. Further, it is possible to promote the desired reduction in the size of the flash memory.

Embodiment 2

In this embodiment 2, a description will be given of the case where the plurality of first electrodes to which the same electric potential is supplied are disposed independently as with the other first electrodes, and are electrically connected through a different layer.

Figure 82:
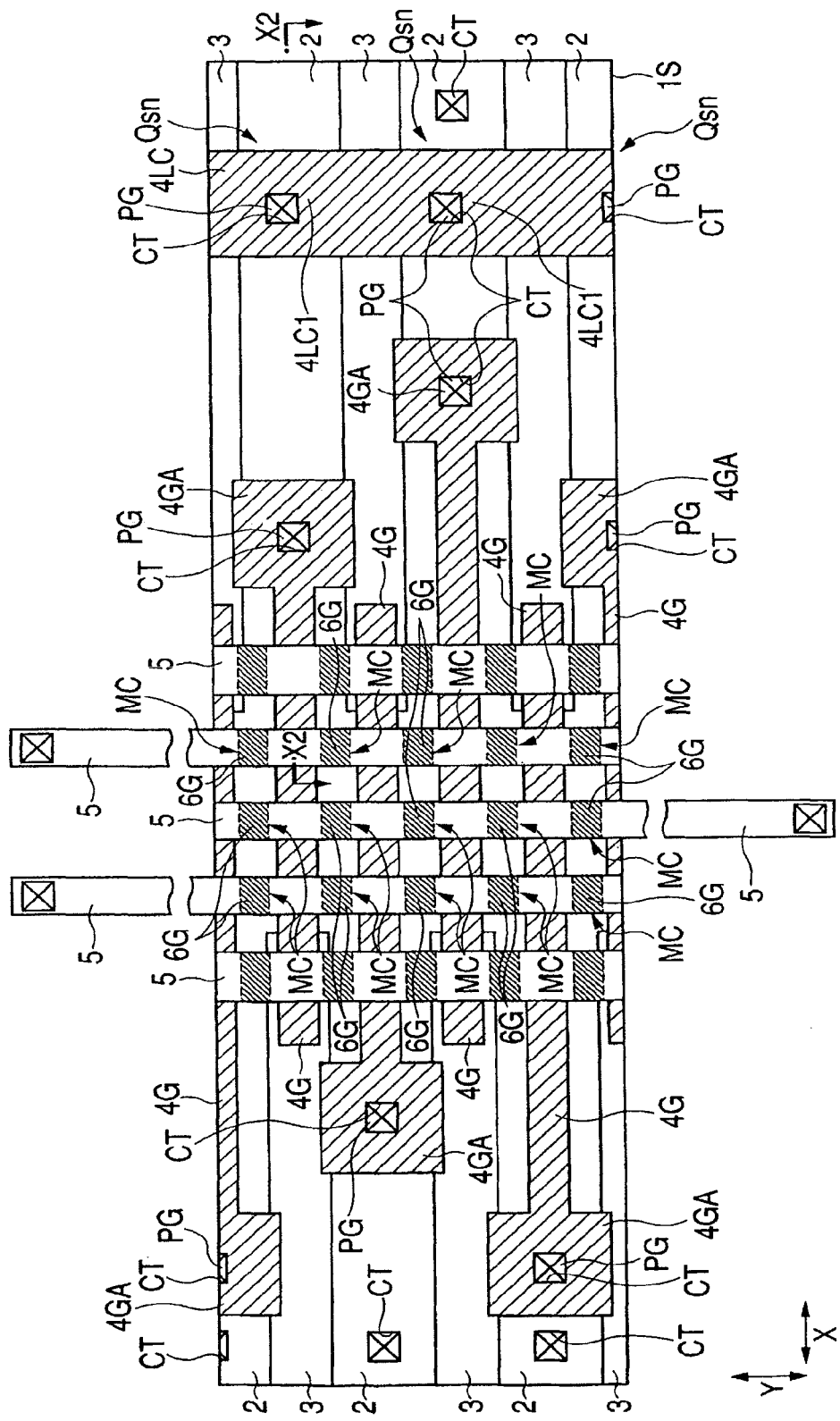
FIG. 82 is a plan view of a semiconductor device representing another embodiment of the present invention.

FIG. 82 shows one example as seen in plan view of a flash memory representing this embodiment 2. The first electrodes 4G are each independently arranged. The first electrodes 4G to which the same electric potential is supplied are electrically connected to one another by the upper layer wire through the contact holes CT.

Figure 84:
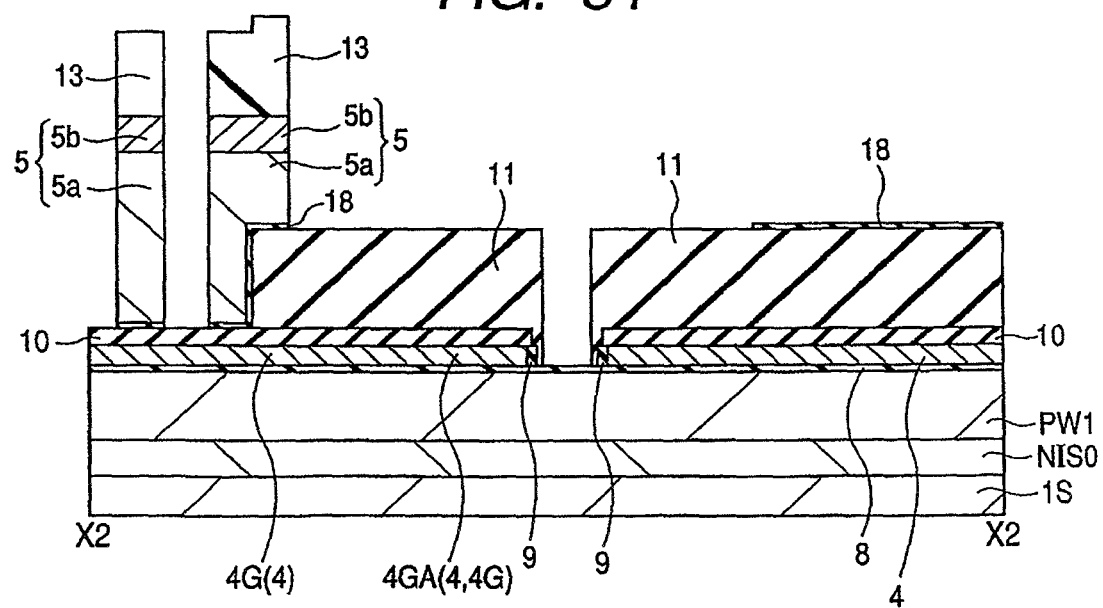
FIG. 84 is a cross sectional view of the portion corresponding to line X2-X2 of the semiconductor device in a manufacturing step subsequent to the manufacturing step of FIG. 83.
Figure 85:
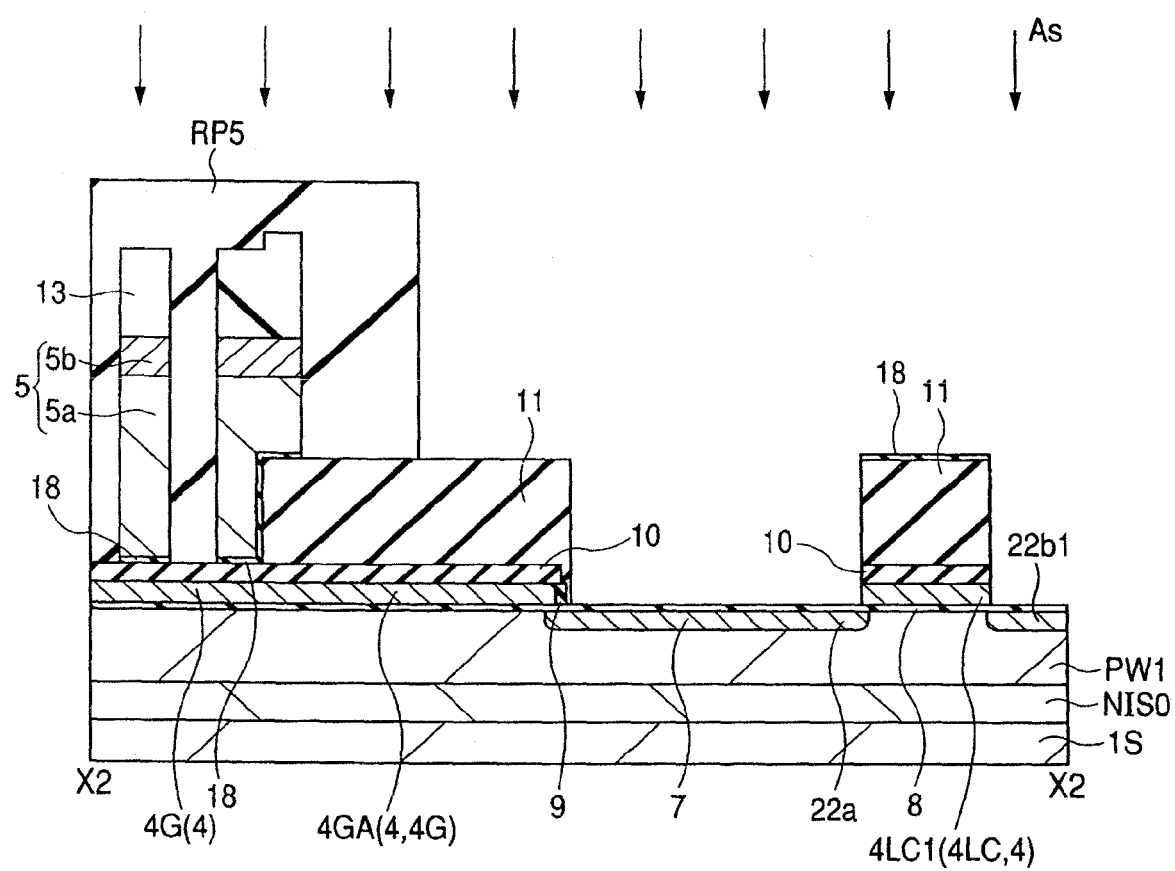
FIG. 85 is a cross sectional view of the portion corresponding to line X2-X2 of the semiconductor device in a manufacturing step subsequent to the manufacturing step of FIG. 84.

The different points in manufacturing steps of the flash memory of this embodiment 2 from the manufacturing steps of the flash memory of the embodiment 1 will be described by reference to FIGS. 83 to 85. Incidentally, FIGS. 83 to 85 are cross sectional views of a portion corresponding to line X2-X2 of FIG. 82 during respective manufacturing steps.

Figure 83:
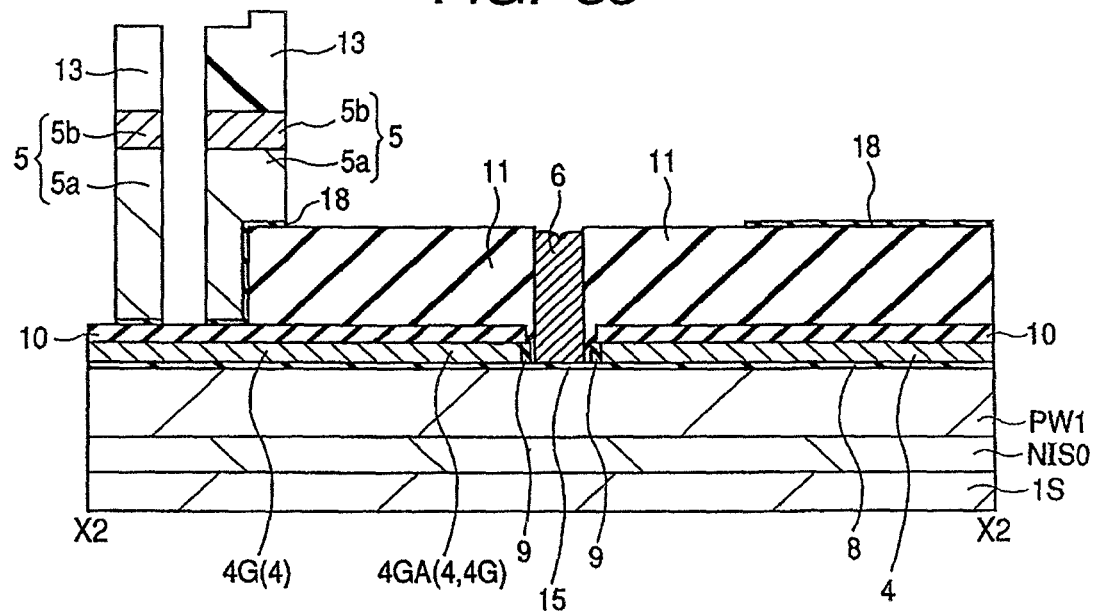
FIG. 83 is a cross sectional view of the portion corresponding to line X2-X2 of the semiconductor device of FIG. 82 in a manufacturing step.

First, after the device has gone through the steps of FIGS. 10 to 69, as described in connection with embodiment 1, as shown in FIG. 83, a part of the insulating film 18 in the outer periphery of the memory region is removed by an etching processing. As a result, the conductor film 6 left in the outer periphery of the memory region is exposed. Subsequently, the conductor film 6 in the outer periphery of the memory region is selectively removed by an etching processing, as shown in FIG. 84. Thereafter, as with the embodiment 1, the conductor film 4 left in the outer periphery of the memory region is patterned by a photolithography technique and a dry etching technique. This results in the formation of the wire 4LC (gate electrode 4LC1), as shown in FIG. 85. Then, a resist pattern RP5 covering the memory region is formed, and then, for example, arsenic is introduced into the substrate 1S (wafer) by a conventional ion implantation method. As a result, n⁻ type semiconductive regions 22a and 22b1 for forming the source/drain region of the selecting nMIS Qsn are formed. In addition, an n⁻ type semiconductive region 22a connecting the region (region where an inversion layer is formed) under the first electrode 4G and the selecting MIS Qsn is formed. In this embodiment 2, the n⁻ type semiconductive regions 22a and 22b1 of the selecting nMIS Qsn, and the n⁻ type semiconductive region 7 for connection can be formed by the same step. This enables a simplification of the step. The subsequent steps are the same as those employed in the embodiment 1, and, hence, a description thereof is omitted.

Embodiment 3

In this embodiment 3, a description will be given for the case where the present invention has been applied to, for example, a flash memory having an assist gate electrode.

Figure 86:
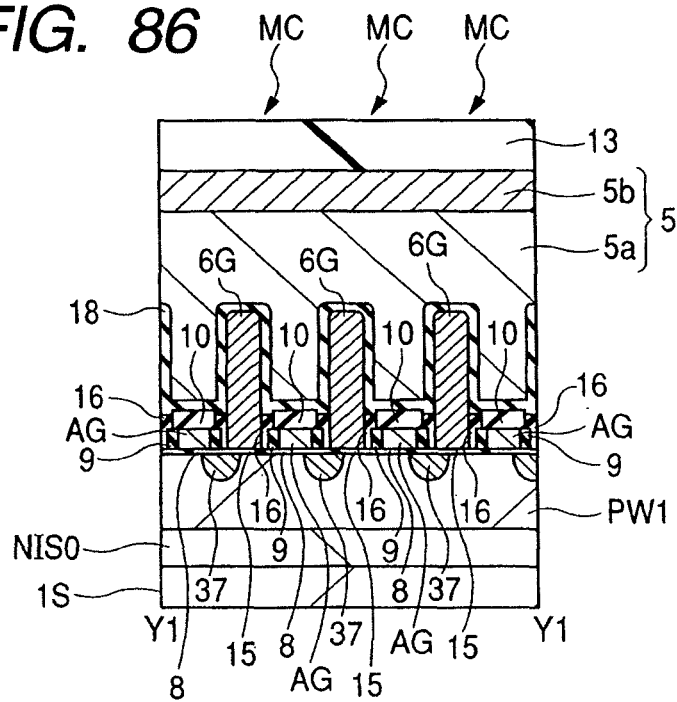
FIG. 86 is a cross sectional view of a memory region of a semiconductor device which represents still another embodiment of the present invention.

A flash memory of this embodiment 3 is, for example, a 1-Gbit AG-AND (Assist Gate-AND) type flash memory. FIG. 86 shows a cross sectional view of the memory region (the portion corresponding to line Y1-Y1 of FIG. 1) of the flash memory of this embodiment 3.

In this embodiment 3, assist gate electrodes AG are disposed in place of the first electrodes 4G in the embodiments 1 and 2. In addition, in the principal surface portion of the substrate 1S, an n type semiconductive region 37 for forming a bit line is formed between each assist gate electrode AG and each floating gate electrode 6G.

The assist gate electrodes AG are arranged in the same manner as the first electrodes 4G of FIG. 1. The assist gate electrodes AG have an isolating function for causing isolation between the selected memory cell and the non-selected memory cell. However, each assist gate electrode AG does not form an n type inversion layer for forming a bit line in the substrate 1S, but it has a function of assisting the writing of data at a high speed and with a low channel current by efficiently generating hot electrons and injecting them into the floating gate electrode 6G for the data write operation. Namely, for the data write operation, the channel under the assist gate electrode AG is weakly inverted, and the channel under the floating gate electrode 6G is completely depleted. A large potential drop is caused at the interface between the assist gate electrode AG and the floating gate electrode 6G. This results in an increase in the electric field along the lateral direction of the channel at the interface. As a result, it is possible to form hot electrons with efficiency. This can implement high-speed writing at a low channel current.

The n type semiconductive region 37 is a region for forming a bit line. Namely, the n type semiconductive region 37 is a region for forming the source or the drain of the memory cell MC. Also, in this embodiment 3, the device is configured such that the semiconductive regions 37 for the source and the drain of the mutually adjacent memory cells MC are shared. This enables a reduction of the area occupied by the memory region. The n type semiconductive region 37 is formed in such a manner as to extend along the direction of extension (the first direction X of FIG. 1) of the assist gate electrode AG. The n type semiconductive region 37 is formed in the following manner. For example, before or after the introduction of boron in the steps (the steps of introducing boron in order to cause a difference between the threshold voltage under the first electrode 4G and the threshold voltage under the floating gate electrode 6G) of FIGS. 33 to 35 in the embodiment 1, for example, impurity ions of phosphorus, arsenic, or the like are introduced from the direction oblique with respect to the principal surface of the substrate 1S. Alternatively, the semiconductive region 37 may also be formed in the following manner. For example, after the formation of the sidewall of the insulating film 16 as described in connection with FIGS. 39 and 40 of the embodiment 1, impurity ions of, for example, phosphorus or arsenic are introduced from a direction oblique with respect to the principal surface of the substrate 1S. In accordance with such an embodiment 3, it is possible to obtain the same effects as with the embodiments 1 and 2. In addition, the n type semiconductive region 37 is disposed as a bit line, and hence, it is possible to reduce the resistance of the bit line as compared with the embodiments 1 and 2.

Now, a description will be given with respect to write, read, and erasing operations of the flash memory of this embodiment 3.

Figure 87:
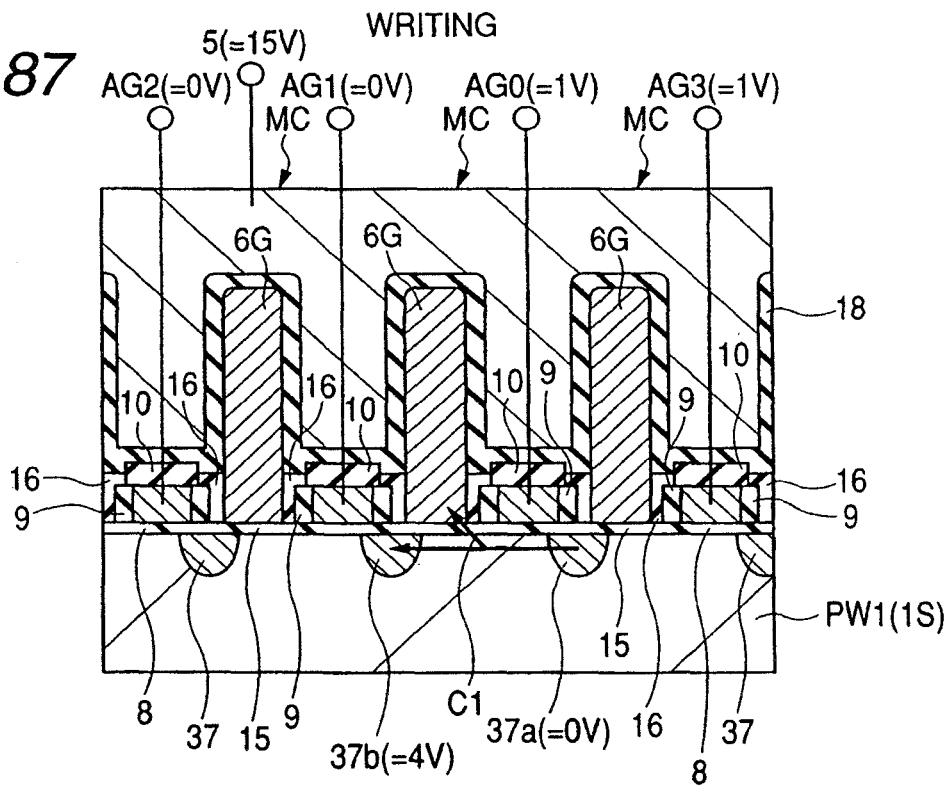
FIG. 87 is a cross sectional view of a semiconductor substrate during a data write operation of the semiconductor device of FIG. 86.

FIG. 87 shows a cross sectional view of the substrate 1S during the data write operation by the constant charge injection of the flash memory of this embodiment 3. For the data write operation, the word line 5 to which the selected memory cell MC is connected is supplied with a voltage of, for example, about 15 V. The other word lines 5 or the like are supplied with a voltage of, for example, 0 V. Whereas, the assist gate electrode AG0 between the source of the selected memory cell MC and the floating gate electrode 6G is supplied with a voltage of, for example, 1 V. The assist gate electrode AG1 on the drain side of the selected memory cell MC is supplied with, for example, about 0 V. The other assist gate electrodes AG2 and AG3 are supplied with a voltage of, for example, 0V. Thus, the isolation is caused between the selected and non-selected memory cells MC. In this state, to the n type semiconductive region 37a on the source side, for example, 0V is supplied. Whereas, to the n type semiconductive region 37b on the drain side, a voltage of, for example, about 4 V is supplied. This causes a write current to flow from the drain toward the source in the selected memory cell MC. The electric charges accumulated in the n type semiconductive region 37b at this step are allowed to flow as a constant channel current, and they are injected into the floating gate electrode 6G with efficiency via the insulating film 15 (constant charge injection method). Thus, data is written to the selected memory cell MC.

Figure 88:
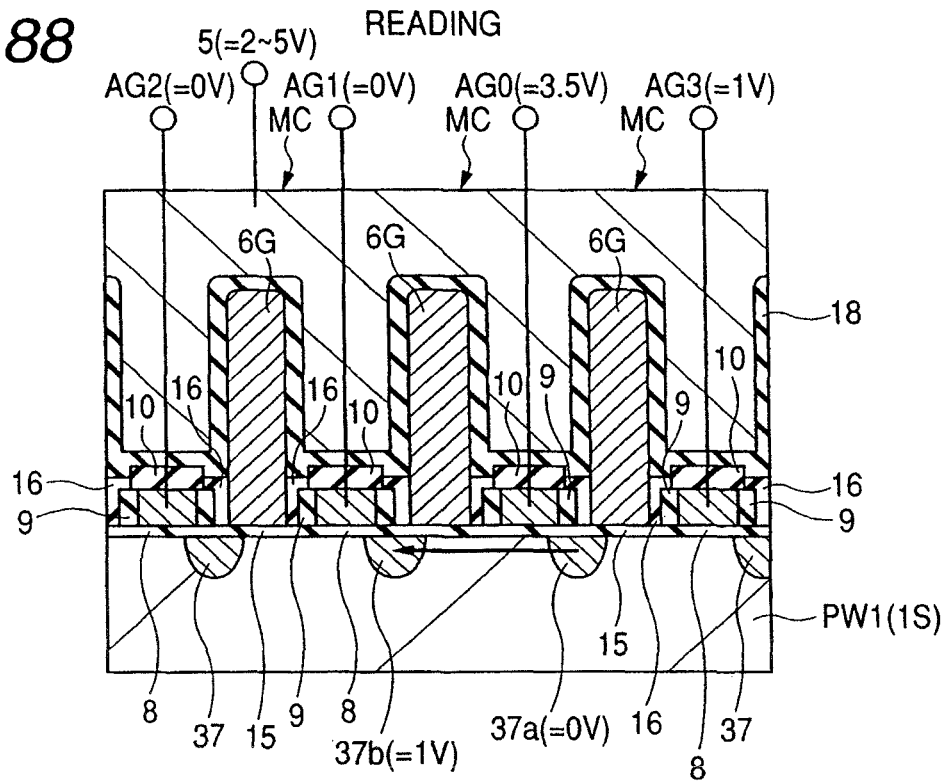
FIG. 88 is a cross sectional view of the semiconductor substrate during a data read operation of the semiconductor device of FIG. 86.

FIG. 88 shows a cross sectional view of the substrate 1S during the data read operation of the flash memory of this embodiment 3. For the data read operation, the word line 5 to which the selected memory cell MC is connected is supplied with a voltage of, for example, about 2 to 5 V. The other word lines 5 or the like are supplied with a voltage of, for example, 0 V. Whereas, the assist gate electrode AG0 between the source of the selected memory cell MC and the floating gate electrode 6G is supplied with a voltage of, for example, about 3.5 V. The assist gate electrode AG1 on the drain side of the selected memory cell MC is supplied with, for example, about 0 V. The other assist gate electrodes AG2 and AG3 are supplied with a voltage of, for example, 0V. Thus, isolation is created between the selected and non-selected memory cells MC. In this state, to the n type semiconductive region 37a on the source side, for example, a voltage of 0 V is supplied. Whereas, to the n type semiconductive region 37b on the drain side, a voltage of, for example, about 1 V is supplied. At this step, the conditions of the accumulated electric charges of the floating gate electrode 6G change the threshold voltage of the selected memory cell MC. For this reason, it is possible to judge the data of the selected memory cell MC according to the conditions of the current flowing between the source and the drain of the selected memory cell MC.

Figure 89:
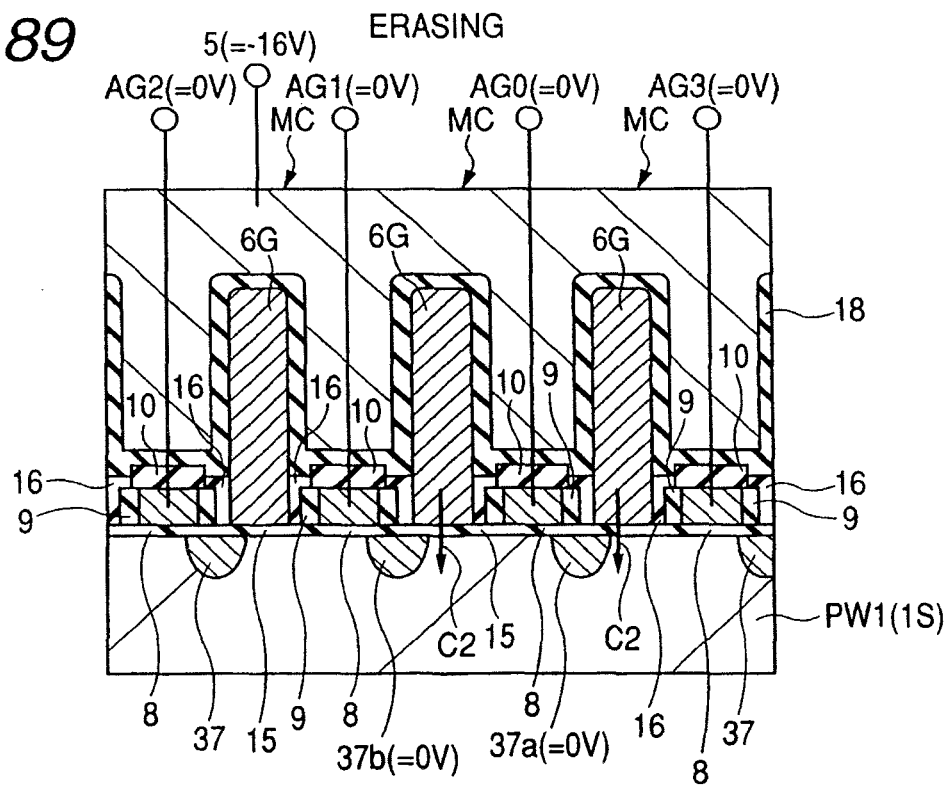
FIG. 89 is a cross sectional view of the semiconductor substrate during a data erasing operation of the semiconductor device of FIG. 86.

FIG. 89 shows a cross sectional view of the substrate 1S during the data erasing operation of the flash memory of this embodiment 3. The data erasing operation is the same as that of embodiment 1. Namely, the word line 5 to be selected is supplied with a voltage of, for example, about −16 V. On the other hand, the n type semiconductive regions 37a and 37b are supplied with a voltage of, for example, 0V. This causes the electric charges for data accumulated in the floating gate electrode 6G to be emitted into the substrate 1S via the insulating film 15. Thus, the data of a plurality of the memory cells MC are erased by one operation.

Embodiment 4

In connection with this embodiment 4, a description will be given to, for example, a modified example of a flash memory having an assist gate electrode.

Figure 90:
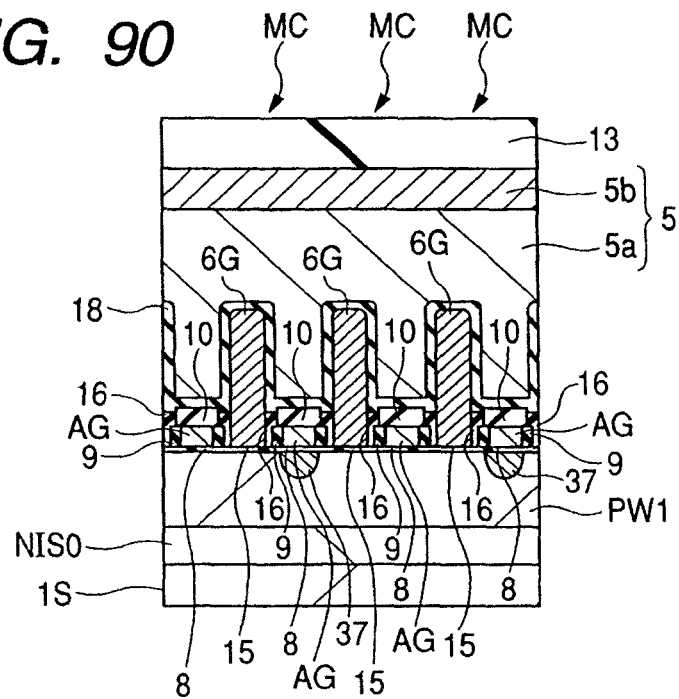
FIG. 90 is a cross sectional view of a memory region of a semiconductor device which represents a still further embodiment of the present invention.

A flash memory of this embodiment 4 is, for example, a 1-Gbit AG-AND type flash memory. FIG. 90 shows a cross sectional view of a memory region (a portion corresponding to line Y1-Y1 of FIG. 1) of the flash memory of this embodiment 4. In this embodiment 4, the n type semiconductive regions 37 are arranged at every other assist gate electrodes AG, and they are disposed immediately under the assist gate electrodes AG. The n type semiconductive regions 37 may be formed in the following manner. For example, after the steps (the steps of removing the insulating film 11 between the portions of the conductor films 6, and the like) of FIGS. 49 to 52 of the embodiment 1, a resist pattern is formed to expose the formation region of the n type semiconductive region 37, and to cover the other regions. By the use of this resist pattern as a mask, impurity ions such as phosphorus ions or arsenic ions are introduced vertically with respect to the principal surface of the substrate 1S via the cap film 10 and the assist gate electrodes AG. The assist gate electrodes AG under which the n type semiconductive regions are not disposed have, other than the function as the assist gate, a function of forming an n type inversion layer for a bit line in the principal surface of the substrate 1S for the read operation of the memory cell, as will be described later. In such an embodiment 4, the n type semiconductive regions 37 are formed in such a manner as to be arranged under every other assist gate electrode AG, and they are formed so as not to extend under the floating gate electrodes 6G. For this reason, even when the n type semiconductive regions 37 each slightly expand, it is possible to reduce the size of each memory cell MC. Whereas, the n type semiconductive regions 37 are formed as bit lines, and hence, it is possible to reduce the resistance of the bit lines as compared with the embodiments 1 and 2.

Now, a description will be given with respect to write, read, and erasing operations of the flash memory of this embodiment 4.

Figure 91:
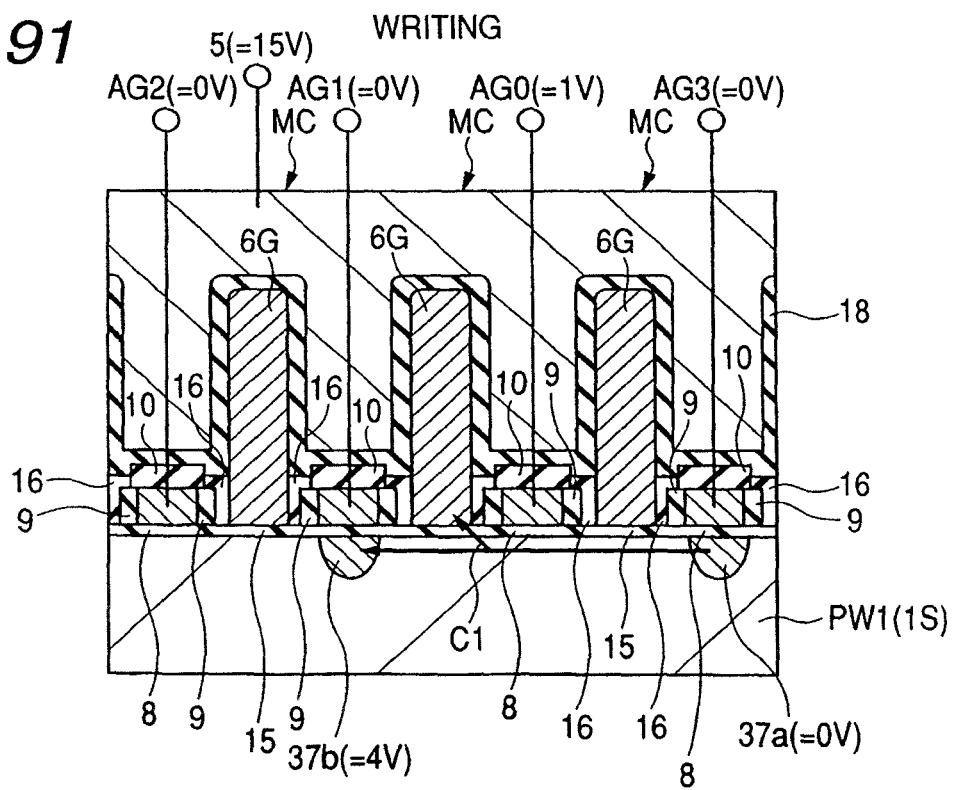
FIG. 91 is a cross sectional view of a semiconductor substrate during a data write operation of the semiconductor device of FIG. 90.

FIG. 91 shows a cross sectional view of the substrate 1S during the data write operation by the constant charge injection of the flash memory of this embodiment 4. For the data write operation, the word line 5 to which the selected memory cell MC is connected is supplied with a voltage of, for example, about 15 V. The other word lines 5 or the like are supplied with a voltage of, for example, 0 V. Whereas, the assist gate electrode AG0 between the source of the selected memory cell MC and the floating gate electrode 6G is supplied with a voltage of, for example, 1 V. The assist gate electrode AG1 on the drain side of the selected memory cell MC is supplied with, for example, about 0 V. The other assist gate electrodes AG2 and AG3 are supplied with a voltage of, for example, 0V. Thus, isolation is created between the selected and non-selected memory cells MC. In this state, to the n type semiconductive region 37 for a source immediately under the assist gate electrode AG3, a voltage of, for example, 0 V is supplied. Whereas, to the n type semiconductive region 37b for a drain immediately under the assist gate electrode AG1, a voltage of, for example, about 4 V is supplied. As a result, as with the embodiment 3, the electric charges accumulated in the n type semiconductive region 37a on the source side are injected into the floating gate electrode 6G with efficiency via the insulating film 15. Thus, data is written to the selected memory cell MC at a high speed.

Figure 92:
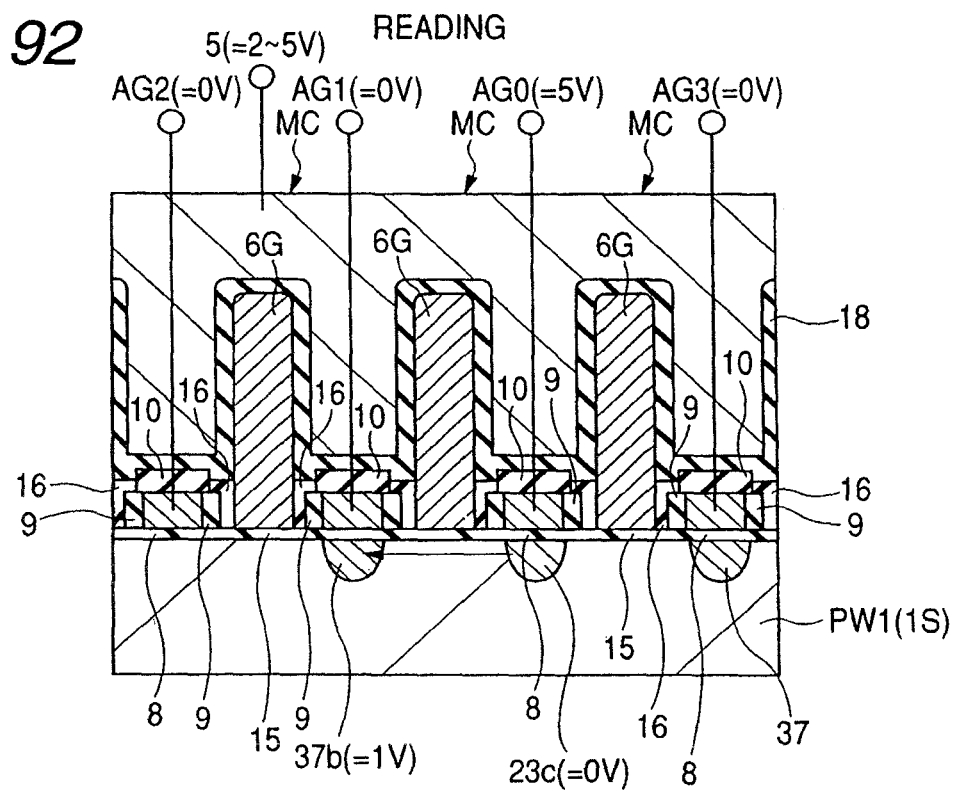
FIG. 92 is a cross sectional view of the semiconductor substrate during a data read operation of the semiconductor device of FIG. 90.

FIG. 92 shows a cross sectional view of the substrate 1S during the data read operation of the flash memory of this embodiment 4. For data reading, the word line 5 to which the selected memory cell MC is connected is supplied with a voltage of, for example, about 2 to 5 V. The other word lines 5 or the like are supplied with a voltage of, for example, 0 V. Whereas, the assist gate electrode AG0 is supplied with a voltage of, for example, about 5 V, thereby to form an n type inversion layer 23c for a source in the principal surface of the substrate 1S, opposing thereto. The other assist gate electrodes AG1 and AG3 are supplied with a voltage of, for example, 0V. Thus, isolation is provided between the selected and non-selected memory cells MC. In this state, to the n type inversion layer 23c on the source side, for example, a voltage of 0 V is supplied. Whereas, to the semiconductive region 37b for a drain, a voltage of, for example, about 1 V is supplied. At this step, the conditions of the accumulated electric charges of the floating gate electrode 6G change the threshold voltage of the selected memory cell MC. For this reason, it is possible to judge the data of the selected memory cell MC according to the conditions of the current flowing between the source and the drain of the selected memory cell MC.

Figure 93:
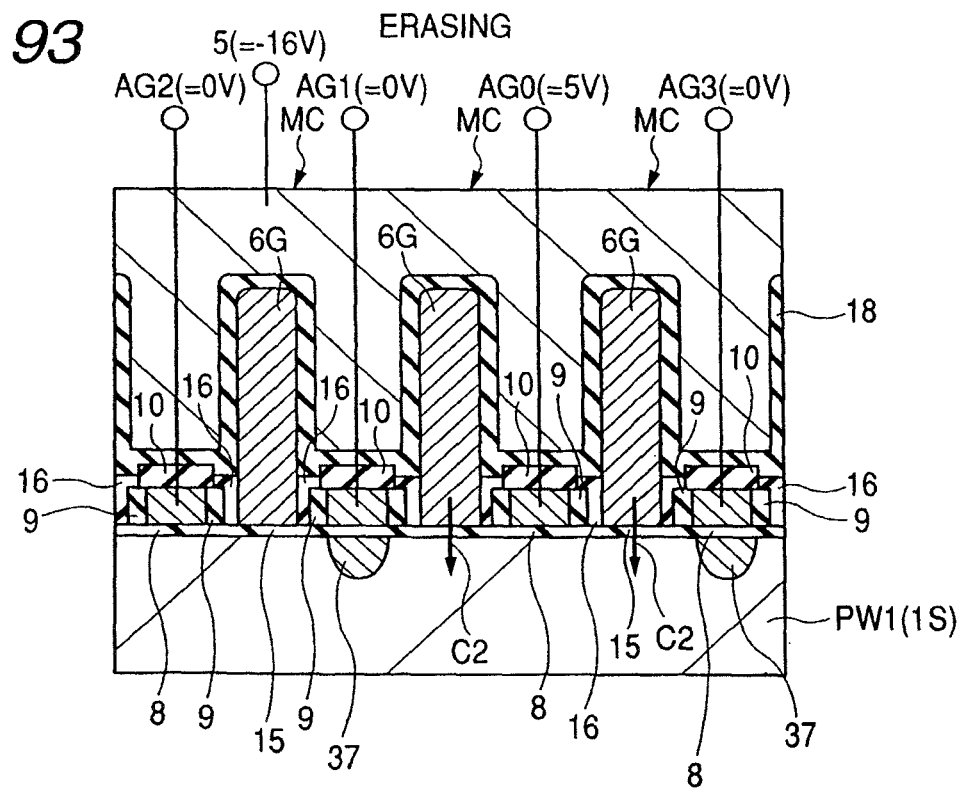
FIG. 93 is a cross sectional view of the semiconductor substrate during a data erasing operation of the semiconductor device of FIG. 90.

FIG. 93 shows a cross sectional view of the substrate 1S during the data erasing operation of the flash memory of this embodiment 4. The data erasing operation is the same as that of the embodiment 1. Namely, the word line 5 to be selected is supplied with a voltage of, for example, about −16 V. On the other hand, the assist gate electrodes AG0 to AG3 are supplied with a voltage of, for example, 0V. This causes the electric charges for data accumulated in the floating gate electrode 6G to be emitted into the substrate 1S via the insulating film 15. Thus, the data of a plurality of the memory cells MC are erased by one operation.

Up to this point, the aspects of the invention completed by the present inventors have been described specifically by way of exemplary embodiments. However, the present invention is not limited to the embodiments described herein, and it is understood that various changes may made within a range not departing from the scope thereof.

In the foregoing explanation, a description was given of the case where the invention completed by the present inventors was applied to an AND type flash memory unit in the field which has formed the background thereof. However, the present invention is not limited thereto, and it is also applicable to a memory-merged semiconductor device, such as a semiconductor device of an EEPROM unit or a system LSI (Large Scale Integrated circuit) having an EEPROM or a flash memory.

The effects obtainable with typical aspects and features of the invention disclosed herein will be briefly described as follows. Namely, a semiconductor device comprises, a semiconductor substrate; and a plurality of nonvolatile memory cells having a plurality of first electrodes, a plurality of second electrodes provided so as to cross therewith, and a plurality of third electrodes for electric charge accumulation provided at points of intersection of the portions between the plurality of the adjacent first electrodes and the plurality of the second electrodes in a state insulated from the first and second electrodes over the semiconductor substrate, wherein the third electrodes are formed in a convex shape as seen in cross section in such a manner as to be larger in height than the first electrodes. This enables a reduction in the size of the semiconductor device.

Further, a semiconductor device comprises, a semiconductor substrate; and a plurality of nonvolatile memory cells having a plurality of first electrodes, a plurality of second electrodes provided so as to cross therewith, and a plurality of third electrodes for electric charge accumulation provided at points of intersection of the portions between the plurality of the adjacent first electrodes and the plurality of the second electrodes in a state insulated from the first and second electrodes over the semiconductor substrate, wherein the plurality of first electrodes have a function of forming an inversion layer in the semiconductor substrate. This can promote the trend toward reduction in the size of the nonvolatile memory. Further, it is possible to reduce the size of the semiconductor device.

The semiconductor device of the present invention is applicable to a semiconductor device having a nonvolatile semiconductor memory such as an EEPROM or a flash memory.

What is claimed is:

1. A semiconductor device including a plurality of nonvolatile memory cells electrically connected to a word line extending in a first direction in plane view, comprising:
    a plurality of floating gates formed over a semiconductor substrate;
        a plurality of first insulating films formed between each of the said floating gates in the first direction, respectively;
        a second insulating film formed over a top surface of each of the first insulating films, side surfaces of each of the floating gates and a top surface of each of the floating gates; and
    a control gate configured to serve as a word line formed over the second insulating film,
        wherein a height of the top surface of each of the floating gates is higher than a height of the top surface of each of the first insulating films,
        wherein each of the first insulating films is formed in self-alignment with a corresponding one of the floating gates,
        wherein a length of each the of the floating gates in a second direction, perpendicular to the first direction, is larger than a length of each of the floating gates in the first direction, and
        wherein a length from a top surface of the second insulating film which is formed over the first insulating films to the top surface of the floating gates is larger than a length of the space between each of the floating gates in the first direction, and larger than the length of each of the floating gates in the first direction.

2. A semiconductor device according to the claim 1, wherein the second insulating film includes a first silicon oxide film, a first silicon nitride film and a second silicon oxide film.

3. A semiconductor device according to the claim 1, wherein each of the floating gates includes a polysilicon film.

4. A semiconductor device according to the claim 1, wherein the control gate includes a polysilicon film and a tungsten silicide film.

5. A semiconductor device according to the claim 1, wherein each of the first insulating films includes a silicon oxide film.

6. A semiconductor device according to the claim 1, wherein the non-volatile memory cells comprise flash memory cells, respectively.

* * * * *